(12) United States Patent
Vasudevan et al.

(10) Patent No.: US 9,021,409 B2
(45) Date of Patent: Apr. 28, 2015

(54) INTEGRATION OF DATA MINING AND STATIC ANALYSIS FOR HARDWARE DESIGN VERIFICATION

(75) Inventors: Shobha Vasudevan, Champaign, IL (US); David Sheridan, San Jose, CA (US); Lingyi Liu, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 247 days.

(21) Appl. No.: 13/433,909

(22) Filed: Mar. 29, 2012

(65) Prior Publication Data

US 2013/0019216 A1    Jan. 17, 2013

Related U.S. Application Data

(60) Provisional application No. 61/506,255, filed on Jul. 11, 2011.

(51) Int. Cl.
*G06F 17/50*    (2006.01)
(52) U.S. Cl.
CPC .......... *G06F 17/504* (2013.01); *G06F 17/5022* (2013.01)
(58) Field of Classification Search
None
See application file for complete search history.

(56) References Cited

PUBLICATIONS

Lingyi Liu et al., Towards Coverage Closure: Using Goldmine Assertions for Generating Design Validation Stimulus, Design Automation and Test in Europe Conference and Exhibition, pp. 1-6, Mar. 2011.*
Lingyi Liu et al., Automatic Generation of Assertions From System Level Design Using Data Mining, 9th IEEE/ACM International Conference on Formal Methods and Models for Codesign, pp. 191-200, Apr. 2011.*
S. Vasudevan et al., GoldMine: Automatic Assertion Generation Using Data Mining and Static Analysis, Design, Automation and Test in Europe Conference and Exhibition, pp. 626-629, Mar. 2010.*
"IEEE P1850™/D8: Draft Standard for PSL Property Specification Language," published by IEEE, 138 pages (Jun. 2005).
"IEEE Standard for System Verilog—Unified Hardware Design, Specification, and Verification Language," *IEEE Std 1800™-2005*, 664 pages (Nov. 22, 2005).
"IEEE Standard Hardware Description: Language Based on the Verilog® Hardware Description Language," *IEEE Std 1364-1995*, published by the Institute of Electrical and Electronics Engineers, Inc., 675 pages (1996).
"IEEE Standard System C® Language Reference Manual," *IEEE Std 1666™-2005*, published by IEEE, 441 pages (Mar. 31, 2006).

(Continued)

*Primary Examiner* — A. M. Thompson
(74) *Attorney, Agent, or Firm* — Lowenstein Sandler LLP

(57) ABSTRACT

A method of generating assertions for verification of a hardware design expressed at a register transfer level (RTL) includes running simulation traces through the design to generate simulation data; extract domain-specific information about the design for variables of interest; execute a data mining algorithm with the simulation data and the domain-specific information, to generate a set of candidate assertions for variable(s) of interest through machine learning with respect to the domain-specific information, the candidate assertions being likely invariants; conduct formal verification on the design with respect to each candidate assertion by outputting as invariants the candidate assertions that pass verification; iteratively feed back into the algorithm a counterexample trace generated by each failed candidate assertion, each counterexample trace including at least one additional variable in the design not previously input into the data mining algorithm, to thus increase coverage of a state space of the design.

29 Claims, 37 Drawing Sheets

(56) References Cited

PUBLICATIONS

"IEEE Standard VHDL: Language Reference Manual," *IEEE Std 1076-1987*, published by the Institute of Electrical and Electronics Engineers, Inc., 218 pages (1988).

Agrawal, R., et al., "Mining Association Rules between Sets of Items in Large Databases," *Proceeding SIGMOD '93 Proceedings of the 1993 ACM SIGMOD International Conference on Management of Data*, pp. 207-216 (May 1993).

Ammons, G., et al., "Mining Specifications," Proceeding POPL '02 Proceedings of the 29th ACM SIGPLAN-SIGACT Symposium on Principles of Programming Languages, pp. 4-16 (Jan. 16-18, 2002).

Atramentov, A., et al., "A Multi-relational Decision Tree Learning Algorithm—Implementation and Experiments," *Inductive Logic Programming Lecture Notes in Computer Science* vol. 2835, pp. 38-56 (2003).

Bayazit, A., et al., "Complementary Use of Runtime Validation and Model Checking," *ICCAD '05 Proceedings of the 2005 IEEE/ACM International Conference on Computer-aided design*, pp. 1052-1059 (2005).

Bensalem, S., et al., "Powerful Techniques for the Automatic Generation of Invariants," *Computer Aided Verification Lecture Notes in Computer Science*, vol. 1102, pp. 323-335 (1996).

Beyer, D., et al., "Generating Tests from Counterexamples," *Proceedings of the 26th International Conference on Software Engineering (ICSE'04)*, pp. 326-335 (2004).

Bjørner, N., et al., "Automatic Generation of Invariants and Intermediate Assertions," *Principles and Practice of Constraint Programming—CP '95, Lecture Notes in Computer Science*, vol. 976, pp. 589-623 (1995).

Borgelt, C., "An Implementation of the FP-growth Algorithm," *OSDM '05 Proceedings of the 1st international workshop on open source data mining: frequent pattern mining implementations*, pp. 1-5 (2005).

Boulé, M., et al., "Assertion Checkers in Verification, Silicon Debug and In-Field Diagnosis," *Proceedings of the 8th International Symposium on Quality Electronic Design (ISQED'07)*, pp. 613-620 (2007).

Boulé, M., et al., "Automata-Based Assertion-Checker Synthesis of PSL Properties," *ACM Transactions on Design Automation of Electronic Systems*, vol. 13, No. 1, Article 4, pp. 1-21 (Jan. 2008).

Breslow, L., et al., "Simplifying decision trees: A survey," *The Knowledge Engineering Review*, vol. 12, No. 1, pp. 1-40 (Jan. 1997).

Caplain, M., "Finding Invariant Assertions for Proving Programs," *Proceedings of the International Conference on Reliable Software Archive*, pp. 165-171 (1975).

Chen, M., et al., "Functional Test Generation Using Efficient Property Clustering and Learning Techniques," *IEEE Transactions on Computer-Aided Design of Integrated Circuits and Systems*, vol. 29, No. 3, pp. 396-404 (Mar. 2010).

Cheng, X., et al., "Simulation-Directed Invariant Mining for Software Verification," *DATE '08 Proceedings of the Conference on Design, Automation and Test in Europe*, pp. 682-687 (2008).

Clarke, E., et al., "Automatic Verification of Finite-State Concurrent Systems Using Temporal Logic Specifications," *Journal ACM Transactions on Programming Languages and Systems (TOPLAS) TOPLAS Homepage archive*, vol. 8, No. 2, pp. 244-263 (Apr. 1986).

Clarke, E., et al., "Counterexample-Guided Abstraction Refinement for Symbolic Model Checking," *Journal of the ACM*, vol. 50, No. 5, pp. 752-794 (Sep. 2003).

Domingos, P., et al., "Mining High-Speed Data Streams," *KDD '00 Proceedings of the Sixth ACM SIGKDD International Conference on Knowledge Discovery and Data Mining*, pp. 71-80 (2000).

Ernst, M., et al., "Dynamically Discovering Likely Program Invariants to Support Program Evolution," *IEEE Transactions on Software Engineering*, vol. 27, No. 2, pp. 213-224 (Feb. 2001).

Ernst, M., et al., "The Daikon system for dynamic detection of likely invariants," *Science of Computer Programming*, vol. 69, pp. 35-45 (2007).

Fine, S., et al., "Coverage Directed Test Generation for Functional Verification using Bayesian Networks," *Design Automation Conference, 2003, Proceedings*, pp. 286-291 (Jun. 2-6, 2003).

Floyd, R., "Assigning Meanings to Programs," *Mathematical Aspects of Computer Science: Proceedings of Symposia in Applied Mathematics*, vol. 19, pp. 19-32 (1967).

Gabel, Mark, et al., "Javert: Fully Automatic Mining of General Temporal Properties from Dynamic Traces," *SIGSOFT '08/FSE-16 Proceedings of the 16th ACM SIGSOFT International Symposium on Foundations of Software Engineering*, pp. 339-349 (Nov. 9-15, 2008).

Gurumurthy, S., et al., "On Efficient Generation of Instruction Sequences to Test for Delay Defects in a Processor," GLSVLSI '08 Proceedings of the 18th ACM Great Lakes Symposium on VLSI, pp. 279-284 (May 4-6, 2008).

Guzey, O., et al., "Functional Test Selection Based on Unsupervised Support Vector Analysis," *DAC '08 Proceedings of the 45th annual Design Automation Conference*, pp. 262-267 (2008).

Hangal, S., et al., "IODINE: A Tool to Automatically Infer Dynamic Invariants for Hardware Designs," *Design Automation Conference, 2005, Proceedings*. $42^{nd}$, pp. 775-778 (Jun. 13-17, 2005).

Hegbreitt, B., et al., "Heuristic Methods for Mechanically Deriving Inductive Assertions," *Proc. 3rd Internat. Joint Conf. on Artif. Intel.*, pp. 524-536 (Aug. 1973).

Hekmatpour, A., et al., "Block-based Schema-driven Assertion Generation for Functional Verification," *Proceedings of the 14th Asian Test Symposium (ATS '05)*, pp. 34-39 (2005).

Hoare, C., "An Axiomatic Basis for Computer Progamming," *Communications of the ACM*, vol. 12, No. 10, pp. 576-580, 583 (Oct. 1969).

Isaksen, B., et al., "Verification Through the Principle of Least Astonishment," *ICCAD '06 Proceedings of the 2006 IEEE/ACM International Conference on Computer-Aided Design*, pp. 860-867 (2006).

Karp, R., "Reducibility Among Combinatorial Problems," *Complexity of Computer Computations*, Plenum Press, RE Miller and JM Thatcher, eds., pp. 85-103 (1972).

Katz, S., et al., "A Heuristic Approach to Program Verification," *Defense Technical Information Center*, pp. 500-512 (1973).

Kelm, J., et al. "Rigel: An Architecture and Scalable Programming Interface for a 1000-core Accelerator," *ACM SIGARCH Computer Architecture News 37.3*, pp. 140-151 (2009).

Li, W., et al., "Scalable Specification Mining for Verification and Diagnosis," *Design Automation Conference (DAC), 2010 47th ACM/ IEEE*, pp. 755-760 (2010).

Lisherness, P., "SCEMIT: A SystemC Error and Mutation Injection Tool," *Design Automation Conference (DAC), 2010 47th ACM/IEEE*, pp. 228-233 (2010).

Liu, L., et al., "Towards Coverage Closure: Using GoldMine Assertions for Generating Design Validation Stimulus," *Design, Automation & Test in Europe Conference & Exhibition (DATE), 2011*, pp. 1-6 (2011).

McGarry, K., "A survey of interestingness measures for knowledge discovery," *The Knowledge Engineering Review*, vol. 20, No. 1, pp. 39-61 (2005).

McMillan, K., "Symbolic Model Checking: An approach to the state explosion problem," No. CMU-CS-92-131, Carnegie-Mellon Univ., Pittsburgh, PA, Dept. of Computer Science, 212 pages (May 1992).

Mishra, P., et al. "Functional Coverage Driven Test Generation for Validation of Pipelined Processors," *Design, Automation and Test in Europe, 2005. Proceedings*, pp. 678-683 (2005).

Misra, J., "Prospects and Limitations of Automatic Assertion Generation for Loop Programs," *SIAM J. Comput.*, vol. 6, No. 4, pp. 718-729 (Dec. 1977).

Nimmer, J., et al., "Automatic Generation of Program Specifications," *ACM SIGSOFT Software Engineering Notes*, vol. 27, No. 4, pp. 229-239 (2002).

Nimmer, J., et al., "Invariant Inference for Static Checking," *Proceedings of the 10th ACM SIGSOFT Symposium on Foundations of Software Engineering*, pp. 11-20 (2002).

Păsăreanu, C., et al., "Verification of Java Programs using Symbolic Execution and Invariant Generation," *Model Checking Software, Lecture Notes in Computer Science*, vol. 2989, pp. 164-181 (2004).

(56) References Cited

OTHER PUBLICATIONS

Pintér, G., et al., "Automatic generation of executable assertions for runtime checking temporal requirements," *Proceedings of the Ninth IEEE International Symposium on High-Assurance Systems Engineering (HASE '05)*, pp. 111-120 (2005).

Pnueli, A., "The Temporal Logic of Programs," *Foundations of Computer Science, 1977., 18th Annual Symposium on*, pp. 46-57 (1977).

Rogin, F., et al., "Automatic generation of complex properties for hardware designs," *Design, Automation and Test in Europe, 2008, DATE'08*, pp. 545-548 (2008).

Safyallah, H., et al., "Dynamic Analysis of Software Systems using Execution Pattern Mining," *Proceedings of the 14th IEEE International Conference on Program Comprehension (ICPC'06)*, pp. 84-88 (2006).

Silberschatz, A., et al., "What Makes Patterns Interesting in Knowledge Discovery Systems," *IEEE Transactions on Knowledge and Data Engineering*, vol. 8, No. 6, pp. 970-974 (Dec. 1996).

Stark, J., et al., "Invariant discovery via failed proof attempts," *Logic-Based Program Synthesis and Transformation*, pp. 271-288 (1999).

Tan, P., et al., "Selecting the right interestingness measure for association patterns," *Proceedings of the Eighth ACM SIGKDD international Conference on Knowledge Discovery and Data Mining*, pp. 32-41 (2002).

Tiwari, A., et al., "A Technique for Invariant Generation," *Tools and Algorithms for the Construction and Analysis of Systems*, pp. 113-127 (2001).

Vasudevan, S., et al., "Goldmine: Automatic Assertion Generation Using Data Mining and Static Analysis," *Design, Automation & Test in Europe Conference & Exhibition (DATE), 2010*, pp. 626-629 (2010).

Wang, D., et al., "Automatic Assume Guarantee Analysis for Assertion-Based Formal Verification," *Proceedings of the 2005 Asia and South Pacific Design Automation Conference*, pp. 561-566 (2005).

Wang, Li-C., et al., "Automatic Generation of Assertions for Formal Verification of Power PC™ Microprocessor Arrays Using Symbolic Trajectory Evaluation," *Proceedings of the 35th Annual Design Automation Conference*, pp. 534-537 (1998).

Wen, Ch-P., et al., "Simulation-based functional test justification using a Boolean data miner," *International Conference on Computer Design, 2006. ICCD 2006*, pp. 300-307 (2007).

Yang, J., et al., "Dynamically Inferring Temporal Properties," *Proceedings of the 5th ACM SIGPLAN-SIGSOFT Workshop on Program Analysis for Software Tools and Engineering*, pp. 23-28 (2004).

* cited by examiner

Algorithuhm 1 Decision Tree Supervised Learning Algorithm

*decision_tree(F, P, E)*
  1: mean = *mean (E, z)*
  2: err = *error (E, z)*
  3: if err 0 then
  4:     $A_c = A_c \cup P ==> z = $ mean
  5:     return
  6: end if
  7: best_reduction = 0
  8: for each input $F, f_i$ do
  9:     reduction = err - *error* $(E_{f_i=0}, z)$ - *error* $(E_{f_i=1}, z)$
10:     if reduction > best_reduction then
11:         best_reduction = reduction
12:         $f_{best} = f_i$
13:     end if
14: end for
15: if best_reduction > 0 then
16:     *decesion_tree*$(F - f_{best}, P \cup f_{best} = 0, E_{f_{best}=0})$
17:     *decesion_tree*$(F - f_{best}, P \cup f_{best} = 1, E_{f_{best}=1})$
18: end if

*FIG. 2*

| int.valid | int.L1_hit | int.has_dreg | wb_valid0 |
|---|---|---|---|
| 0 | 0 | 0 | 0 |
| 0 | 1 | 1 | 0 |
| 1 | 0 | 0 | 0 |
| 1 | 1 | 1 | 1 |

*FIG. 3*
(Prior Art)

```
always @ *
  if (int.valid &&
      int.has_dreg)
    wb_valid0 = 1;
  else
    wb_valid0 = 0;

always @ *
  int.L1_hit = int.has_dreg
```

```
1.  Incr_Decision_Tree_Building(TreeNode Node)
2.  begin
3.    if(Error(Node)==0) begin
4.      if(Formal_verfn(Node.assertion)==true)
5.        return;
6.      else begin
7.        Ctx_simulation();
8.        Recompute_error(Node);
9.      end
10.   end
11.   Node.left=New_node();
12.   Node.right=New_node();
13.   Select_splitting_variable();
14.   Incr_Decision_Tree_Building(Node.left);
15.   Incr_Decision_Tree_Building(Node.right);
16. end
```

*FIG. 17*

```
Algorithm 2 Association Miner
gen_candidates(F, P, E)
 1: for each {input variable, value} pair in F, f_i do
 2:     if g(A_s, A_s ∪ assertion(P ∪ f_i ⟹ {z, X})) ≥ g_min then
 3:         if ∀c_j ∈ E, P ∪ f_i ⟹ {z, 0} then
 4:             A_c = A_c ∪ assertion(P ∪ f_i ⟹ {z, 0})
 5:         else if ∀c_j ∈ E, P ∪ f_i ⟹ {z, 1} then
 6:             A_c = A_c ∪ assertion(P ∪ f_i ⟹ {z, 1})
 7:         else
 8:             mine(F − f_i, P ∪ f_i)
 9:         end if
10:     end if
11: end for
```

FIG. 28

```
Algorithm 3 recalibrate_add
recalibrate_add(A_c, A_s)
 1: for all a ∈ A_c do
 2:     if g(A_S, A_s ∪ a) ≥ g_min then
 3:         A_s = A_s ∪ a
 4:     end if
 5: end for
```

FIG. 29

Algorithm 4 recalibrate_add with Formal Verification $recalibrate\_add(A_c, A_s)$ 1: for all $a \in A_c$ do
2:    if $g(A_S, A_s \cup a) \geq g_{min}$ then
3:       if $FomalVerify(a) == True$ then
4:          $A_s = A_s \cup a$
5:       end if
6:    end if
7: end for

*FIG. 30*

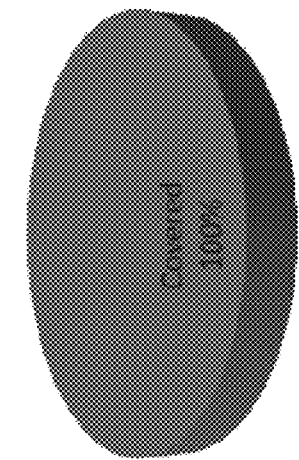
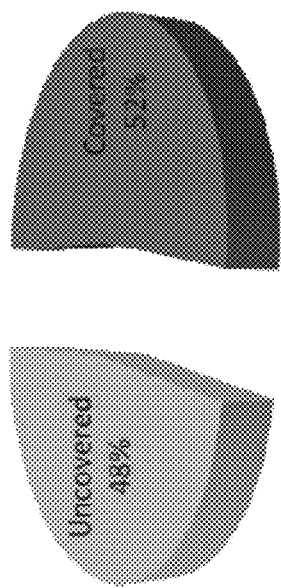
FIG. 38
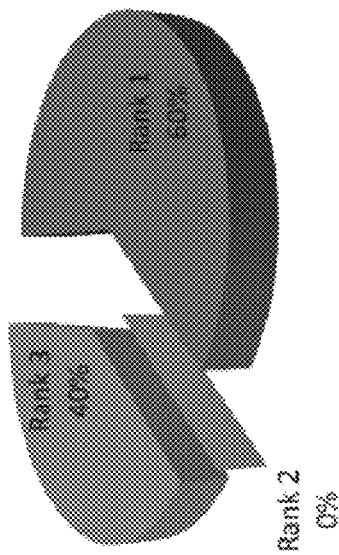
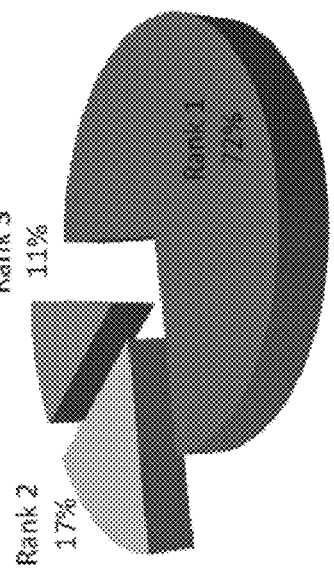
FIG. 39

US 9,021,409 B2

INTEGRATION OF DATA MINING AND STATIC ANALYSIS FOR HARDWARE DESIGN VERIFICATION

REFERENCE TO EARLIER FILED APPLICATION

This application claims the benefit under 35 U.S.C. §119(e) of U.S. Provisional Patent Application No. 61/506,255, filed Jul. 11, 2011, which is incorporated herein, in its entirety, by this reference.

FEDERALLY SPONSORED RESEARCH

This invention was made with Government support under government contract number CCF0953767 awarded by the National Science Foundation. The United States Government has certain rights in the invention.

TECHNICAL FIELD

The present disclosure relates to verification testing of integration circuit hardware design expressed at the register transfer level (RTL), and more particularly, to the computer generation of assertions with which to test the RTL design, which also generates a test suite of vectors usable to test the same design on multiple integrated circuit instantiations.

BACKGROUND

In the hardware design industry, having a design error can be disastrous. In the Intel Pentium P5 chip, a floating point division bug caused Intel to lose up to $475 million in 1995. More recently in 2007, AMD encountered a virtualization bug in its Phenom line of CPUs requiring them to revise the silicon, a costly procedure. Unlike software bugs, hardware bugs cannot always be fixed with a simple patch. These bugs cost hardware manufacturers millions of dollars and precious time in a quickly moving industry.

Assertions or invariants provide a mechanism to express desirable properties that should be true in the system. Assertions are used for validating hardware designs at different stages through their life-cycle, such as pre-silicon formal verification, dynamic validation, runtime monitoring and emulation. Assertions are also synthesized into hardware for post-silicon debug and validation and in-field diagnosis.

Among all the solutions for ensuring robustness of hardware systems, assertion based verification has emerged as the most popular candidate solution for "pre-silicon" design functionality checking. Assertions are used for static (formal) verification as well as dynamic verification of the register transfer level (RTL) design in the pre-silicon phase.

Assertion generation is an entirely manual effort in the hardware system design cycle. Placing too many assertions can result in an unreasonable performance overhead. Placing too few assertions, on the other hand, results in insufficient coverage of behavior. The trade-off point for crafting minimal, but effective (high coverage) assertions takes multiple iterations and man-months to achieve. Another challenge with assertion generation is due to the modular nature of system development. A module developer would write local assertions that pertain to his/her module. Maintaining consistency of inter-modular global assertions as the system evolves in this fragmented framework is very tedious. In sequential hardware, temporal properties that cut across time cycles are usually the source of subtle, but serious bugs. It is difficult for the human mind to express and reason with temporal relations, making temporal assertion generation very challenging.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 2 is Algorithm 1 of the present disclosure for use in decision tree supervised learning useable by the A-miner (assertion mining) of FIG. 1.

FIG. 3 is an example set of simulation traces run through a fragment of the Rigel processor register transfer level (RTL) source code (also displayed) generated by the data generator of FIG. 1.

FIG. 17 is an incremental decision tree building algorithm.

FIG. 28 is Algorithm 2, which is executed by the system in the second step of the flow chart of FIG. 27 for generating candidates (F, P, E).

FIG. 29 is Algorithm 3, which is executed by the system in the third step of the flow chart of FIG. 27 for recalibrating candidate assertions.

FIG. 30 is Algorithm 4, which is optionally executed by the system in the third step of the flow chart of FIG. 27 for integrating a formal verifier into the recalibration of the candidate assertions.

FIG. 38 is a graph of a comparison of both the coverage guided and the decision tree algorithms in terms of the percentage of assertions triggered in the Rigel directed test suite, where assertions generated by the coverage guided mining are triggered at least one, meaning that they are more likely to be triggered in a realistic environment than those generated by the decision tree algorithm.

FIG. 39 is a graph of a subjective ranking by a designer of the set of assertions generated by each of the coverage guided and decision tree algorithms, where all data path assertions were considered a rank 1 by this designed because the designer did not consider them valuable, and where the coverage guided mining algorithm produced a significantly higher percentage of assertions which are at rank 3, which was the original motivation for the technique.

DETAILED DESCRIPTION

Figure 1:
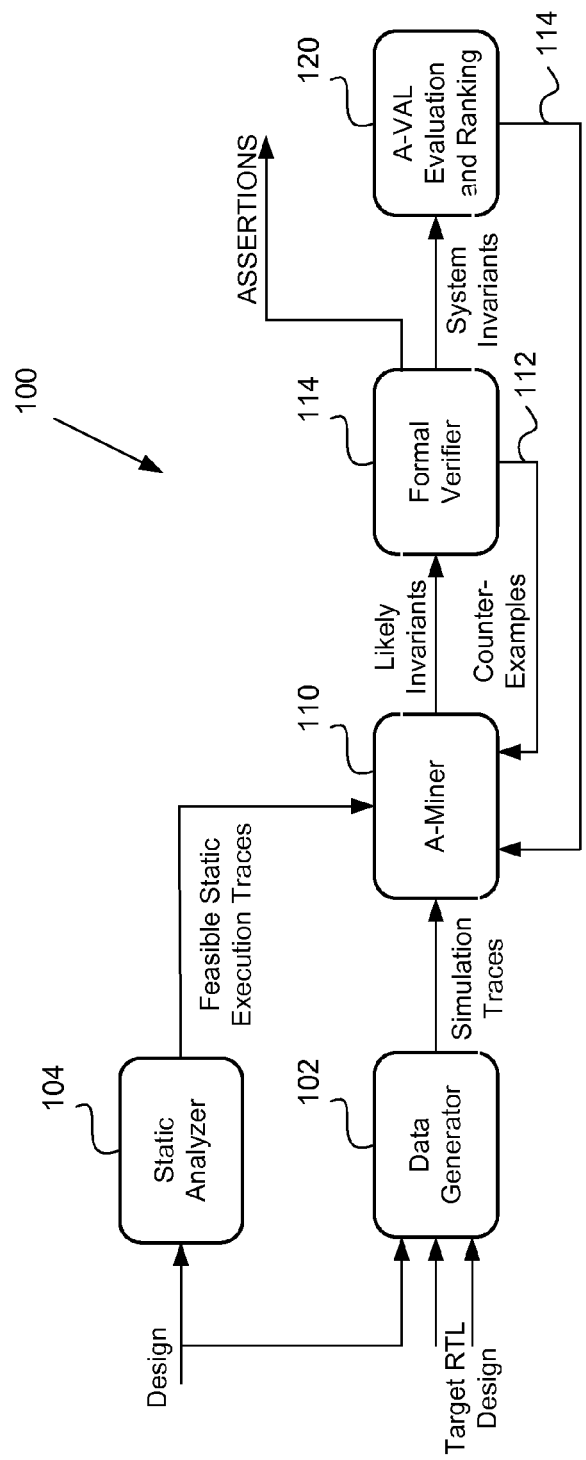
FIG. 1 is a system diagram displaying the processing levels of the disclosed system used to generate assertions using data mining and static analysis.

By way of introduction, the present disclosure explains the integration of two solution spaces: (1) statistical, dynamic techniques (data mining); and (2) deterministic, static techniques (lightweight static analysis and formal verification), to provide a solution to the assertion generation problem. Static analysis can make excellent generalizations and abstractions, but its algorithms are limited by computational capacity. Data mining, on the other hand, is computationally efficient with dynamic behavioral data, but lacks perspective and domain context.

The disclosed system automates the process of generating RTL assertions. Assertions come in antecedent/consequent pairs where both antecedent and consequent can be propositional or temporal logic formulas. An RTL design is simulated using random vectors to produce dynamic behavioral data for the system. This data is mined by advanced data mining algorithms to produce rules that are candidate assertions, since they are inferred from the simulation data, but not for all possible inputs. These candidate assertions are then passed through a formal verification engine along with the RTL design to filter out spurious assertions and retain the system invariants. Static behavioral analysis techniques are employed to guide the data mining process. A designer evaluation and ranking process may be employed to provide useful feedback to the iterative data mining process.

The disclosed system proposes a radical, but powerful validation paradigm. It uses two high impact technologies, data mining and static analysis, symbiotically to assimilate the design space. It then reports its findings in a human digestible form (assertions) early on and with minimal manual effort. This technique is intended to replace the traditional method of the engineer deducing all possible correct behaviors, capturing them in assertions, testing assertions, creating directed tests to observe behavior and finally applying random stimulus.

Random stimulus is applied late in the validation phase, when the design and assertion-based verification environment are mature enough to withstand and interpret random behavior. The system explores the random stimulus space and distills it into assertions that a human can review. The data mining, then, gains knowledge about design spaces that are as yet unexplored by a human-directed validation phase. If an unintended invariant behavior is observed, a bug is detected. Otherwise, an assertion that can be used for all future versions of the design has been generated. The system is best utilized in the regression test suite of an RTL design.

The system is able to generate many assertions per output for a large percentage of module outputs in very reasonable runtimes, which will be demonstrated in a case study. The system has the ability to minimize human effort, time and resources in the long-drawn assertion generation process and increase validation productivity. Along with input/output or propositional assertions, the system can also generate temporal assertions in Linear Temporal Logic. At this time, we can generate assertions with the X operator. The system can generate assertions that are complex or span multiple logic levels in the RTL.

The Hardware Design Cycle

To understand why verification is important and what methods are used for testing circuits, it is helpful to understand the hardware development cycle. The first step in the hardware development cycle is the specification stage, where architects will specify the behavior of a circuit. This may include creating system-level models to simulate this behavior using tools like SystemC. The next step is to specify the Register Transfer Level (RTL) implementation using a hardware design language (HDL) such as Verilog or VHDL that describe the flow of data in a circuit and how that data is manipulated to achieve the desired behavior. The RTL implementation is then synthesized into a gate-level implementation, which specifies how the circuit must be constructed out of individual logic gates. This gate-level implementation is then mapped out to determine where the transistors and wiring will be physically located on a chip. This physical layout is then manufactured at a fabrication plant where the circuits are printed onto silicon. This silicon is placed into a package which can interface with other systems.

Since there is so much work and cost that goes into each step of this cycle, hardware designers put an extremely large effort into making sure that each step is done correctly. Making a mistake in one of the steps means that all of the following steps will be wrong, costing even more time and money. The present disclosure focuses on the testing of the RTL design. There are many strategies used in the testing of the RTL design. The first testing strategy is known as a directed test, which involves biasing the inputs in a certain way to create expected behavior. The directed tests are often paired with mechanisms which check the outputs and internal state to ensure that the expected behavior and the actual behavior match. Another strategy is to randomize the input stimuli to create completely random behavior. This random simulation is paired with many checkers that ensure that circuit behavior is legal for the system. The last strategy is called assertion based verification.

Assertions

The idea of an assertion was first proposed by Alan Turning, who suggested breaking down a large software routine into a set of properties which could each be checked. Later, Robert Floyd developed a formal system for reasoning about flowcharts which was then refined by C. A. R. Hoare. The system was adapted for use in software verification which allowed a programmer to check that certain conditions did not occur. Hardware design and verification was a largely manual process until the VHDL became a standard in 1987. VHDL supports the 'assert' keyword, which allows a designer to specify a condition that must always evaluate to true. Around this same time, formal verification of assertions was also introduced which allowed assertions to be formally proved. However, the power of assertions was limited until hardware verification languages (HVLs) were developed which introduced the concept of assertion based verification (ABV). Today, there are many different HVLs which enable ABV such as SystemVerilog, OpenVera, and Property Specification Language.

Assertion based verification involves defining desired properties of the hardware design and asserting that those properties are never violated. These assertions can be paired with a dynamic method, such as directed tests or random simulation, and will give an error if the property is violated. In addition, a tool called formal verification is a static method that creates a model of the design and checks if the assertion can ever be violated. Formal verification either guarantees that the property can never be violated or gives a counterexample that shows how the assertion is violated. In addition to RTL testing, assertions can be physically synthesized into silicon and used for checking after the chip has been fabricated. Because of their power and versatility, assertions have become the most popular method of verifying an RTL design.

However, assertion based verification has a significant drawback. Assertion generation up until this point has been a manual effort. Assertions must be specified by the designer or the verification engineer. This can be easy enough for simple combinational properties, but for complex temporal properties, it can be very time consuming. In addition, it is difficult to reason between module boundaries. Even if the assertion is correctly specified, certain constraints must also be specified for the assertion to be true. It can also be difficult coming up with the right number of assertions. If the set of assertions is too small, it will not provide very good coverage of the design, leading to a large number of bugs. It can be easy to provide high coverage if there are a very large number of assertions, but this can take a very long time to produce. Additionally, a large set of assertions can also make simulation very slow and synthesis for post-silicon verification impossible if the area is too large. This means that it is up to the designers to produce a minimal set of assertions that also provides high coverage of the design. This process can take up a large percentage of the design cycle, resulting in many lost months of productivity. The solution to this problem is taking the manual effort out of assertion generation.

Data Mining

Data mining is a relatively young field that developed as a means for organizing and analyzing the information stored in databases. There are many forms of data mining such as frequent pattern mining, sequential mining and clustering. However, the present disclosure focuses on frequent pattern mining since this is the type of mining proposed for use in the disclosed system, although any other type of data mining may be used. In general, frequent pattern mining involves finding correlations, or patterns, between items.

Decision Tree Based Learning

The decision tree algorithm works by making successive recursive splits on a database in relation to a target item. Each split implies that a new item from that database has been added to the set of items, referred to as the itemset. These splits are based on statistics referred to as mean and error. Mean refers to the average value of the target item in the database. The error refers to how well the items in the pattern correlate with the target item. The goal is to find a correlation between the target item and the items in the pattern by reducing the error.

For example, consider a database that contains the items which were purchased by customers at a supermarket. Each transaction has a Boolean value associated with each item indicating if that item was purchases (1) or not (0). We want to see what items are frequently purchased along with the target item, "milk." The decision tree observes that splitting on the item "bread" reduces the error more than splitting on any other item. This means that the decision tree will partition the database into entries where bread=1 and entries where bread=0. Bread is added to the itemset and the recursive process continues for each set of database entries. The result is a tree structure that predicts whether milk is likely to be purchased depending on the other items that are purchased.

Association Rule Learning

Association rule mining is a data mining method that attempts to generate all possible correlations between items. This is done by recursively adding items to an itemset until that itemset is frequently correlated with some target item. Though this algorithm has an exponential complexity in the worst case, high efficiency is achieved by applying constraints and using pruning techniques.

Considering the example above, we want to check what items are purchased along with milk. The algorithm attempts to match each single item with milk to determine if there are a significant number of transactions to consider this a valid pattern. After this step, all possible sets of two items are checked for correlation with the target item. This process continues until all possible combinations of items are tested for correlation with milk. This algorithm gives all likely correlations with milk, though the runtime may make it intractable. Significant effort is put into pruning the search space to make this algorithm reasonable to use.

FIG. 1 is a system diagram displaying the processing levels of a system 100 used to generate assertions using data mining and static analysis. The system 100 may include, but not be limited to, a data generator 102, a static analyzer 104, an A-miner 110 (for assertion mining), a formal verifier 114 and an A-VAL evaluation and ranking module 120. These components of the system 100 may be executed by one or more processors with support from memory and storage (discussed in more detail with reference to FIG. 41).

Data Generator

The data generator 102 simulates a given design (or a "module" of the design). If regression tests or workloads for the design are available, they can be used to obtain the simulation traces. The system 100 also generates its own set of simulation traces using random input vectors. Input vectors including vectors of Boolean input stimuli values for simulation of the RTL design.

Typically, simulating with randomized inputs produces the largest number of true assertions. The inventors use a script to generate a testbench for each Verilog design to be tested. In the testbench, each input bit is assigned with a completely random value for each cycle by using the Verilog $random function. Alternatively or in addition, the random input values may be constrained using background information where certain input combinations may not be allowed. For most of tests conducted, the simulation is conducted for 10,000 cycles, though this number can be increased for extremely large or complex designs.

Lightweight Static Analyzer

The static analyzer 104 extracts domain-specific information about the design that can be passed to A-Miner 110. It can include cone-of-influence, localization reductions, topographical variable ordering and other behavioral analysis techniques.

The current version of the system 100 only uses static analysis for logic cone information. The logic cone of a signal consists of all of the inputs which can influence the value of a given output. Since data mining methods can only use statistical methods to infer relationships between signals, it is possible that an unrelated input may be correlated to an output. The logic cone prevents this problem by restricting the searched inputs to only those which are related to the output.

This static analysis is also advantageous in that it decreases the runtime in many data mining algorithms since there are fewer inputs to consider.

The inventors have developed a script for generating the logic cone of an output. This script first synthesizes the target RTL into gate-level RTL and flattens the hierarchy, making it easier to parse. Then the script analyzes each gate and records which input signals influence the output of the gate to generate a one-level-deep logic cone for each internal signal and primary output. Based on these one-level logic cones, the script recursively adds the logic cones of the signals in each primary output's logic cone until a full logic cone has been produced.

A-Miner

The A-Miner 110, or data mining algorithm executer 110, derives knowledge and information from the simulation trace data. This is done by searching for correlations between the inputs and a target output. For example, in a simulation trace, whenever inputs A and B are both 1 ("one"), the output C is also 1 ("one"). A data mining algorithm can quickly and efficiently recognize this pattern. Data mining algorithms use statistics such as support and confidence to determine whether there is actually a relationship between the inputs and the target output. Given a rule A⇒B (henceforth of the form if a then b), support(A) is the proportion of instances in the data that contain A. Confidence can be interpreted as an estimate of the conditional probability P(B|A). If a rule has 100 percent confidence, it means that within the data set, there is complete coincidence between A and B. A high support for this rule means that A occurs frequently in the data set. The system 100 seeks to guarantee that the confidence is 100% if the desire is to generate an assertion that is likely to be true. The reason for this is that if a given antecedent is correlated with an output that has multiple different values, then that cannot be an assertion since the antecedent does not imply a single value.

The A-Miner 110 also provides hooks for incorporating domain-specific information from the lightweight static analyzer 104 into the mining algorithms. The data mining algorithm allows specification of which inputs have a relationship with the target output as determined by the logic cone. In addition, the execution of the data mining algorithm can have multiple feedback loops from different parts of the system 100. Using the information provided to it, the A-Miner 110 produces a set of candidate assertions which are likely to be true. Objective measures of interestingness can be used to rank this set of candidate assertions, such as the support as specified above.

Decision Tree Based Supervised Learning Algorithms

Association rule based data mining algorithms find all possible associations between sets of predicates and rank them according to support/confidence. For sequential blocks that might have temporal properties, exhaustive search is an inefficient option in our experience (see below case study).

The system 100 may use decision-tree or cover-guided based supervised learning algorithms in the A-Miner 110. The coverage-guided method will be discussed in more detail beginning with FIG. 26. In a decision tree, the data space is locally divided into a sequence of recursive splits in a small number of steps. A decision tree is composed of internal nodes and terminal leaves. Each decision node implements a "splitting function" with discrete outcomes labeling the branches. This hierarchical decision process that divides the input data space into local regions continues recursively until it reaches a leaf.

The system 100 may require only Boolean splits (for Boolean variables) at every decision node. The error function implemented to select the best splitting variable at each node is the variance between the target output values and the values predicted by a candidate antecedent. The winning variable is the one whose error is minimum, which then forms the next level of the decision tree. Each leaf in the decision tree becomes a candidate assertion where the variable and value at each split represents a proposition in the antecedent and the mean of the output represents its predicted value in the consequent.

An exemplary decision tree algorithm that the system 100 may use is shown in Algorithm 1 (FIG. 2). The decision_tree function has three inputs: F represents the set of inputs that are available to split on, P represents the set of propositions in the antecedent of an assertion, and E represents the set of simulation trace samples. In addition, $A_c$ represents the set of candidate assertions and z represents the output for which assertions are being mined.

The mean function calculates the mean of the values for z in each sample and represents the expected value of z. The error is a function that calculates the absolute deviation of the output value in each sample from the expected value. Other functions, such as variance, can be used as an error function. The error function will be high when there is a lot of deviation in the output's value in each sample and it will be zero when the output's value is the same in each sample.

The algorithm first checks if the error of the simulation trace is zero. If so, a candidate assertion is added to $A_c$ where P represents the set of propositions in the antecedent and the output is equal to the mean in the consequent. If the error is zero, it indicates that all values of the output are the same, meaning that the mean is equivalent to the value of the output in all samples.

If the error is not zero and an assertion cannot be created, the algorithm looks for a suitable input in F to split on. The potential error is calculated based on partitioning the simulation data into only the samples where $f_i=0$ and only the samples where $f_i=1$. The potential error of each set of samples is summed and subtracted from the error of the unpartitioned data set. This is the potential error reduction for splitting on $F_i$. The $f_i$ that results in the best error reduction is chosen as the splitting variable. The algorithm recurses with the splitting variable removed from F. One instance of decision_tree will add $f_{best}=0$ to P and have E partitioned with respect to 0 while the other instance will have $f_{best}=1$ in P and E partitioned with respect to 1.

Formal Verifier

Figure 15:
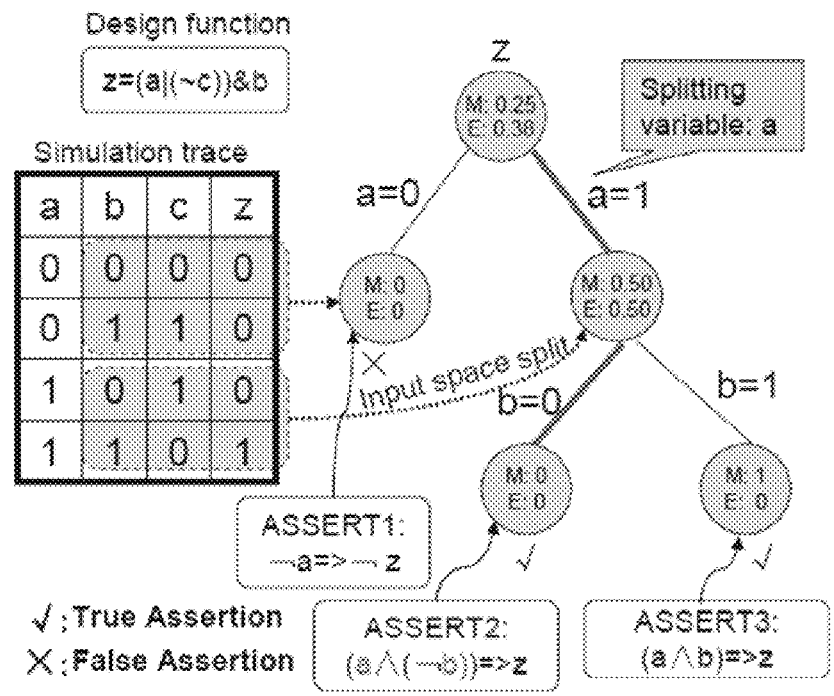
FIG. 15 is a set of graphs displaying the decision tree building process and assertion generation.

In order to check if the likely invariants generated by A-Miner 110 are system invariants, the design and candidate assertions are passed through a formal verification engine, the formal verifier 114. If a candidate assertion fails formal verification, a counterexample 112 can be generated for feedback to the A-Miner, which will be discussed in more detail starting with FIGS. 15 and 16. The candidate assertions are attached to the design for verification and checked at the positive edge of the clock cycle. The reset signal of the design is constrained to "off" so as to prevent spurious counterexamples. Although the system 100 seeks to minimize the human effort in the assertion generation process, human intervention may be used to differentiate between a spurious candidate assertion that fails the formal verification and a genuine system invariant whose failure reports the existence of a bug.

A-VAL: Evaluation and Ranking

Once the system 100 has generated assertions, it is helpful to evaluate the assertions because assertion generation has been a completely manual process thus far in the system design cycle. The A-VAL evaluation and ranking module 120 may be executed by a processor of a computing device and may also be executed by human evaluators and input as feedback (114) into the A-Miner 110. There are several ways to evaluate the performance of the A-Miner 110. One basic metric is the hit rate of true assertions. The hit rate of a run through the system 100 is the ratio of true assertions to candidate assertions. This provides a very crude indicator of performance. In addition, evaluators can consider output hit rate, which is the number of outputs for which the system 100 could generate a true assertion over the total number of inputs.

Since there are no commercially used metrics for evaluating the coverage of an assertion, the inventors have devised a method to evaluate assertion coverage. It should be noted that this metric has no relation to standard coverage metrics such as code, branch, or path coverage. The reason for this is that those metrics are used for judging the quality of a directed test suite, which means that they cannot be applied to a set of individual assertions. One can evaluate the coverage of an assertion by considering the input space that is covered by the antecedent of the assertion. If one considers the truth table with respect to some output, each entry that corresponds to the propositions in the antecedent of an assertion is defined as covered by that assertion. For example, if there is an assertion (a=1&b=1⇒c=1), one can consider the input space coverage to be 25% since we know that 25% of the truth table entries contain a=1, b=1. The reasoning behind this thinking is that if there is a set of assertions that covers each entry in the truth table of an output, that output is well covered by the set of assertions. This metric is straightforward to calculate since one can determine the percentage of the input space that an antecedent of an assertion covers without knowing every single input combination. The input space coverage may be defined as $\frac{1}{2}^{|P|}$ where |P| is the number of propositions in the antecedent. Based on this definition, it can be seen that the input space coverage is relative to the number of propositions in the antecedent. It should also be noted that this notion of coverage can be extended to sequential designs. If one considers an unrolled circuit where each signal, s, in the truth table is represented at the current time, s[t], one can consider the signal at each time cycle before it, for instance s[t−1], s[t−2], . . . , s[t−n]. Given that n is large enough, one may always be able to represent this coverage accurately in these terms.

In order to bridge the gap between the human and the machine generated assertions, human judgment may also be integrated into the processes executed by the system 100 where the designer ranks the true assertions according to some predefined ranks. This is indicated as the A-VAL evaluation and ranking module 120 of the system 100. This provides an objectification of an inherently subjective decision and can be used as feedback (at 114) into the A-Miner 115, with a view to predict the ranking of a generated assertion and optimize the process for achieving higher ranks.

Temporal Assertions

There are some single-cycle assertions which are interesting, but it can be even more interesting to see assertions which span several cycles. These multi-cycle assertions can be found without having to change the data mining algorithm. When the simulation trace is produced, each signal in a sample refers to the value of that signal at the current time, t. The maximum length of a temporal assertion is user-specified as l. The system 100 may represent the signals at previous time cycles t−1, t−2, . . . , t−l in this sample. For each signal, the system 100 can determine the previous values of that signal by checking the samples representing a previous time before the current sample. Now that there is data representing each signal over a number of cycles, the data mining algorithm can proceed as normal to look for relationships.

For example, consider a protocol that asserts ack=1 two cycles after req=1. The simulation data for this module is shown in Table 1, the simulation data for req/ack protocol.

TABLE 1

| time | Req | ack |
|---|---|---|
| 0 | 0 | 0 |
| 1 | 1 | 0 |
| 2 | 0 | 0 |
| 3 | 0 | 1 |
| 4 | 0 | 0 |

The maximum assertion length has been set at l=2 and the system 100 performs the necessary data transformation. The resulting simulation data are shown in Table 2, where the previous cycle information is added to enable temporal assertion mining. Since there is no information for [t−1] in cycle 0 or [t−2] in cycle 0 or 1, we must discard the data in cycle 0 and 1.

TABLE 2

| time | req[t] | ack[t] | req[t − 1] | ack[t − 1] | req[t − 2] | ack[t − 2] |
|---|---|---|---|---|---|---|
| 0 | 0 | 0 | x | x | x | x |
| 1 | 1 | 0 | 0 | 0 | x | x |
| 2 | 0 | 0 | 1 | 0 | 0 | 0 |
| 3 | 0 | 1 | 0 | 0 | 1 | 0 |
| 4 | 0 | 0 | 0 | 0 | 0 | 0 |

The data mining algorithm used for single-cycle assertions cannot be applied. In cycle 3, there is a clear relationship between ack[t] and req[t−2] which results in the assertion req=1XX=>ack=1. This assertion represents the expected behavior for the protocol.

Consider the fragment of the Rigel processor RTL source code shown in FIG. 3. This code implies that writeback on port 0, wb_valid0, is valid if the integer writeback signal, int.valid, is set and a register is available, int.has_dreg. This event updates the L1 cache hit rate. The data generator 102 runs a few simulations and produces the simulation results shown in the table in FIG. 3.

Figure 4:
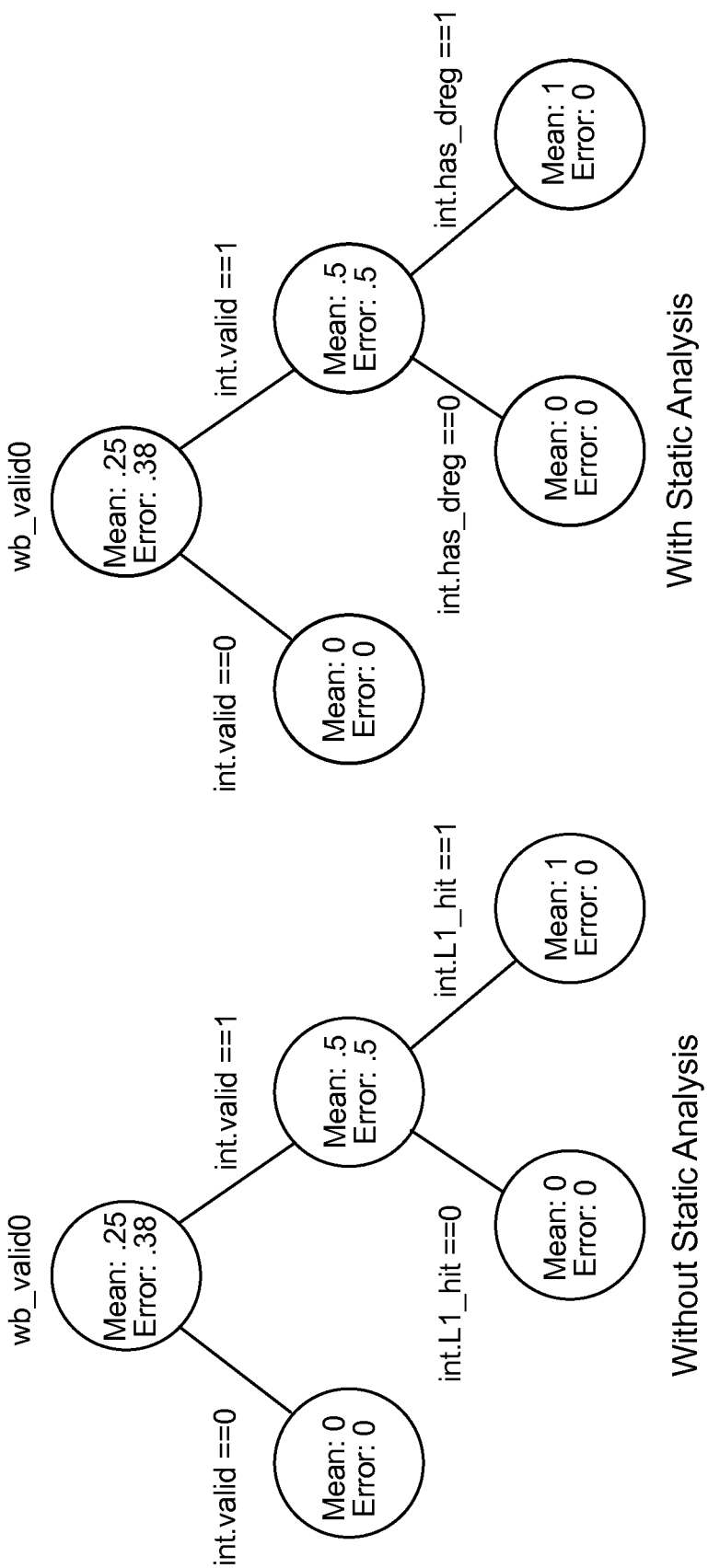
FIG. 4 is an example decision tree generated by the A-miner in FIG. 1 in the absence of any guidance from the static analyzer.

In the absence of any guidance from the static analyzer 104, the A-Miner 110 forms a decision tree for the data. FIG. 4 shows this process. The mean of wb.valid0 is set to 0.25 (average of its values) and the error is set to the absolute difference from the mean, 0.375. The decision tree now tries to split based on the maximum error reduction among all the input values. The values of error for the 0/1 values of int.valid, int.valid, int.L1_hit and int.has_dreg are (0,0.5). Since all values (0/1) of all inputs produce equal error, and in the absence of any guidance from the static analyzer, the decision tree uses the simple heuristic of splitting on the first variable in the list, int.valid. On the int.valid=0 branch, error is reduced to 0, making it a leaf node. A0: if (int.valid=0) then (wb_valid0)=0) is the candidate assertion generated. Since the error value has not yet reached 0 on the int.valid=1 branch, the decision tree tries to split again. Although the value of int.has_dreq is the variable that affects the output of interest, the splitting variable is int.L1_hit since the error reduction for all variable values are equal, and it is first in the list. Since both branches of the tree at this level reach error=0, the leaves produce A1: if (int.valid=0) and (int.L1_hit=0) then (wb_valid0)=0) and A2: if (int.valid=1) and (int.L1_hit=1) then (wb_valid0)=1) as candidate assertions.

All candidate assertions A0, A1, A2 are passed to a formal verification engine, that passes A0 and A1, but fails A2. Hit rate is ⅔ in this case. A3 fails due to the false causality that is established by simulation data.

In the presence of the lightweight static analyzer 104, the logic cone-of-influence information would suffice in this case. The logic cone establishes the part of the design that is causal to int.valid, providing a list of variables to the decision tree that excludes int_in.L1_hit. The corresponding decision tree is shown in FIG. 4.3. The candidate assertions produced now are A0 (same as in previous case), A1: if(int.valid=0) and (int.has.dreg=0) then (wb.valid=0) and A2: if(into valid=1) and (int.has.dreg=1) then (wb.valid=1). All these candidate assertions are passed by the formal verifier 114, with a consequent hit rate of 1.

There are three disadvantages of the temporal assertion mining method. The first is that there must be a user-specified bound on the maximum number of cycles in an assertion, l. The second is that as l increases, the runtime of the algorithm increases since the number of signals that the data mining algorithm needs to search has increased. The third disadvantage is that as l increases, the quality of the generated assertions can decrease since the number of inputs can get so large that making a good splitting decision is difficult. These disadvantages can be mitigated by using background knowledge of the design to choose a good maximum cycle length, l, or testing several different values for l to optimize results.

Applications of the System

As the system 100 produces assertions based on RTL that are then verified using formal verification, one can see that the generated assertions will pass on the given RTL. One of the advantages of the system include applications that have not even been developed yet that may be performed.

One way to use the system 100 effectively is to use the assertions as a regression test throughout development. The assertions that are true in one revision may fail in a later revision. This can indicate that the assertions are no longer relevant, which indicates that those assertions must be updated. However, it can also indicate that a revision of the design introduced a bug which the assertion can help to locate. For example, the system 100 may be used on an arithmetic logic unit (ALU) and produces a set of assertions. The ALU is then revised to make a certain function faster. If there are any assertions that fail, it likely indicates that there is a bug in the revised code.

When using random testing to verify a design, it can be difficult to determine the number of cycles to simulate before declaring a unit fully verified. One way to measure testing completeness is to use standard coverage metrics, but this method only gives a very general idea of the coverage. The system 100 can also be used in addition to standard coverage metrics to increase confidence of a design. The trace from the random test simulation can be mined for assertions. Any assertion mined from this trace indicates behavior that is covered in the simulation trace. This means that if the assertions generated by the system 100 have a high coverage, it is likely that a high percentage of design behavior has been covered in the random test. If the assertions generated do not have high coverage, the simulation likely needs to run for more cycles.

A Case Study of a Multicore RTL

Results were generated through applying the system 100 to the 1000+ core Rigel RTL design. The intention was to use assertions the system 100 generates to provide a regression test suite for the Rigel RTL that is in the later stages of its evolution. The system 100 generated assertions for three principal modules in Rigel: the writeback stage, the decode stage and the fetch stage. The writeback stage is a combinational module with interesting propositional properties. The decode and fetch stages are sequential modules with many interesting temporal properties.

Subjective Ranking of Assertions by a Designer

We performed some experiments to help evaluate the assertions the system 100 generated. The inventors performed an extensive designer ranking session for every phase of assertion generation of each module. Also, since the Rigel RTL does not have manual target assertions to compare against, the inventors performed a subjective, but intensive evaluation strategy. Rankings were from 1 to 4, calibrated as below:

1. Trivial assertion that the designer would not write;
2. Designer would write the assertion;
3. Designer would write, and captures subtle design intent; and
4. Complex assertion that designer would not write.

Figure 5:
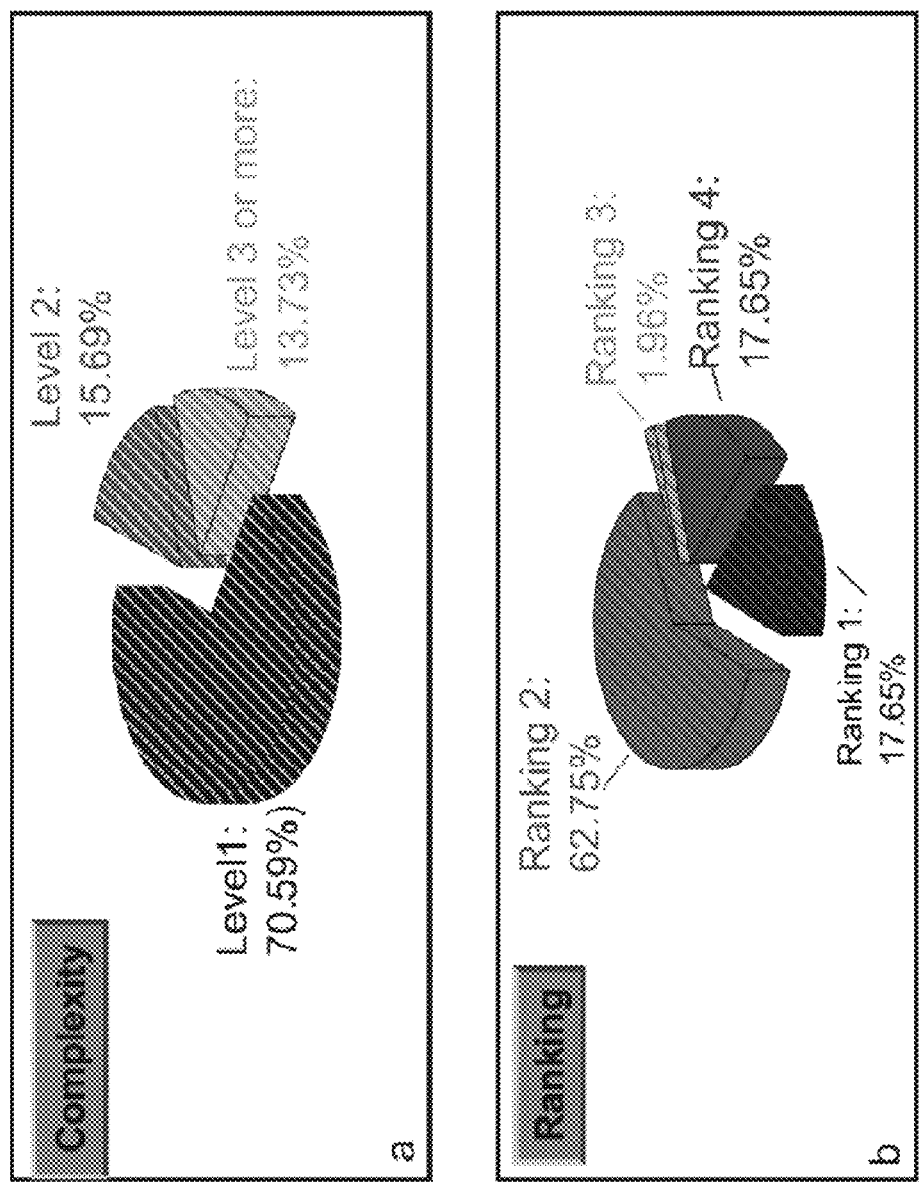
FIGS. 5A and 5B are, respectively, complexity and ranking graphs of results of sets of experiments performed on the Rigel RTL, which will be explained.

The results presented in FIG. 5 show the distribution of these ranks for a sample of representative assertions over all the modules. The algorithmic knobs that produced the highest hit rate as well as the highest number of assertions were turned on for this experiment. Most assertions in this analysis rank at 2. The writeback module has some assertions ranked 3. The absence of assertions ranked 3 in the sequential modules, according to the designers, is due to the fact that intra module behavior is not complicated enough to have many subtle relationships. For example, an assertion ranked 1 may be: if the halt signal in the integer, floating point and memory unit is set to 0, the halt signal is set to 0. In the RTL, the halt signal is a logical OR between the integer, floating and memory units. The system 100 found a true, but over-constraining rule. The designers ranked it 1, since they would not have written this rule. Now, consider this RTL code:

```
decode2mem.valid <= valid_mem &&
!issue_halt && !branch_mispredict &&
fetch2decode.valid && !follows_vld_branch
```

An assertion ranked 2 may be: if branch_mispredict is high, decode2memvalid will be high in the next cycle. An assertion ranked 3 may be: if an integer unit does not want to use the first port, and the floating point unit does not want to use the second port, then the second port remains unused.

Complex Assertions

Despite the small size of the modules, the system 100 achieved rank 4, i.e. it produced assertions that capture complex relationships in the state space design of the RTL. This is an advantage of mechanically derived assertions: they are able to capture unintentional, but true, relationships that can be excellent counter checks and can be brought to the designer's attention. The inventors assessed the complexity by the number of levels (depth) of the design captured by assertions. In a few cases, the assertions capture temporal relationships that are more than 6 logic levels deep in the design. This provides a different perspective on the RTL, outside of the expectation, but may provide avenues for optimizing or analyzing the RTL. For example, the RTL has the following relationship:

```
if( choice_mem)
    decode_packet <= decode_packet1;
```

An assertion ranked 4 may be: if (reset=0) and (issue0=0) and (decode_packet_dreg=0), and in the next cycle if(instr0_issued=0), then decode packet_dreg=0. This assertion relates a single field in the decode_packet variable to reset and instrt0_issued, both of which are related to choice_mem when the code is traversed beyond 6 levels of (sequential) logic. Such a relationship would have been extremely hard to decipher through static analysis and code traversal. To the best of our knowledge, there is no state-of-the-art tool/technique that can claim to decipher such complex assertions. FIG. 5.1 shows the distribution of assertions with respect to complexity.

Outputs Covered by the System

Figure 6:
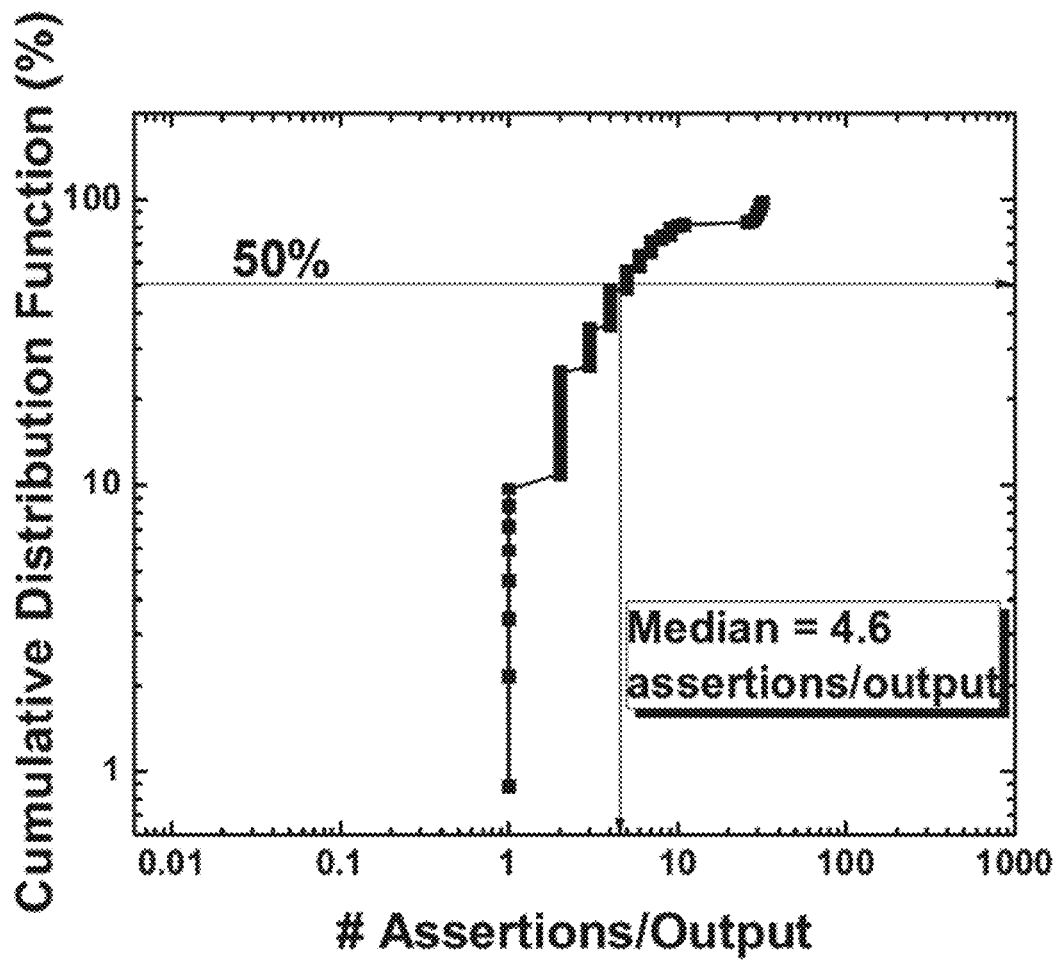
FIG. 6 is a graph showing a distribution of unique assertions per output in all decode modules of the system.

Table 3 shows a percentage of outputs per module for which assertions were generated by the system 100 that covered the Rigel design. Although candidate assertions were generated for all the module outputs, the assertions that passed formal verification covered a percentage of them. FIG. 6 shows the probability distribution of true assertions per output. At the 50% mark, there will be approximately 4 to 5 unique assertions per output in the decode module. The unique assertions per output are indicative of high path coverage.

TABLE 3

| time | Outputs Covered |
| --- | --- |
| Decode Stage | 46.76% |
| Fetch Stage | 35.71% |
| Writeback Stage | 87.50% |

The Acid Test: Regression Test Experiments

As a final evaluation of the entire regression suite of generated assertions, the inventors appended the generated assertions in the RTL and ran a new set of directed Rigel tests.

The inventors then analyzed the results for the writeback module, since the fetch and decode are very similar. The Synopsys VCS is used with RTL conditional coverage for procuring coverage of the directed tests. The conditional coverage metric is also used since unique assertions in the system 100 pertain to different paths. This metric is meaningful since it examines individual path conditions in generating an output.

Figure 7:
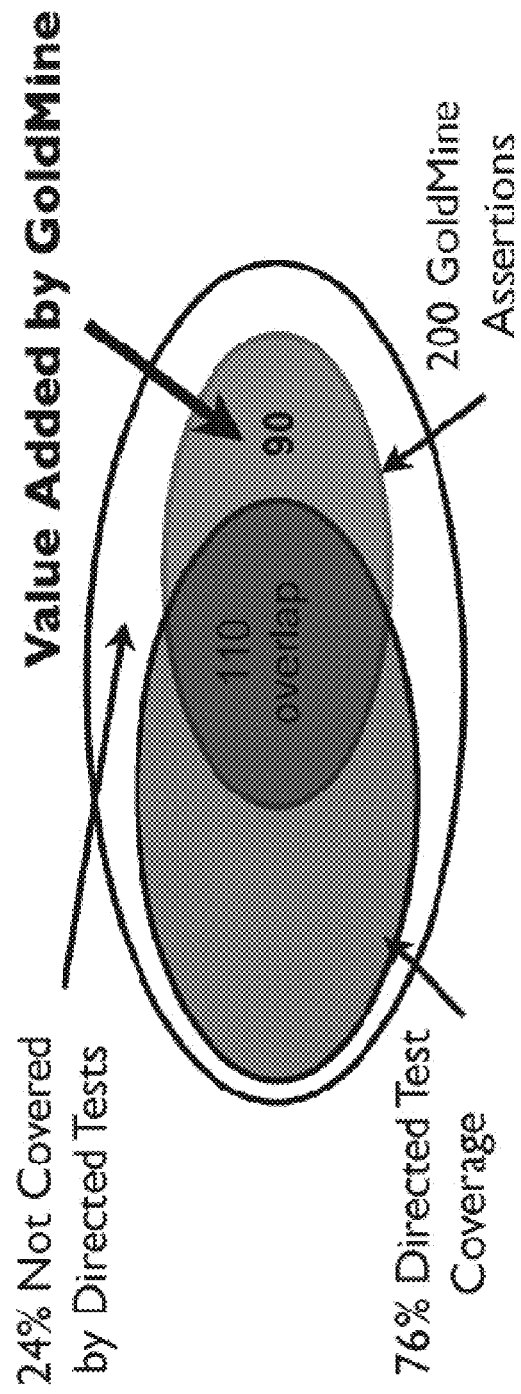
FIG. 7 is a graph showing the added coverage of design behavior through generated assertions for the writeback module.

The writeback module directed tests achieved 76% conditional coverage, while the random tests used to generate the assertions achieved 100% conditional coverage and generated 200 unique assertions. When the assertions were included in the directed test runs, 110 (55%) of the assertions were triggered by the directed tests. An assertion is triggered if the antecedent condition evaluates to true. Therefore, 90 assertions, or 45%, refer to design behavior as yet untested by the directed tests. FIG. 7 shows the overlap of assertions with directed tests. This highlights the value of disclosed system 100, since the system provides significant coverage of the unexplored regions of the design at this early stage.

The overlapping assertions that coincide with the designer-crafted directed tests can be used for static checking, formal verification, etc. However, the untouched assertions can be used to improve the quality of the directed tests. They can be used as regression checks as the test patterns mature and the regression test suite evolves. It is probable that the manual assertion generation process would eventually get to this point after multiple iterations. In contrast, in the disclosed system, a mechanical assertion generator, could explore the design space far beyond the human generated tests. The designers of Rigel have evaluated the disclosed system's contribution as "covering a wide design space much earlier in the design cycle than typically achievable."

Scaling System to Industrial Designs

It is difficult to properly assess the utility of the system 100 without testing it on an industrial size design. This can be difficult since most companies are protective of their intellectual property and will not distribute their HDL designs. However, Sun provides a few open source designs for the UltraSparc series of CPUs. Sun's OpenSparc T2 CPU is a many-threaded, open source design which makes it an optimal example to demonstrate the effectiveness of the system 100.

For initial tests, the inventors isolated the memory management unit (MMU) of the core for assertion generation. This unit reads the translation lookaside buffer (TLB) for the data and instruction caches and performs a page table walk in the case of a miss. This unit has 59 inputs, 54 outputs and 313 internal signals. The inventors searched for assertions for the 16 outputs for which they could generate a significant number of samples using random input vectors. The A-Miner 110 searched for correlations between each output and all of the inputs and internal signals. If no logic cone information is used, the total number of bits that the decision tree can split on is nearly 3,000, making this a complex test for the A-Miner. The tests were performed with 10,000 and 1 million cycles, respectively, worth of simulation data for assertion generation.

Evaluation of True Assertion Success Rate

Figure 8:
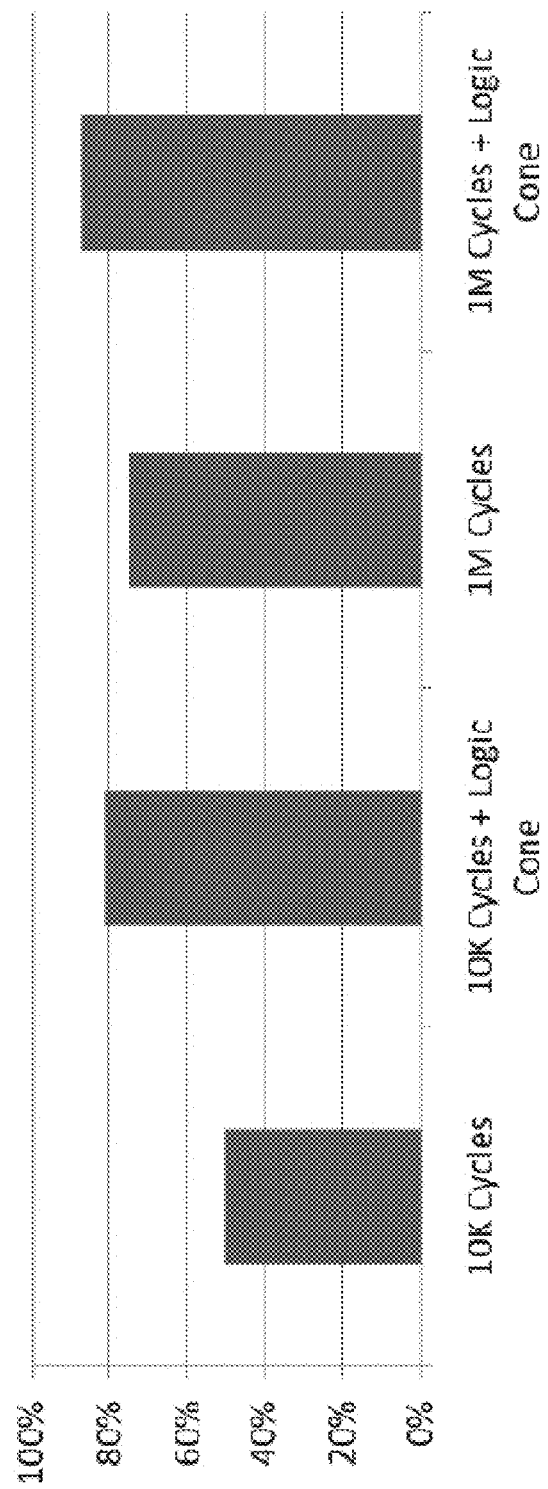
FIG. 8 is a graph showing a percentage of outputs for which at least one true assertion was generated for a memory management unit (MMU) of Sun's OpenSparc T2 CPU.

The first metric for gauging the success of the system 100 is to determine what percentage of outputs had at least one valid assertion generated. Several different configurations of the system 100 were compared for this statistic. The first configuration uses 10,000 cycles of simulation data and no logic cone of influence. The second also uses the same 10,000 cycles of simulation data, but includes the logic cone information. The third and fourth configurations use 1,000,000 cycles of simulation data. Similarly, the third configuration does not use logic cone information and the fourth configuration does. In FIG. 8, note that both increasing the number of cycles of simulation data and using logic information can increase the number of outputs with at least one true assertion. Also interesting to note is that only using the logic cone can result in more outputs being covered than increasing the number of cycles of simulation data by two orders of magnitude.

Evaluation of Assertion Input Space Coverage

Figure 9:
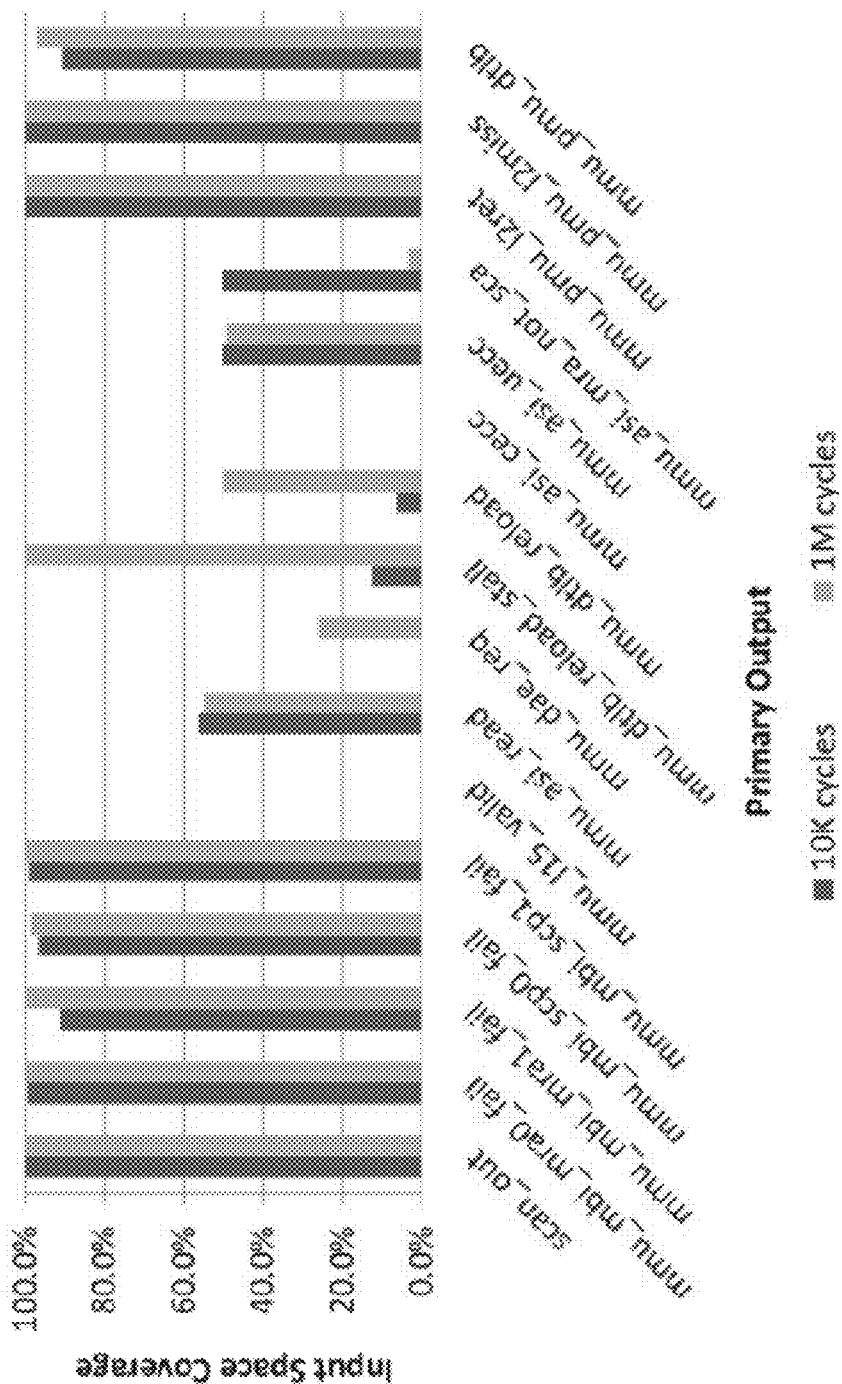
FIG. 9 is a graph displaying good input space coverage of the MMU design with only 10,000 cycles of simulation data.
Figure 10:
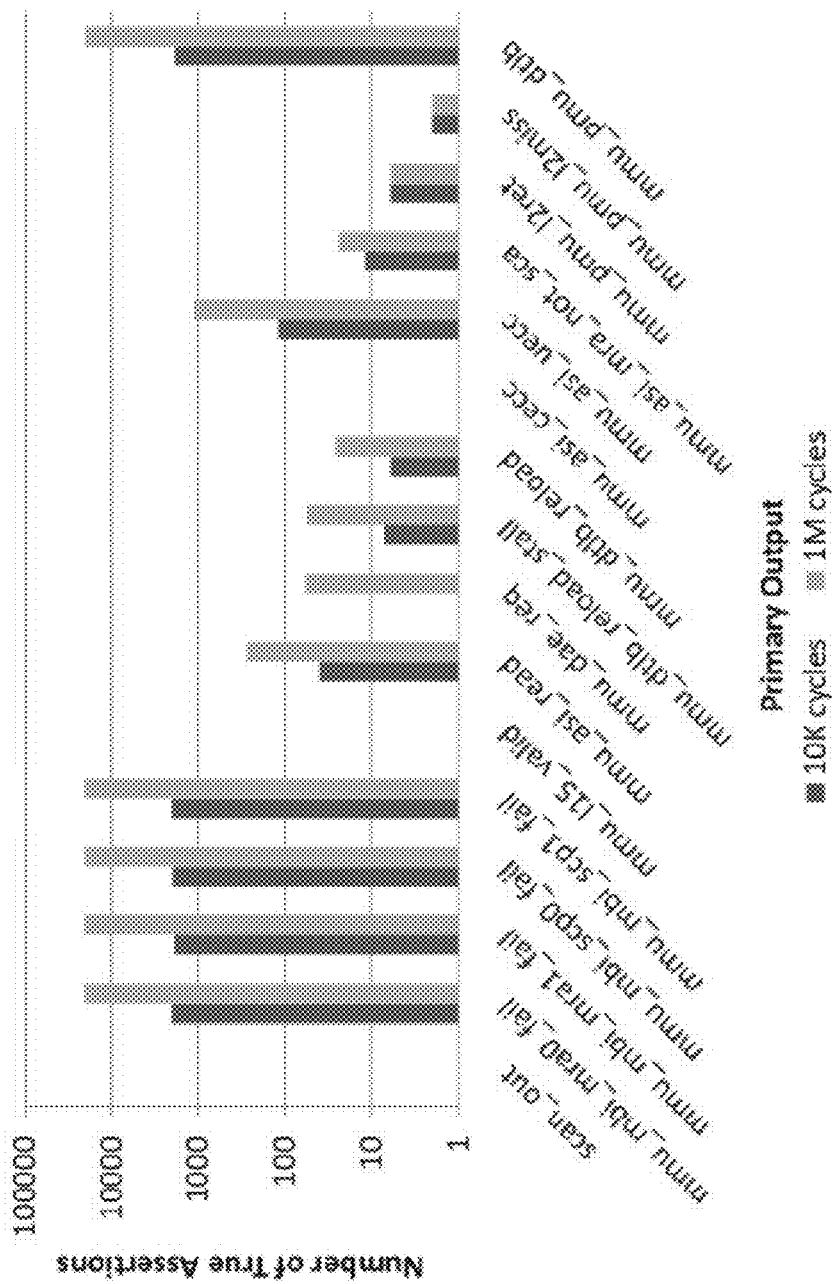
FIG. 10 is a graph displaying the total number of assertions for the MMU increases greatly to account for new coverage provided through the generated assertions.

In the process of evaluating the assertions generated for the Rigel design, the generated assertions were ranked by the actual designers of the modules. However, such subjective rankings were not available for the OpenSparc CPU. Because of this, the inventors had to use an objective way to assess the quality of the assertions. To do this, the inventors used input space coverage as defined earlier. For this experiment, the system 100 uses simulation data generated using 10,000 and 1,000,000 cycles of random input stimulus. As shown in FIG. 9, note that the system can produce assertions with good input space coverage with only 10,000 cycles of simulation data. The input space coverage when using a large amount of data produces a set of assertions with even greater input space coverage. However, as seen in FIG. 10, the total number of assertions increases greatly to account for the new coverage.

Evaluation of the Percentage of Complex Assertions

Figure 11:
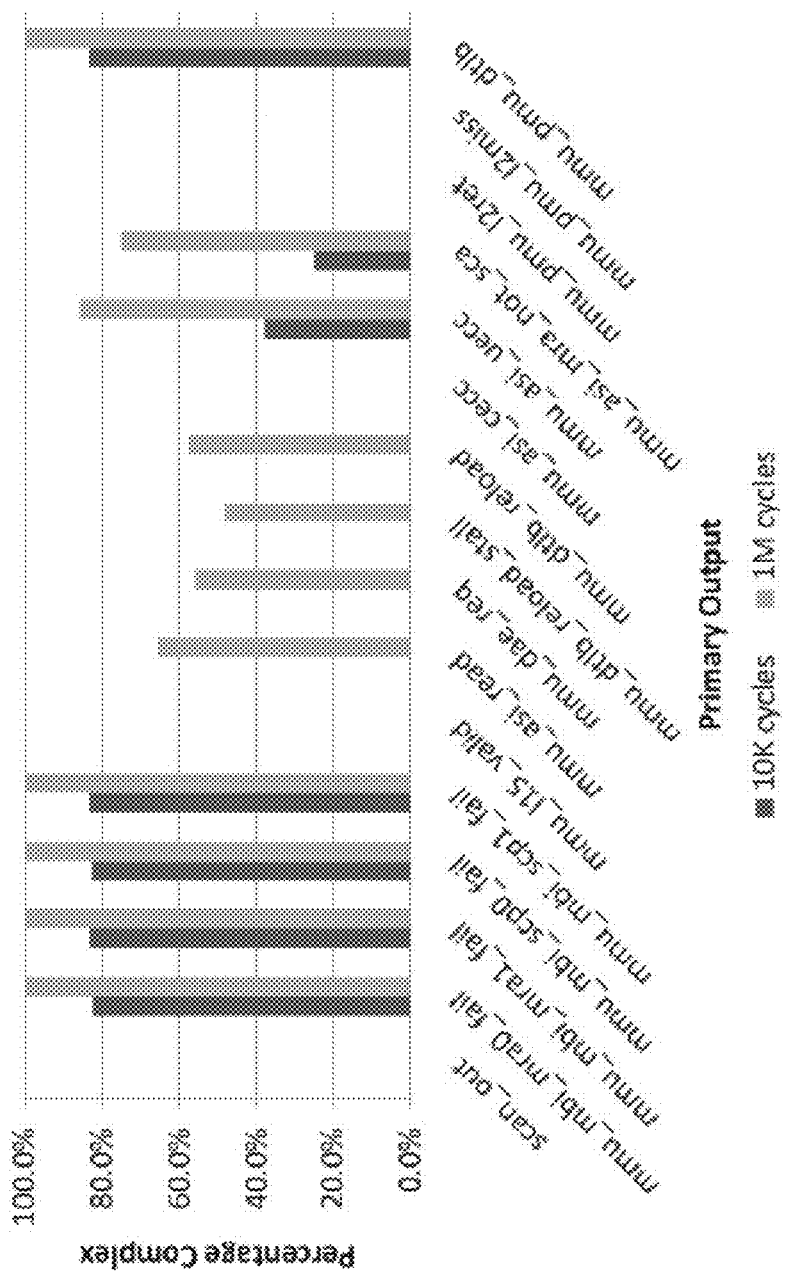
FIG. 11 is a graph displaying percentages of complex true assertions which have greater than 10 propositions in the antecedent out of the total number of true assertions (FIG. 10).

To assess the complexity of the assertion sets, we again use an objective measure since we do not have a designer to review the assertions. One can consider the complexity of an assertion to be relative to the number of propositions in the antecedent of an assertion. For this experiment, the inventors made a statistic of the number of assertions that had more than 10 propositions based on the intuition that it would be difficult for a verification engineer to develop an assertion with this complexity. The percentage of complex true assertions out of the total number of true assertions is shown in FIG. 11. There are certain outputs which have a higher percentage of complex assertions which can be attributed to the complexity of the logic corresponding to that circuit. This figure also shows that the experiment with 1,000,000 cycles tends to produce more complex assertions since complex behavior is more likely to appear in a larger random input simulation trace.

Comparing the Generated Assertions with the OpenSparc Specification

To further judge the quality of the assertions generated by the system 100, candidate assertions generated for the L2 cache controller (L2T) of the OpenSparc System on a Chip (SoC) are observed. These candidate assertions are generated with respect to the L2 pipeline stall signal. To understand these assertions, one should first understand the circuit behavior. A stall (l2t_pcx_stall_pq) is signaled when the input queue (IQ), which contains requests for the L2 cache, is full. There are two signals which control whether a request is added or removed from the queue. The data ready signal (pcx__l2_data_rdy_px2_d1) indicates that a request will be added to the queue, causing an increase in queue size. The input queue select signal (arb_iqsel_px2_d1) indicates if a request can be removed and processed by the L2 cache, causing a decrease in queue size.

A complication to this is that the data ready and IQ select signals are passed through a series of flops before they are evaluated to determine whether or not there is a stall. The input signals to the L2 cache for the data ready signal is pcx__l2t_data_rdy_px1, while the input signal for IQ select is arb_iqsel_px2. The chart in Table 4, showing the temporal relationship between signals, shows that the input for IQ select arrives one cycle before being evaluated, while the input for data ready arrives three cycles before.

TABLE 4

| Signal | Cycle t-3 | Cycle t-2 | Cycle t-1 | Cycle t |
|---|---|---|---|---|
| IQ Select | — | — | arb_iqsel_px2 | arb_iqsel_px2_d1 |
| Data Ready | data_rdy_px1 | data_rdy_px1_fnl | data_rdy_px2_d1 | data_rdy_px2_d1 |

The candidate assertions generated by the system 100 are shown below.

```
@ (posedge gclk)
    gm1: 12t_pcx_stakk_pq=1 |=> ##1 12t_pcx_stall_pq=1;
@ (posedge gclk)
    gm2: pcx_12t_data_rdy_pxl==1 ##2 arb_iqsel_px2==0 &&
12t_pcx_stall_pq==0 |=> ##1 12t_pcx_stall_pq==0;
@ (posedge gclk)
    gm3: pcx_12t_data_rdy_pxl==1 ##2 arb_iqsel_px2==1 &&
12t_pcx_stall_pq==0 |=> ##1 12t_pcx_stall_pq==0;
@ (posedge gclk)
    gm4: pcx_12t_data_rdy_pxl==0 ##2 12t_pcx_stall_pq==0 |=>
##1 12t_pcx_stall_pq==0;
```

Based on the behavior described, one can now determine the validity and usefulness of the given assertions. In assertion gm1, the assertion indicates that if there was a stall in the previous cycle, there will also be a stall in the current cycle. This is clearly a spurious assertion. If the queue is currently full, an instruction may be processed causing the queue to no longer be full. This means that in the simulation trace, there were many instances where a stall was followed by a stall, leading to a correlation. However, the circuit does not behave in this way, meaning gm1 is false.

What assertion gm2 indicates is that if stall is currently not active and a request is added, the pipeline will not become stalled. If stall is inactive, the size of the queue is currently below capacity. Based on the inputs, the size of the queue must increase since data ready is true and IQ select is false. This assertion will be true most of the time, but if the queue is one below capacity, an added request will cause it to become full. This will result in a stall. This means that gm2 is also false.

Assertion gm3 states that if there is no stall and the queue size does not change, the queue will remain unstalled. The queue size remains the same because data ready is true, indicating that a request is added, but IQ select is active, meaning that a request is also processed. If the queue is below capacity and stays the same size, it will remain below capacity, meaning that there is no stall. Assertion gm3 is true.

In assertion gm4, if there is currently no stall and there are no more requests added to the queue, the pipeline will remain unstalled. Since data ready is false, the queue size must stay the same or decrease (if IQ select is active). This means that if the queue is below capacity, it must remain below capacity. This means that assertion gm4 is also true.

These results show that the assertions that the system generates are interesting and complex, making them good choices for including in an RTL design. It also shows that, while it can take humans a long time to reason about circuit behavior, the disclosed system is able to do it much more quickly and efficiently.

Evaluation of the Runtime and Memory Usage of System

The last experiment evaluates the performance of the system. In this experiment, the inventors compare Rigel and OpenSparc modules in terms of runtime and memory. First, a comparison of the characteristics of our test modules are presented in

TABLE 5

Table 5. Later, we show how each of these factors affects the runtime and memory consumption.

| Module | Inputs | Outputs | Area |
|---|---|---|---|
| Rigel - Decode Stage | 2195 | 79 | 32735 |
| Rigel - Fetch Stage | 458 | 6 | 4165 |
| Rigel - Writeback Stage | 963 | 3 | 269 |
| OpenSparc - MMU | 3393 | 16 | 66395 |

Figure 12:
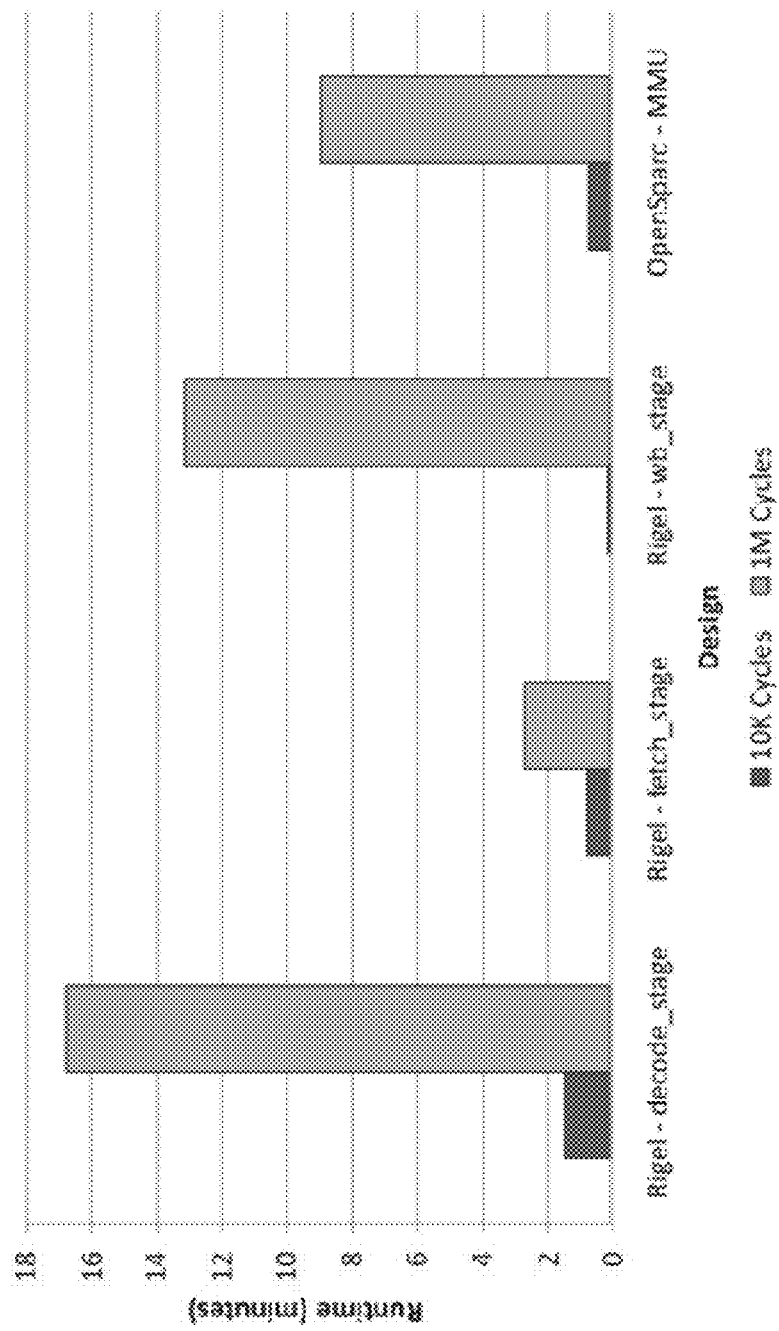
FIG. 12 is a graph displaying system runtime on the Rigel and MMU designs depending on what stage of design in the absence of formal verification.

We will first look at the runtime of the system 100, using a simulation trace of 10,000 cycles as well as a trace containing 1,000,000 cycles. These tests are performed on a 2.66 GHz Intel Core 2 Quad CPU with 4 GB RAM. FIG. 12 shows the runtimes without formal verification. This figure shows that, even on a common desktop processor, the system 100 is able to produce candidate assertions in a very short time. The system 100 runs in just minutes for both the 10,000 and 1,000,000 cycle simulation trace. It can also be observed that the runtime has no relationship with the circuit size. Instead, it is the number of inputs, outputs, and cycles of simulation data which affects the runtime. This means that the system 100 has extremely good scalability.

Figure 13:
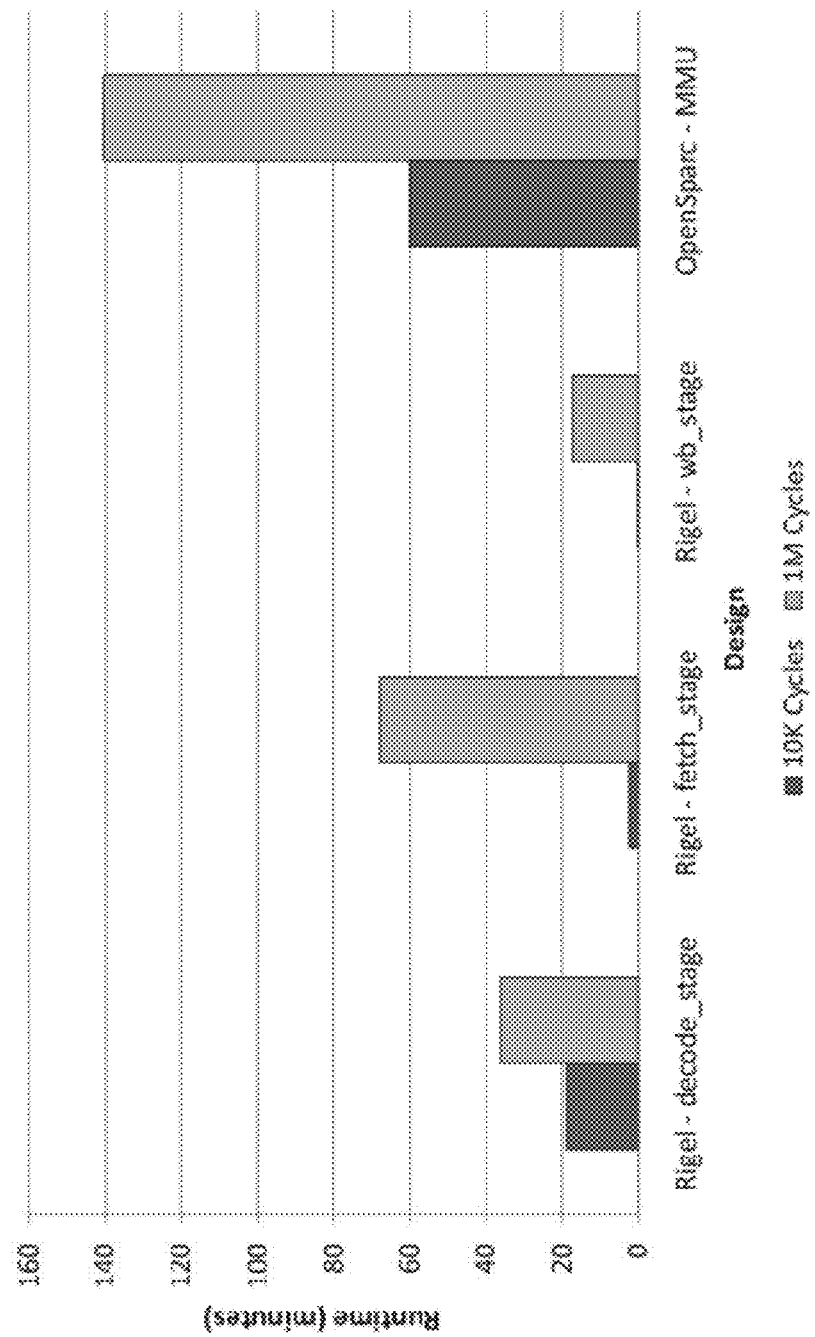
FIG. 13 is a graph displaying system runtime on the Rigel and MMU designs with formal verification enabled.

The runtime is also evaluated for the system 100 when formal verification is used. For this test, we used a cluster of four six-core AMD Operton 8435 CPUs and enable parallel formal verification of assertions. FIG. 13 shows the runtimes when formal verification is used. The runtime is expectedly much higher, but even for the complex OpenSparc MMU module, the 10,000 cycle test completes in only one hour and the 1,000,000 cycle test completes in just over two hours. One of the largest factors influencing the runtime when formal verification is enabled is the number of candidate assertions that are generated, since each one must be verified. A solution for the reduction of runtime would be to limit the number of candidate assertions produced. Though this may limit the number of true assertions generated, it may be a viable choice when runtime is limited.

Figure 14:
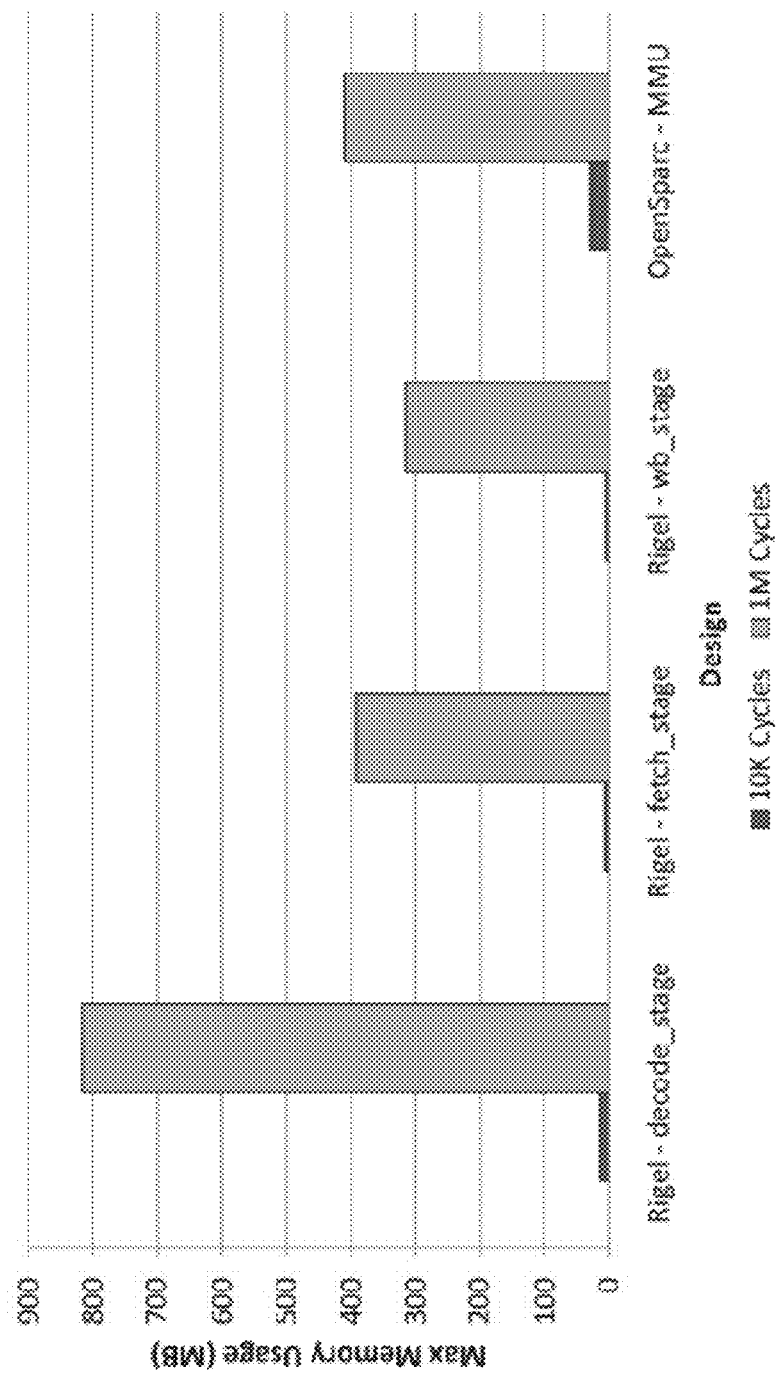
FIG. 14 is a graph showing the maximum memory usage of the system performed on the Intel Core 2 Quad CPU, in which test formal verification was disabled because it does not affect memory usage.

Our last performance experiment is to record the maximum memory usage of the system 100. This test is performed on the Intel Core 2 Quad CPU. Since formal verification does not affect the memory usage of the system 100, formal verification is disabled in this test. FIG. 14 shows the results of the test. From FIG. 14, it is clear that the system 100 is very efficient in terms of memory usage. Even in the worst case, the system 100 does not exceed 1 GB of memory usage in these tests. It can also be observed that the memory usage is again not related to the area of the circuit. The memory usage is actually related to the size of the simulation trace that must be stored in memory, meaning that both the number of inputs and simulation cycles affect the memory usage. The memory usage is also affected by the size of the decision tree data structure which, in the worst case, can be exponential with the maximum height of the tree. If one limits the height of the tree, one does not have to worry about the tree size ever becoming a problem. Since memory usage is not relative to the area or complexity of a circuit, the system 100 has great memory scalability as well as runtime scalability.

The system 100 has evolved continuously since the original concept for the tool was developed.

Shaping the System: Early Changes to the Methodology

In the initial phase of system development, the inventors used an FP-Growth algorithm. This took an unreasonable time (>10 hours) for reaching rules with just three predicates for the decode module. The inventors therefore resorted to the decision tree algorithm. The decision tree is a very fast data mining algorithm that does not suffer from an exponential runtime like the FP-Growth algorithm does.

In the first iteration of the Data Generator, we used directed test simulations. This data was insufficient (approximately 15 tests of 1000 samples each), producing a very low hit rate. We then used random input vector generation on the RTL for the target modules. Even when using only 10,000 samples of simulation data, this drastically increased the hit rate as well as number of true assertions, demonstrating that the type and amount of data can greatly affect the results of the system 100. For the writeback module, we achieved a 100 percent hit rate with this step alone.

Another aspect that had been changed is the stopping criterion of the decision tree splitting. Our initial experiments continued the splitting process beyond the point where the minimum error reduction was reached. This process gave us an extremely high number of candidate assertions (>80,000) with many duplicates (289 out of 300 in one test). In the later stages, we elected to end the decision tree splitting when error was numerically equal to "0", i.e. at the point of 100% confidence, since nothing can be gained past this point.

Originally, the system 100 only worked with combinational circuits, which are interesting, but not very useful to the average verification engineer. The reason for this is that pattern recognition algorithms used in data mining look for correlations that hold true in all samples, which is consistent with combinational behavior since outputs change immediately. However, in sequential circuits, outputs do not change until the positive edge of the clock. This means that if a sample is taken before the clock edge, the output will contain the value determined by the inputs at the previous clock edge, and not the inputs at the current time. This means that no relationship can be found since the current inputs have not influenced the output yet. If a sample is taken after the clock edge, the inputs have already changed from the values that determined the current output, meaning that there is still no relationship that can be inferred from the samples. This problem can be solved without having to change the data mining algorithm. The data is only sampled once per positive clock edge since that is when the interesting behavior happens. The exact time at which the signal is sampled depends on the type of signal. If the signal is an input, it is sampled right before the positive clock edge, and if the signal is an output, it is sampled right after the clock edge. This makes it seem as if the inputs and outputs have changed at the same time and the data mining algorithm is able to find relationships between the inputs and outputs.

In the next phase of the system 100, we added the lightweight static analyzer information that was specific to the domain, such as logic cone-of-influence generation. Although this increased the hit rate only marginally, it increased the number of true assertions significantly. This shows that the static analysis information was very useful in helping the A-Miner 110 focus on the relevant neighborhood of variables to generate candidate assertions.

Performance Enhancements

The decision tree algorithm is very quick, but the formal verification in the system 100 can take a long time when there are many assertions to verify. By using a commercial tool for formal verification instead of state machine variables (SMV), the inventors were able to achieve a significant speedup. We have also used parallelism to increase the speed of the formal verification step. Since each assertion can be verified concurrently, several formal verification threads can be used for a significant speedup. Because there is some overhead in creating the model in formal verification, a small batch of assertions is verified in each thread.

Since memory conservation is important for large problems, we have ported our code from Java to C++. Since Java has dynamic memory management, it is difficult to control the memory usage and it can be difficult to debug memory leaks. Since C++ requires manual memory management, it is easier to keep the memory usage low and controlled.

Improving the Core Algorithms

Though we made many changes to the core of the system 100, we have also extended the system 10 in several ways. The first extension to the system 100 was the addition of counterexample feedback. When the formal verification step determines that a candidate assertion is false, it also produces a counterexample to prove that the assertion can be violated. The A-miner 110 can receive this information as feedback and with which to more accurately and quickly generate assertions. The system 100 may convert the counterexample into a data sample as if that sample were included in the original simulation trace. This forces the data (or A-) miner 110 to reconsider the confidence of this assertion. Since a counterexample is added, the confidence can no longer be 100%, meaning that the decision tree can continue to split. This method allows the decision tree to continue to produce new candidate assertions until all assertions are true.

Counterexample Feedback

As discussed, the A-Miner 110 uses a decision tree based supervised learning algorithm to map the simulation trace data into conclusions or inferences about the design. In the decision tree, the data space is locally divided into a sequence of recursive splits on the input variables. A decision tree is composed of internal nodes and terminal leaves. Each decision node implements a "splitting function" with discrete outcomes labeling the branches. This hierarchical decision process that divides input data space into local regions continues recursively until it reaches a leaf. The system 100 needs only Boolean splits at every decision node, since the domain of interest is digital hardware. The example in FIG. 15 for an output z shows the simulation trace data for inputs a, b and c.

An error function picks the best splitting variable by computing the variance between target output values and the values predicted by decision variables. The predicted value on each node is the mean of output values, denoted by M while the error at a node is denoted by E in the example. When the error value becomes zero, it means all output values are identical to the predicted value and the decision tree exits after reaching such a leaf node. When the error value is not zero, the variable with minimum error value is chosen to form the next level of decision tree. A candidate assertion is a Boolean propositional logic statement computed by following the path from the root to the leaf of the tree. In the example, the splitting of input space into two groups after decision on variable a leads to E=0, corresponding to assertion A1. Along the a=1 branch, another split occurs on b. Assertions A2 and A3 are obtained at the leaf nodes.

The candidate assertions inferred by the A-miner are based purely on statistical correlation metrics like mean and error. The system 100 may restrict the candidate assertions considered to those with 100% confidence. This means that even if a single example in the trace data does not subscribe to a rule generated by the tree, the rule will be discarded. Despite this strict restriction, the A-miner 110 may still infer candidate assertions that are true of the simulation data, but are not true of all possible inputs. To identify candidate assertions that are system invariants, the design and the candidate assertions are passed to a formal verification engine, formal verifier 114. If a candidate assertion passes the formal check, it is a system invariant. Otherwise, the formal verifier generates a counterexample trace that shows a violation of the candidate assertion.

The SMV model checking engine is a part of the system 100, along with a commercial model checker. In the example in FIG. 15, A1 is declared false, while A2 and A3 are declared true. The A-VAL 120 forms the evaluation phase for the assertions, to bridge the gap between the human and machine generated assertions.

The system 100 provides a radical, but powerful validation method. Through mining the simulation trace, it reports its findings in a human digestible form (assertion) early on and with minimal manual effort. Given that data mining performs very effectively when given feedback, the system 100 now incorporates feedback from the formal verification phase for enhancing the simulation test data.

Counterexample-Based Incremental Decision Trees

The decision tree is a structure that captures the design model from the perspective of observable behavior. An assertion can be false due to two reasons—either some behavior has not been observed by the decision tree due to insufficient data, or some inference has been made erroneously due to selecting a correlated, but not causal splitting variable. A counterexample trace exposes both these situations by introducing scenarios that involve at least one new variable. If this new scenario is now included in the input pattern data observed by the decision tree, firstly it prevents the generation of the same spurious assertion. Secondly, it guides the decision tree to navigate regions of input space that have not been considered and/or observed so far. A beneficial side effect of this process is the steady increase in coverage of the input simulation data with each additional iteration.

In order to disprove an assertion, the new data instance consists of all antecedent variables of the assertion and some new additional variables. The values of the antecedent variables are also identical to that in the false assertion and the implied value of the variable is different from that in the false assertion. This characteristic of a counterexample enables a natural way to add it as new data instance to incrementally build a decision tree instead of rebuilding a decision tree from scratch every iteration.

Figure 16:
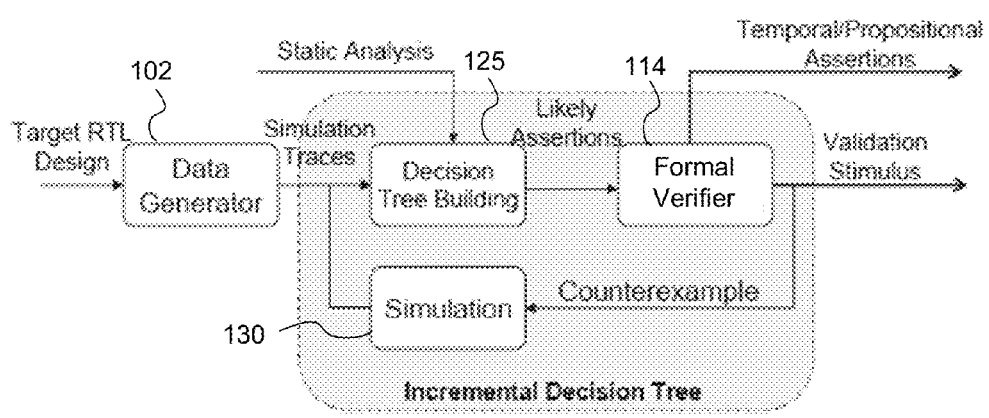
FIG. 16 is a system diagram displaying the processing levels and data flow of a counterexample-based, incremental decision tree algorithm for generating validation stimulation in the system.

In order to keep track of the improvisation of the decision tree for a given output, the inventors devised an incremental version of the decision tree. As shown in FIG. 16, the iterative execution of the algorithm by the system 100 incrementally builds a decision tree at block 125 for an output until it reaches the goal of generating only true assertions (no counterexamples). The full set of correct assertions, plus the new test patterns created from counterexamples during iterations comprise the tangible outputs of the algorithm. The counterexamples traces are passed through a simulation block 130 to generate additional simulation traces for use in the decision tree building block 125 to generate additional likely assertions.

Figure 18:
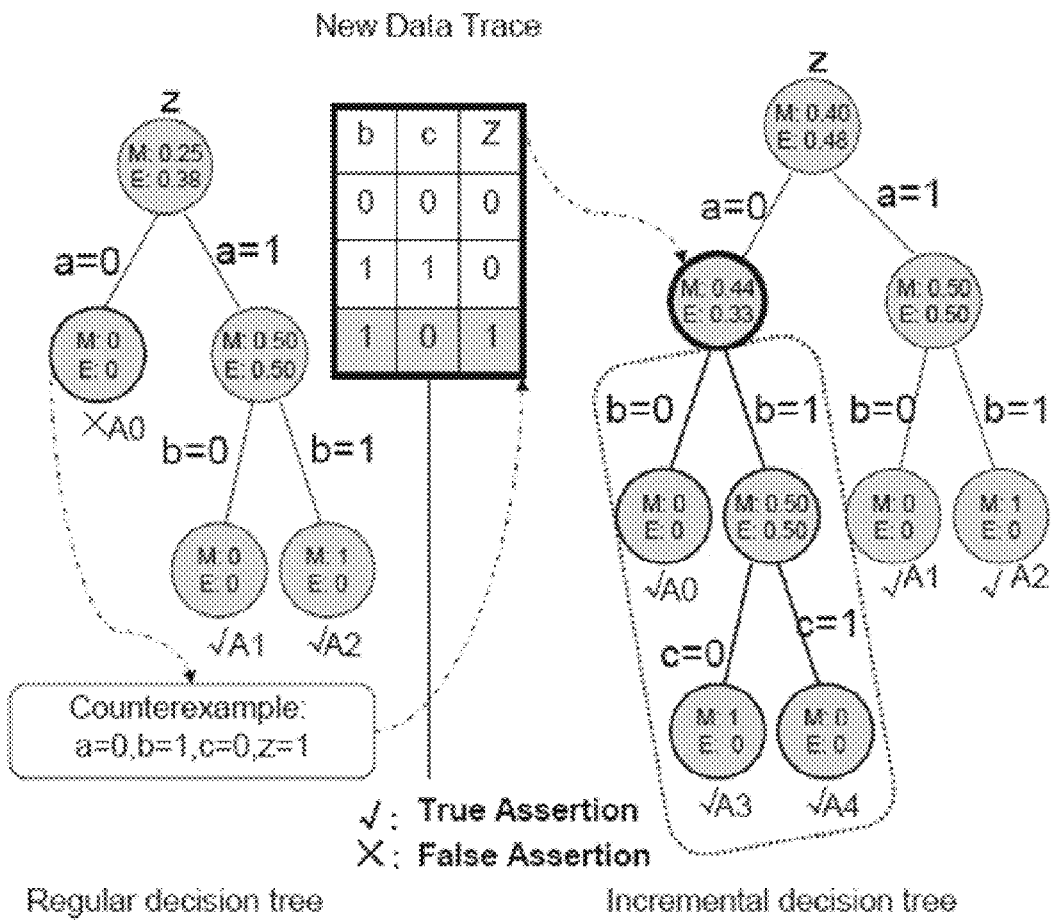
FIG. 18 is a set of graphs that display the difference between a regular decision tree and an incremental decision tree for an output z and Boolean inputs a, b and c, in which the counterexample trace is included in the bottom row of the trace data.

In the recursive incremental decision tree algorithm described in FIG. 17, the parts (lines 4, 7, 8) different from the previously-disclosed methods are outlined. FIG. 18 shows a regular decision tree and an incremental version of it. A decision tree corresponds to a design output. The formal verification in line 4 is employed to check the correctness of assertion whenever a leaf node is reached during the incremental building of decision tree. If a candidate assertion is true on the design, the algorithm returns as in the regular decision tree. In the example, assertions A1 and A2 generated from original simulation traces are true on the design. If the checked assertion is false/spurious, a counterexample is reported by formal verification. A counterexample: $a=0$, $b=1$, $c=0$ and $z=1$ is generated to contradict the assertion A0 on the decision tree on the left in FIG. 18.

The Ctx_simulation( ) function simulates the input pattern created by the counterexample. This lends concrete values to all the splitting variables in previous iterations of the decision tree in the new simulation run.

Since the counterexample follows the same path as the failed assertion, the decision tree continues splitting when it reaches the leaf node corresponding to that false assertion. All other paths of the decision tree are kept unchanged. Due to the new data instance, the mean and error values for each node need to be recomputed using the Recompute_error( ) function. The error value of the leaf node will no longer be equal to zero. In the example, the incremental decision tree continues to split on the leaf node corresponding to false assertion A0 in the regular decision tree. It can also be observed that the mean and error value are recomputed in this iteration on the path from the root to the leaf. The algorithm exits when all the assertions at the leaf nodes of an incremental tree are true.

Stimulus Generation for Sequential Behavior

During the building of a decision tree, the design should be unrolled until resulting in the mining window length. The simulation trace used for assertion mining may have its internal register state visible. It may be desirable to have assertions form a single-cycle flat picture of the design, where assertions on the outputs are functions of internal state values and primary inputs. Assertions can also be formed for the internal state variables themselves, as functions of other state registers and inputs. Such a view of the design gives a "next cycle" model, where the assertions describe internal registers and primary outputs in a similar manner. On the other hand, it may be desirable to have temporal assertions on the design that capture only input-output behavior over some number of cycles.

The system 100 can generate assertions of both types with this algorithm, based on the mining window length and visible state provided. Although the assertion spans sequential behavior over a given length, the generated counterexample may be longer than the mining window length. This may be to expose sequential behavior where an intermediate state variable can be driven to a specific value over several cycles starting from the primary input. In this case, the incremental decision tree algorithm considers only the variables until the farthest back temporal stage, i.e. unrolled until the mining window length. The concrete values of these variables can be acquired through simulation of the counterexample by the data generator. The result is a temporal assertion that spans the mining window length, bolstered by single-cycle assertions using internal state registers to describe the behavior. We discuss an example of sequential logic coverage later.

Final Decision Tree and Unreachable States

The counterexample based incremental decision tree building algorithm is a process of approximation and refinement of an output function. If the complete functionality of an output was available to the decision tree in the form of simulation data, it would completely represent the output function. Such a truth table (or state transition relation for sequential designs) would result in a complete decision tree. However, such an exhaustive enumeration of input patterns is not feasible to obtain as test data. Therefore, the decision tree tries to predict the logic function as an approximation of an output with available data. Faulty predictions are exposed and used for corrective purposes through counterexamples. This makes future predictions more accurate. At the point where all the predictions are accurate is where all the assertions of the decision tree are true. At this point of convergence, a resultant final decision tree represents the complete functionality of an output in the design. The input patterns required to generate such a final decision tree are sufficient for completely covering the functionality of that output.

Note that final decision trees include only the legal, reachable states of the design. This is a subset of the state space that is obtained by statically enumerating input combinational or sequential patterns. Static traversal of states does not account for illegal inputs or dynamically unreachable state. However, since the decision trees are constructed out of dynamic simulation data, it only observes the behavior that is executable, thereby eliminating unreachable states. For sequential logic, the algorithm captures the behavior in the assertions for a given length. The constraints on register variables from previous cycles are also captured by the decision tree. Although the assertions are captured for only a bounded number of cycles, the formal verification ensures that the temporal assertions will exclude unreachable or illegal states in the design. This means that the input test patterns that generate a final decision tree comprise exactly the necessary stimulus to capture the output logic. There are no superfluous patterns that reach illegal state in the disclosed methodology.

When all the assertions generated from the decision tree are true, either all expressions for an output are completely covered or the uncovered logic in the design will be redundant logic.

Algorithm Completeness and Convergence Analysis

The inventors prove that our counterexample based test generation algorithm converges and, at the point of convergence for any output, the corresponding decision tree for that output represents the complete functionality of that output.

Let us consider an RTL design whose state transition graph (Kripke structure) model is depicted by M. We will use M synonymously for the design as well its model. Let there be N inputs in M. An input pattern is a unique assignment of values to inputs of M. Input patterns can be combinational (single cycle) or sequential (across multiple cycles). An input pattern set is a set of all such input patterns in use for a design validation effort.

The input pattern set for M forms the data for the decision tree algorithm. We define decision trees as used in our context.

DEFINITION 1. A decision tree $D^z$ for an output z is a binary tree where each node corresponds to a unique splitting variable that is statistically correlated to z. A path for a decision tree is a sequence of nodes from the root node to a leaf node.

In general, decision trees need not be binary trees, but since our variables are in the Boolean domain, there are only two possible values of each (one-bit) variable. A decision tree is a data structure used in predictive modeling to map observations about a variable of interest to inferences about the variable's target value. In our case, every output of M is a variable of interest. Every output has a corresponding decision tree that makes inferences about the output's target value (true and false). These inferences are made at the leaves of the decision tree, where the branches leading from the root to the leaf represent conjunctions of splitting (correlated) variables. These inferences are also considered likely or candidate assertions for the concerned output.

DEFINITION 2. A candidate assertion $A_C$ of $D^z$ is a Boolean conjunction of propositions (variable, value pairs) along a path in $D^z$.

In the next phase of the system 100, model checking is used to compute the truth or falsehood of a candidate assertion. In case a candidate assertion is false, a counterexample or simulation trace through the design is generated, that exemplifies the violation of the assertion. We categorize the formal verification algorithms in SMV and Cadence IFV under the umbrella of model checking for this discussion.

DEFINITION 3. A true assertion $A_T$ is a candidate assertion such that $M|=A_T$.

DEFINITION 4. The support of a Boolean conjunction y, which is denoted as support(y), is the set of variables in y.

DEFINITION 5. If $M|\neq A_C$, the conjunction of variable value pairs in the counterexample is represented by $\chi A_C$ such that support($\chi A_C$) $\supset$ support ($A_C$).

Since the counterexample represents a valid simulation trace through the design that is not yet a part of the current input pattern set, it is added to the input pattern set. An incremental version of the decision tree is used in order to keep track of the coverage. The incremental decision tree maintains the ordering of variables as the decision tree from a previous iteration for all the variables until the leaf nodes. If the counterexample in the current iteration coincides with a path in the incremental decision tree, the variable(s) added by the counterexample will now be used as the splitting variable(s) at the leaf nodes of the incremental decision tree.

DEFINITION 6. An incremental decision tree $I^z$ for an output z and a previous decision tree $D^z$, is a decision tree such that the variable ordering of all variables in $D^z$ is preserved until a leaf node. Every variable v in support($\chi A_C$)-support($A_C$) becomes a splitting variable at the leaf node of $I^z$ along the path of $A_C$.

DEFINITION 7. The final decision tree $F^z$ is an incremental decision tree such that for all assertions $A_C$ of $F^z$, $M|=A_C$.

DEFINITION 8. The logic cone of an output z in M is the set of variables that affect z The logic cone is deciphered by computing the transitive closure of all variables pertaining to an output. The system 100 does a logic cone analysis for every output. The decision tree for an output is therefore restricted to the variables in its logic cone, or the relevant variables with respect to that output.

THEOREM 1. It takes finite iterations to reach $F^z$ for any given $I^z$.

Proof:

Let us run the incremental algorithm for k iterations, then the minimum number of new nodes added to $I^z$ is 2k. The minimum total number of nodes in $I^z$ after k iterations is 2k+1. Let $n \subseteq N$ be the number of variables in the logic cone of z. The maximum size for $D^z$ by construction and by definition of binary trees is $2^{n+1}-1$. Therefore, $2k+1 \leq 2^{n+1}-1$. This provides boundaries to the size of the incremental decision tree.

It may be noted that since we are restricting the decision tree for an output to focus only on the relevant variables, the maximum size of the decision tree is not exponential in the size of the entire set of inputs N, but in n. In practice, we observe that n<<N.

THEOREM 2. The final decision tree $F^z$ corresponds to the entire functionality of z Proof:

Assuming a final decision tree $F^z$ does not correspond to the entire functionality of z, then there is at least one input pattern to reach a state of z that does not correspond to a path in $F^z$, so at least one $A_C$ of $F^z$ should be such that $M|\neq A_C$. But this is false by definition of $F^z$. Therefore, the assumption is contradicted.

The above theorem makes a powerful statement about the coverage of the counterexample method. When all the assertions are true, the complete functionality of an output is captured. In practice, the learning-based data mining algorithm is able to generate compact assertions, each of which represents several satisfiable input patterns for the corresponding output. The incremental decision tree algorithm can converge quickly to cover all the logic function of corresponding output.

Coverage Analysis

In the simplest terms, what we want from a coverage effort is expose the entire legal, reachable design behavioral space to examination so that this space can be validated against a statement of desired behavior. We posit that our algorithm executed by the system 100 and iterative refinement of the decision tree achieves exactly that property: when the final decision tree for an output has been constructed, the entire reachable design space for that output is captured by the tree. The combination of input patterns and assertions generated by the tree are artifacts that represent the complete functionality of that output. The notion of coverage then is output-space directed, as opposed to traditional input space directed notions of coverage. With respect to this notion of coverage, we can achieve functional coverage closure with respect to every output in the design.

Our test generation strategy automatically computes and explores only the reachable state space since it is dynamically derived from simulation data. This is distinct from traditional functional coverage notions that are input-space directed, like expression coverage or conditional coverage. These are not constrained by reachable state space or legal states. So, frequently, we can achieve complete coverage in our methodology, but not complete expression coverage.

The system's counterexample based approach for test generation ensures a monotonic decrease of the uncovered design space with each iterative refinement. In each iteration, the generated counterexample is able to cover a new design function which has not been covered before by previous patterns. The newly activated function can be in the form of conditional expression, branch or assignment statements in the RTL design. Moreover, the existence of a final decision tree as a goal provides a deterministic metric of progress through the refinement process. This is a significant improvement over random testing, whose coverage graph can be arbitrarily shaped, often resulting in plateaus where no progress is being made. In fact, due to the frequent lack of feedback in the random test generation process, it is difficult to acquire a satisfactory functional coverage picture in this process.

Figure 19:
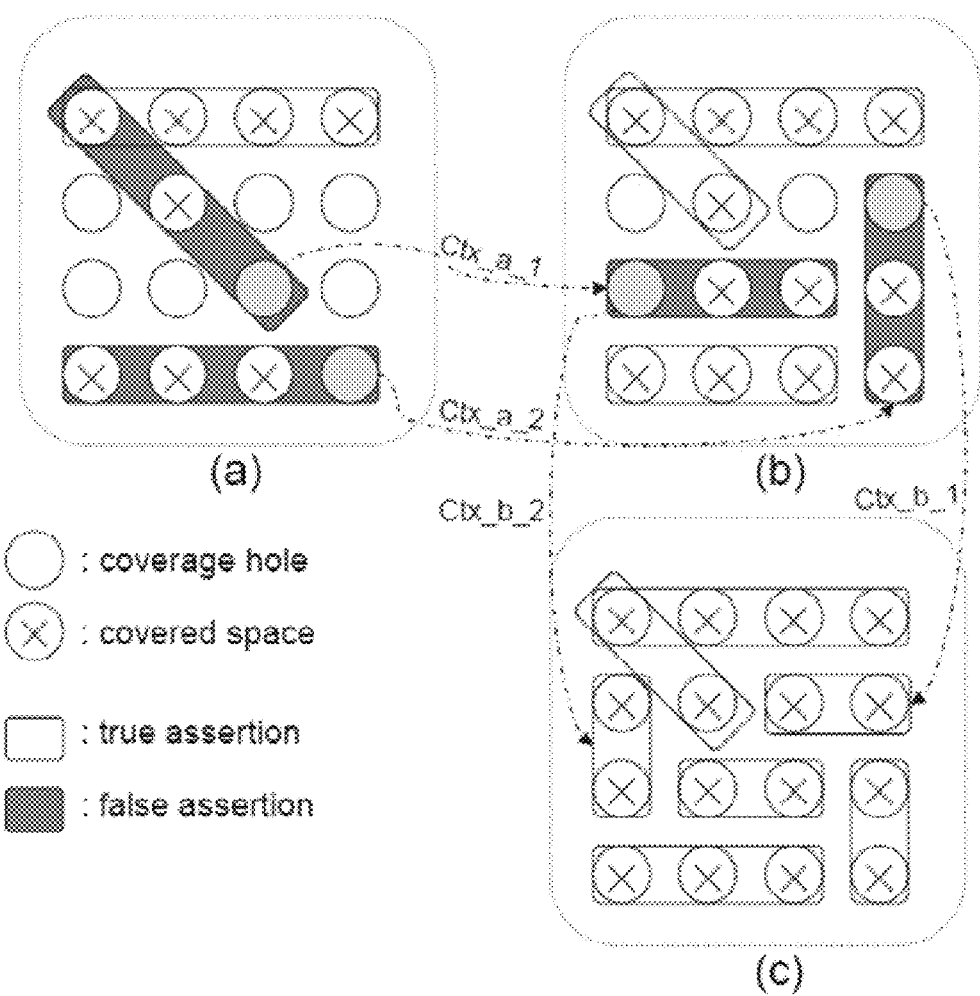
FIGS. 19A through 19C are a set of graphs displaying the coverage of input patterns in the functional design space of an output.

A pictorial example of this process is shown in FIG. 19. The state space for a single output can be visualized as a discrete 2D plot, where the functional points covered by the starting input test patterns are marked. Each generated assertion includes a set of variable-value pairs according to their statistical support in the patterns.

Every assertion is therefore shown to span a group of points in the output state space by rectangular boxes. This grouping by assertions into "regions" in the output space is similar to a Karnaugh map notation, but this includes sequential behavior as well. For the assertions that are true, the design region has been covered by the input test patterns in that iteration. For the ones that are false, there is always at least one additional design point that was uncovered by the input test pattern. This design point is exposed by a violation of the assertion. Each counterexample (Ctx) acts a bridge between an uncovered design point in (a) and a covered design point as in (b). However, the covered design point in (b) forms a part of the region covered by an assertion that generates a counterexample again. All previously true assertions do not perturb the coverage process and are retained in every phase. As a side effect, the original, general assertion is divided into multiple, more precise and subtle assertions.

Note that the test generation strategy goes from uncovered regions in one iteration to covered regions in another, until it converges at all assertions passing as in (c). This is distinct from a traditional validation flow, where all the known regions are covered first, and an advancement is attempted toward uncovered regions.

EXAMPLE

Two Port Arbiter

Figures 20, 21:
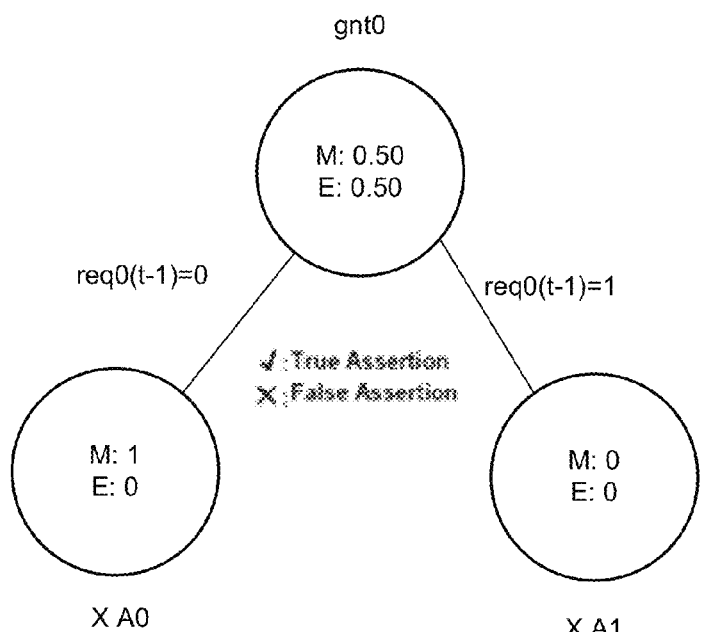
FIG. 20 is a graph displaying a 2-port arbiter, including RTL code and simulation trace.
FIG. 21 is a graph displaying an initial decision tree for FIG. 20.

In this section, the inventors demonstrate the system's incremental counterexample refinement using a 2-port arbiter. An arbiter is a hardware circuit that can resolve contention when two competing entities are requesting a resource/service. It is a very small circuit, used for explaining the system. This arbiter uses round robin logic with priority on port 0. In our example, we will unroll the circuit 1 cycle in the system 100 to capture temporal properties of the of the port 0 access signal, gnt0. The simulation data in FIG. 20 represents a directed test that a validation engineer might write. We show how the A-Miner 110 makes inferences about the design and is aided by the counterexample refinement to improve assertion and directed test quality.

The goal of the A-Miner 110 is to partition the simulation data, also known as our example set, into subsets that all display some common behavior based on statistics. The decision tree data structure starts with a root node which contains all examples and the examples are partitioned into likely behavior by the time they reach the leaf nodes. The initial structure of the decision tree is represented in FIG. 21.

A0: ¬ req0⇒ X gnt0
A1: req0⇒ X¬ gnt0

Figure 22:
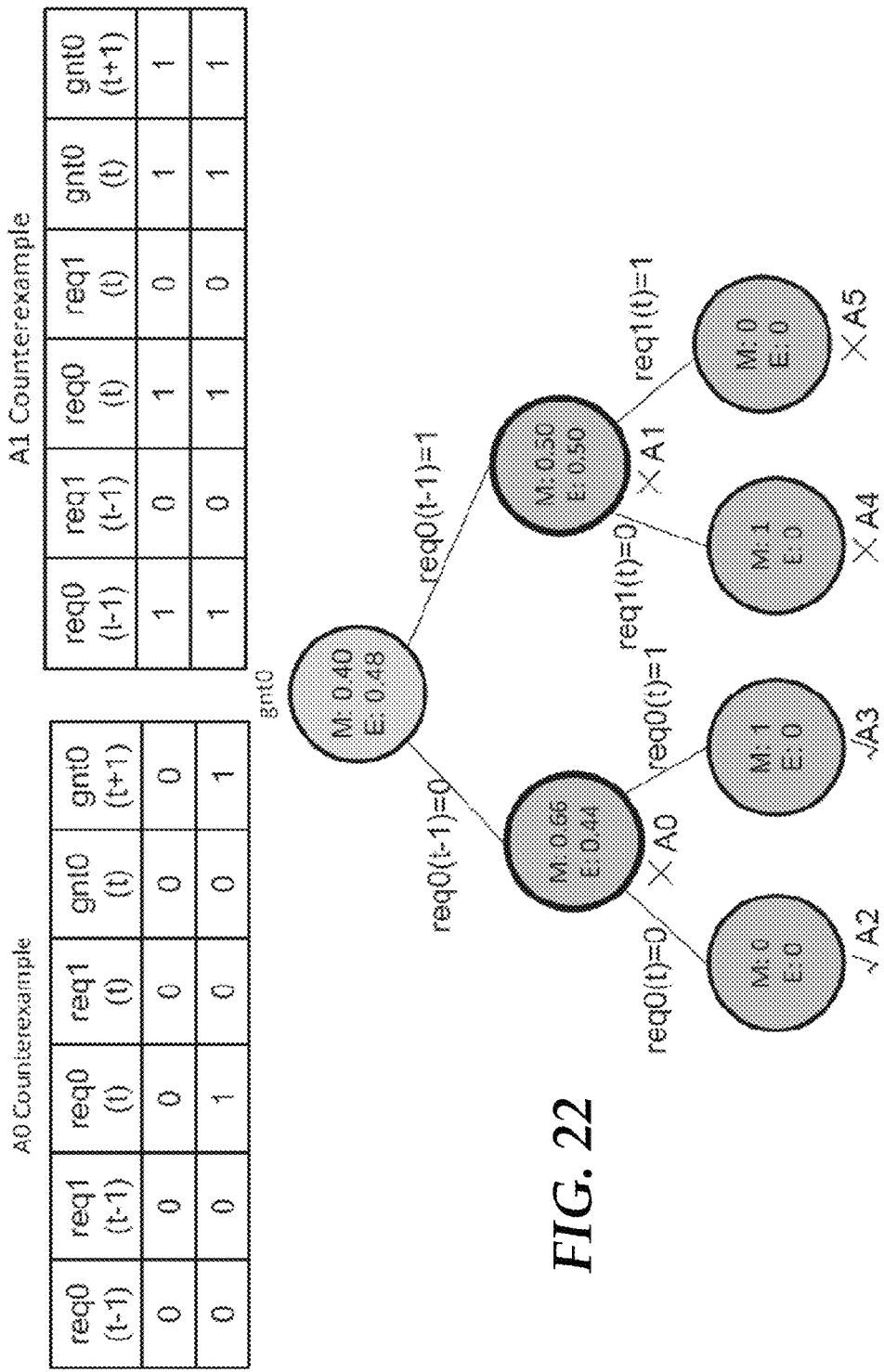
FIG. 22 is a graph displaying a refined decision tree after counterexamples are fed back through the decision tree algorithm used to generate the decision tree of FIG. 21.

The two candidate assertions generated above are proven false by formal verification. A counterexample is produced for each failed assertion containing the series of states that will contradict this assertion. The system 100 simulates these counterexamples and adds the results to the example set as show below. The decision tree continues to grow since the error is greater than 0 for each node. This means that the confidence is no longer 100% for A0 and A1. The A-Miner finds four more candidate assertions based on the new data (FIG. 22).

A2: ¬ req0 ∧ (X¬ req0)⇒ XX¬ gnt0
A3: ¬ req0 ∧ (Xreq0)⇒ XX gnt0
A4: req0¬ (X ∧ req1)⇒ XX gnt0
A5: req0 ∧ (Xreq1)⇒ XX¬ gnt0

Figure 23:
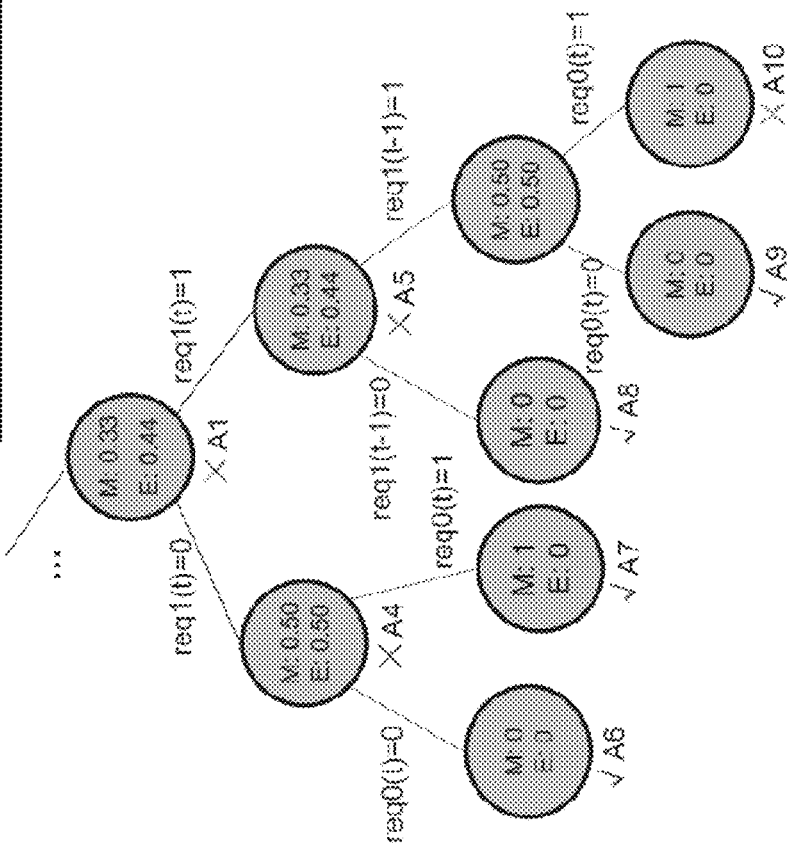
FIG. 23 is a graph displaying a further refined (and truncated) decision tree after additional counterexamples are fed back through the decision tree algorithm used to generate the decision tree of FIG. 22.

After one iteration, A2 and A3 are verified to be true. However, A4 and A5 both fail formal verification and a counterexample is produced for each. The system 100 again simulates the counterexamples and adds them to the data set. The refined tree is shown in FIG. 23.

A6: req0 ∧ (X¬ req0) ∧ (X¬ req1)⇒ XX¬ gnt0
A7: req0 ∧ (Xreq0) ∧ (X¬ req1)⇒ XX gnt0
A8: req0 ∧ (¬ req1) ∧ (Xreq1)⇒ XX⇒ gnt0
A9: req0 ∧ req1¬ (X ∧ req0) ∧ (Xreq1)¬ XX¬ gnt0
A10: req0 ∧ req1 ∧ (Xreq0) ∧ (Xreq1)⇒ XX gnt0

Figure 24:
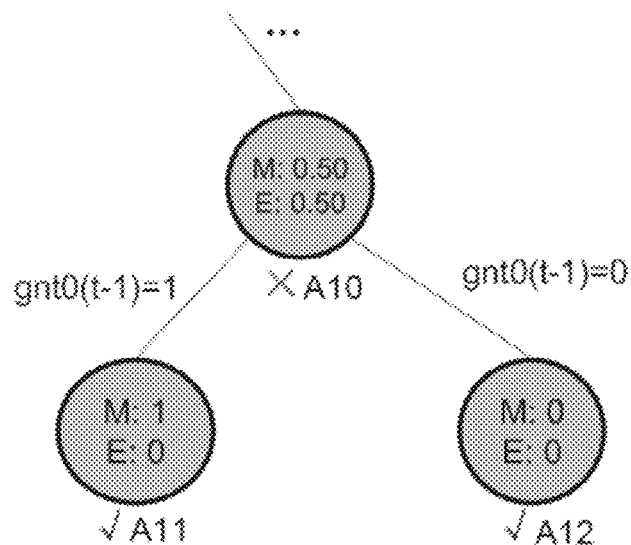
FIG. 24 is a graph displaying a further refined (and truncated) decision tree after additional counterexamples are fed back through the decision tree algorithm used to generate the decision tree of FIG. 22.

A6, A7, A8, and A9 are verified as true. However, A10 is shown to be false even though all primary inputs have been assigned. This is because there is a state outside of the window that affects the output, gnt0. At this point, the system 100 allows the A-Miner 110 to search the registers and primary outputs in the farthest back temporal state for a suitable split. In our example, we add the signal gnt0(t−1) to the search. The A-Miner 110 makes this split and produces the full tree in FIG. 24 and A11 and A12 are newly generated true assertions.

A11: req0 ∧ req1 ∧ (Xreq0) ∧ (Xreq1) ∧ gnt0⇒ XX gnt0
A12: req0 ∧ req1 ∧ (Xreq0) ∧ (Xreq1) ∧ (¬ gnt0)¬ XX(⇒ gnt0)

After the assertions are generated by incremental counterexample refinement, the counterexamples can be added to the original directed test to improve coverage of the test. The series of inputs for each counterexample are simply added to the current input stimulation in the directed test. The improvement in expression coverage of each counterexample iteration through the arbiter design is shown below in Table 6.

TABLE 6

| Counterexample Iteration | Input Space Coverage (%) | Expression Coverage (%) |
|---|---|---|
| 0 | 0 | 70 |
| 1 | 50 | 80 |
| 2 | 93.75 | 90 |
| 3 | 100 | 90 |

Experimental Results

To evaluate the quality of our method, the system 100 executes the incremental decision tree building algorithm and generates validation stimulus and assertions for several design modules. These include some simple synthetic blocks the inventors created to test various features, and some blocks from the Rigel RTL design and the ITC Benchmark Suite of designs. The simple blocks include a small combinatorial example block (cex_small), a 2-input arbiter (arbiter2), and a 4-input arbiter with more internal state (arbiter4). Specific signals are sometimes indicated in the results or figures, such as arbiter2.gnt0 for the output signal gnt0 of the abiters2 module. From the Rigel design, three key modules in the processor are chosen: Instruction Fetch (fetch), Instruction Decode (decode), and Instruction Writeback (wbstage). These modules are used for the following experiments:

1. Plot expression coverage of simple modules as test generation proceeds
2. Limit studies of the counterexample method
   (a) Zero-pattern seed, start with no test patterns and iterate
   (b) Full-coverage seed, start with patterns that provide 100% coverage according to other, well-known input test coverage metrics
3. Bug finding, inject random faults and use the previously-derived assertions as a regression suite to find the bugs
4. Compare and contrast to standard coverage metrics The runtime for this algorithm is proportional to number of system tests generated. The size of the design, number of initial samples, and maximum number of iterations all affect the number of counterexamples. A more complex design will require more counterexamples to be generated because, in the worst case, the assertion will only be refined by one variable per iteration. The number of initial samples affects how complete the decision tree is before counterexamples are added because a larger number of examples provide a better indication of the design and therefore a more accurate decision tree. As the completeness of the initial tree increases, the number of counterexamples decreases because fewer candidate assertions will need to be refined. The maximum counterexample depth determines how many iterations before the decision tree stops trying to refine an assertion. As the counterexample depth decreases, the runtime decreases as does the accuracy of the decision tree.

Experimental results show the average time per formal verification of an assertion to be 1.5 seconds. If a counterexample is produced, the time to produce that counterexample is an additional 1.5 seconds. Most tests completed within 24 hours on an Intel Core 2 Quad Q6600 with 4 GB of memory. Memory usage is proportional to the number of examples, which increases as the number of counterexamples increases. All tests used well below the 4 GB of the machine.

The implementation for this algorithm is a very naïve approach and there are many potential performance optimizations. Every time a candidate assertion is produced, that assertion is formally verified. This means that the formal verifier 114 compiles the full design every time a candidate assertion is produced. An improved approach would collect all candidate assertions and formally verify all assertions at once, drastically decreasing the time spent during formal verification. Counterexamples are also produced at the same time that an assertion is run through formal verification. Combining the counterexamples into one large test bench could drastically cut down on simulation time as well. In addition, only the current node in the decision tree and its descendants can benefit from a counterexample. Using the batched approach, all nodes with failing assertions would benefit from all counterexamples produced, rather than just their own counterexample. Given these enhancements, it would be very reasonable to expect at least a 100% speed increase.

Coverage Increase

Figure 25:
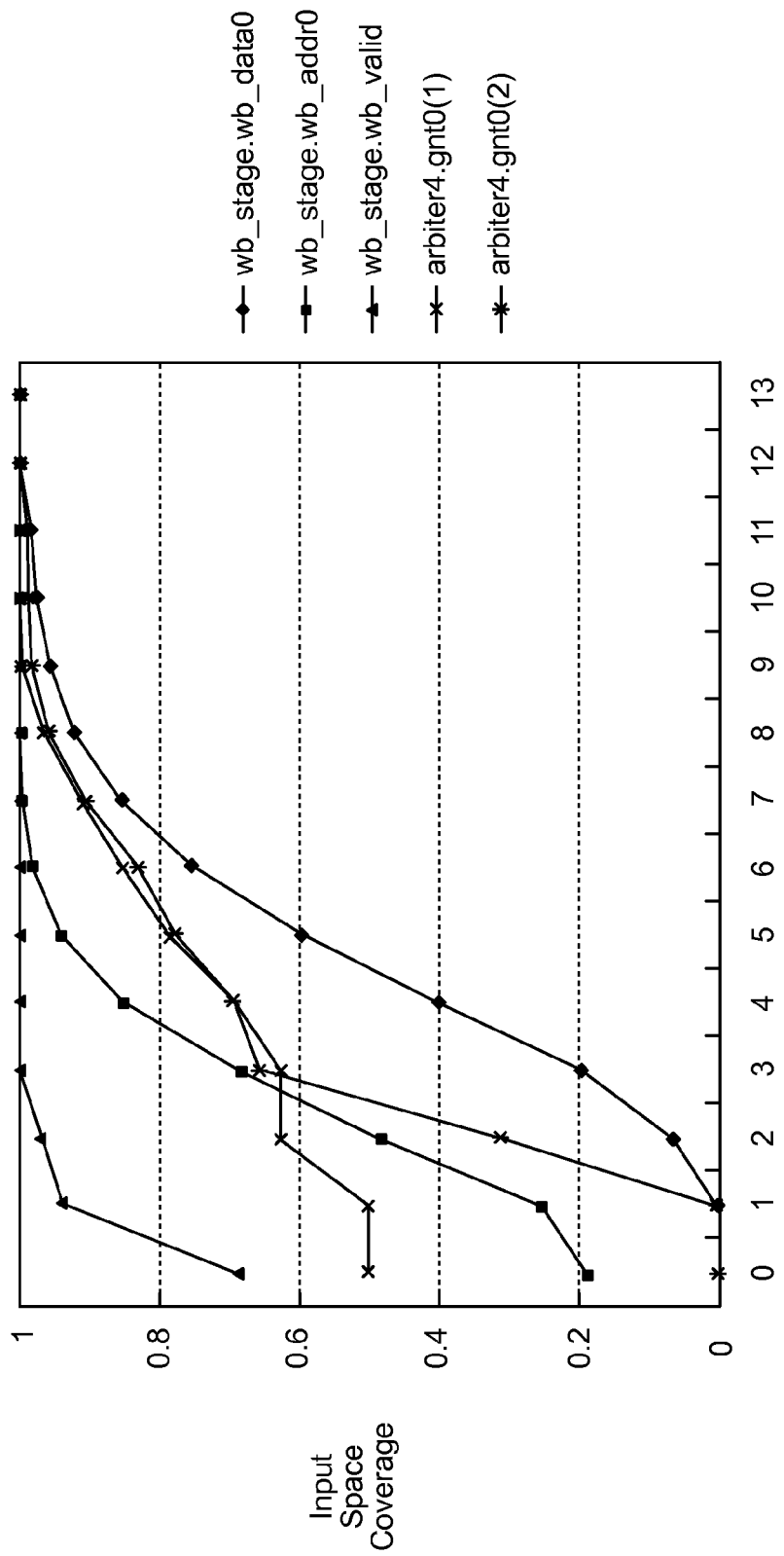
FIG. 25 is a graph displaying design state space coverage according to the number of counterexample iterations.

The first experiment demonstrates the increase in expression coverage as the counterexample algorithm progresses, showing a monotonic increase in coverage. We have summarized these results in FIG. 25 and Table 7, expression coverage increase by iteration. Expression coverage was chosen as a representative example of an industry standard metric, though as explained earlier, this metric is often unable to achieve 100% coverage on its own. Redundant statements, unreachable states, and other RTL characteristics often limit expression coverage effectiveness. A steady increase in such coverage is however an indicator of progress in the quality of the assertions and tests created by the counterexample decision tree algorithm.

TABLE 7

| Iterations | cex_small | arbiter2 | arbiter4 |
|---|---|---|---|
| 0 | 66.67% | 70% | 39% |
| 1 | 83.33% | 80% | 82% |
| 2 | 83.33% | 90% | 87% |
| 3 | 83.33% | 90% | 88% |

This experiment was performed on several typical circuit designs. The first step of the test is to simulate the original test suite. The original test suite can be in the form of a directed test or a completely random input stimulus test. Any spurious assertions are refined using counterexamples until the A-Miner has generated a true assertion or until the counterexample exceeds the length of the unrolled circuit. The system 100 can calculate the input space covered by an assertion as $1/(2^{depth\ of\ node})$. The system 100 accumulates the coverage of all system invariants to determine the input space coverage of the set of assertions. This experiment can be split into several groups.

Combinational, directed test: cex_small
Combinational, random stimulus test: wb_stage
Sequential, directed test: arbiter2, arbiter4
Sequential, random stimulus test: fetch_stage The coverage of the true assertions is evaluated by considering the percentage of the truth table that is covered by that assertion. We consider the possible input space as $2^{(number\ of\ inputs\ *\ length\ of\ unrolling)}$. We can consider the inputs specified in the assertion as concrete inputs and the rest as don't care inputs. This means that the number of input inputs) combinations covered by an assertions is equal to $2^{(number\ of\ don't\ care\ inputs)}$. In the decision tree, the number of concrete inputs in an assertion is equal to the depth of the node containing it. Based on this information, note that the input space covered by a potential assertion is cut in half every time the depth increases. This shows that the input space covered is $1/(2^{depth})$.

The results show a consistent increase in the input space covered by the assertions in each iteration. For the wb_stage and cex_small modules, note that incremental refinement converges to 100% input space covered. Also note that since the cex_small module is a simple design and the wb_stage module is a complex design, there is a direct correlation between the complexity of the module and the number of counterexample iterations required to converge.

We also notice that there is an exponential increase in the input space covered in the early iterations but only a logarithmic increase in input space covered in the later iterations. This shows that even if incremental refinement is only applied up to a certain depth, there will still be a relatively large coverage gain.

Zero Initial Patterns

The second experiment is a limit study showing that the counterexample algorithm works even when no directed tests exist. The lack of any patterns would begin the procedure with a simple assertion of the form "output always 0," for example, which the formal verification would show false and provide a counterexample, which would be the first functional pattern. Table 8 shows the increase in coverage for each tested design as the algorithm progresses. Even with no initial test patterns, the counterexample method is able to create a test suite that achieves good coverage with few iterations. This indicates that counterexamples may be a useful methodology to jump start a module design environment by creating many tests that can then be run on the testbench model checkers.

TABLE 8

| Iterations | 0 | 1 | 2 | 5 | 12 | 15 | 17 |
|---|---|---|---|---|---|---|---|
| arbiter2.gnt0 | 0% | 50 | 75 | 100 | 100 | 100 | 100 |
| arbiter4.gnt0 | 0% | 0 | 31.25 | 69.53 | 97.29 | 99.97 | 100 |
| fetchstage.valid | 0% | 0 | 25 | 100 | 100 | 100 | 100 |

Complete Coverage Initial Patterns

The third experiment explores test development on a module that already has full coverage by at least some of the common coverage metrics. The goal is to see if the disclosed system tests can find any of the uncovered state in the design by finding counterexamples. If a block already has full coverage on some metrics, and very high coverage on others, it is often difficult to get to higher coverage or to know if higher coverage is even possible. The inventors evaluated such a condition and were able to derive counterexample tests that did indeed improve expression coverage that was already quite high. Table 9 shows that a block with 100% line and branch coverage, and high condition coverage, achieved higher condition coverage after system test generation.

TABLE 9

| Test | line | branch | conditional |
|---|---|---|---|
| 50 Random Cycles | 100 | 100 | 93.02 |
| 50 Random Cycles + Use Disclosed System | 100 | 100 | 95.35 |

Fault Detection by Assertions

The fourth experiment is an example of using the provided assertions in a regression testing environment by injecting and finding bugs in a design that has previously had assertions built on the correct version. We implement a systematic mutation-based method to test the assertions' ability to detect bugs. The internal design signal is selected to mutate and all generated assertions are then formally checked on the mutated design model. The failed assertions are considered able to cover the corresponding bug on the mutated design. Since we do not have actual block-level testbench code with monitors and checkers, we have used assertions as the regression vehicle in this experiment, but since the generated test vector suite also has very high coverage it would also be an effective regression suite.

Table 10 shows the fault results for several randomly chosen signals in the Rigel RTL modules. For a randomly chosen signal in a design, Table 10 shows the number of assertions that detected the fault. In each case, the assertion suite is able to detect the faults.

TABLE 10

| Signal | stuck at 0 | stuck at 1 |
|---|---|---|
| stall_in | 269 | 94 |
| branch_pc | 35 | 35 |
| branch_mispredict | 8 | 66 |
| icache_rdvl_i | 1 | 2 |

Comparison to Standard Coverages

In the second experiment, we show the output of several standard coverage analyses comparing standard directed and random tests with tests generated by the counterexample algorithm. Final coverage values for both Rigel designs and ITC Benchmark designs are included, showing the coverage achieved by the various methods.

TABLE 11

| Module | Number of Cycles | Random | | | | | Disclosed System | | | | |
|---|---|---|---|---|---|---|---|---|---|---|---|
| | | line | cord | toggle | fsm | branch | line | cond | toggle | fsm | branch |
| b01 | 85 | 98.42 | 84.38 | 87.5 | 71.43 | 88.89 | 100 | 93.75 | 94.44 | 76.19 | 94.44 |
| b02 | 50 | 100 | X | 92.86 | 66.67 | 91.67 | 100 | X | 92.86 | 66.67 | 91.67 |
| b09 | 28000 | 100 | 100 | 96.77 | 57.14 | 90 | 100 | 100 | 96.77 | 57.14 | 90 |
| b12 | 12000 | 39.42 | 40.7 | 58.59 | 10.47 | 30.67 | 40.88 | 40.7 | 58.59 | 10.47 | 33.33 |
| b17 | 23000 | 40.23 | 17.19 | 21.85 | 29.86 | 34.64 | 40.23 | 17.19 | 21.85 | 29.86 | 34.64 |
| b18 | 10000 | 33.81 | 10.53 | 16.17 | 25.69 | 21.61 | 33.81 | 10.53 | 16.17 | 25.69 | 21.61 |

Tables 10 and 11 show comparisons to the system-generated test method and both directed and random test pattern methods, applied to different designs. The Cycles column of each table lists the number of simulation cycles run to achieve the given test coverage for the Directed and Random examples, and the number of final test pattern cycles created for the Counterexamples section. From these tables, note that some of the coverage metrics remain low even after 1.5M cycles. In all cases, the final coverage results for tests created by the counterexample method are very high.

The disclosed system and methods start from uncovered design space and covers it systematically. With each iteration, a new uncovered region is converted to a covered region. This is different from covering all known state space and inching forwards toward the uncovered space.

Although the system 100 achieves coverage closure within an implementation, this does not imply adherence to a higher level specification or design intent. The inventors believe that the enhanced test suite output from the system 100 can be applied in a validation environment that includes traditional monitors and checkers. We also believe that together, the system-generated assertions and test vectors have significant value to a design validation effort. A further advantage is the construction of a completed Final Decision Tree. The existence of this structure itself implies a fully explored and validated design.

Motivation for a Coverage Guided Approach

While the decision tree supervised learning algorithms produces excellent results and provides an excellent jumping-off point for the A-Miner in the system 100, this data mining algorithm still has some disadvantages.

In addition to the lack of assertion quality awareness, the decision tree has other shortcomings. Due to its faithfulness to a (binary) tree structure, it explores every value of each splitting variable. An assertion generated at a leaf node will necessarily have all the splitting variables of the previous levels of the tree. This leads to assertions that are over-constrained, or contain too many propositions (variable, value pairs) in the antecedent. Intermittent poor splitting choices during tree construction can result in irrelevant variables being added in the assertions as well.

For instance, a decision tree would create the assertion (request ∧ we ∧ rd ∧ branch) ⇒ (gnt), where the dependencies on the write enable and read signals are coincidental, but not causal. The desired assertion would be (request) ⇒ (gnt). The disclosed system 100 produces assertions using Linear Temporal Logic. The proposition on the left-hand side of the implication operator is the antecedent and the right-hand side is the consequent. Over-constraining restricts behavior and reduces the input space behavioral coverage of assertions. It also decreases the readability of the assertions. Since individual decision tree assertions have low input space coverage, a large number of assertions is required to cover the design behavior. An increase in the number of assertions is an undesirable side effect, since it implies overhead, whether in pre-silicon runtimes or in post-silicon cost.

A subjective ranking distribution by the designers of the Rigel processor for decision tree generated assertions is shown in FIG. 5. Rank 1 represents a trivial assertion that would not be used in verification of the design. Rank 2 represents a somewhat interesting assertion that may be used for verification. Rank 3 represents an assertion that captures subtle design intent and would be likely to be used in verification. Assertions ranked at 4 are complex assertions which were too difficult for a human to judge.

In FIG. 5, a designer ranked assertions from 1 to 3 with 1 being the worst and 3 being the best. The designers ranked many assertions at 2 instead of 3, due to the over-constraining and lack of succinctness. The result is that there is a very small percentage of rank 3 assertions created by the decision tree algorithm. Our solution to this problem was the development of a coverage guided mining algorithm to replace the decision tree based algorithm.

Coverage Guided Mining

The coverage guided mining algorithm is intended to increase the number of rank 3 assertions and decrease the number of rank 2 assertions produced by system 100. This coverage guided association miner replaces the decision tree in the A-miner phase of the decision tree algorithm. It uses a combination of association rule learning, greedy set covering and formal verification. In each iteration of the coverage guided mining algorithm, the association rule learning finds each assertion that has higher coverage than a specified minimum coverage. In successive iterations, the minimum coverage for each assertion is lowered. This guarantees that the highest coverage assertions are added to the candidate assertion set in a greedy manner at each iteration. In addition, a formal verifier is used to verify that candidate assertions added to the solution set are true.

Algorithms based on association rule learning are typically not scalable due to their nature of finding all relations between all variables exhaustively. However, in our algorithm, we constrain the solution space of the association learning by considering only those candidates that fulfill a coverage criterion. We also require that the candidates should be true as attested by formal verification. We also use a heuristic of having minimal propositions in an antecedent for our greedy selection of high-coverage candidate assertions. These criteria sidestep the exhaustive nature of the association learning and result in an efficient, scalable approach.

The coverage guided approach produces succinct assertions, with higher expressiveness per assertion. This upgrades the value added by an assertion. Since the value added by an assertion can be quantitatively expressed as input space coverage, this algorithm iteratively refines the set of assertions until it maximizes the coverage achieved by them. The coverage guided mining algorithm, therefore, converges to a set of assertions that are few in number, but high in coverage. A graphical representation of these two methods is shown in FIG. 26.

Figure 26:
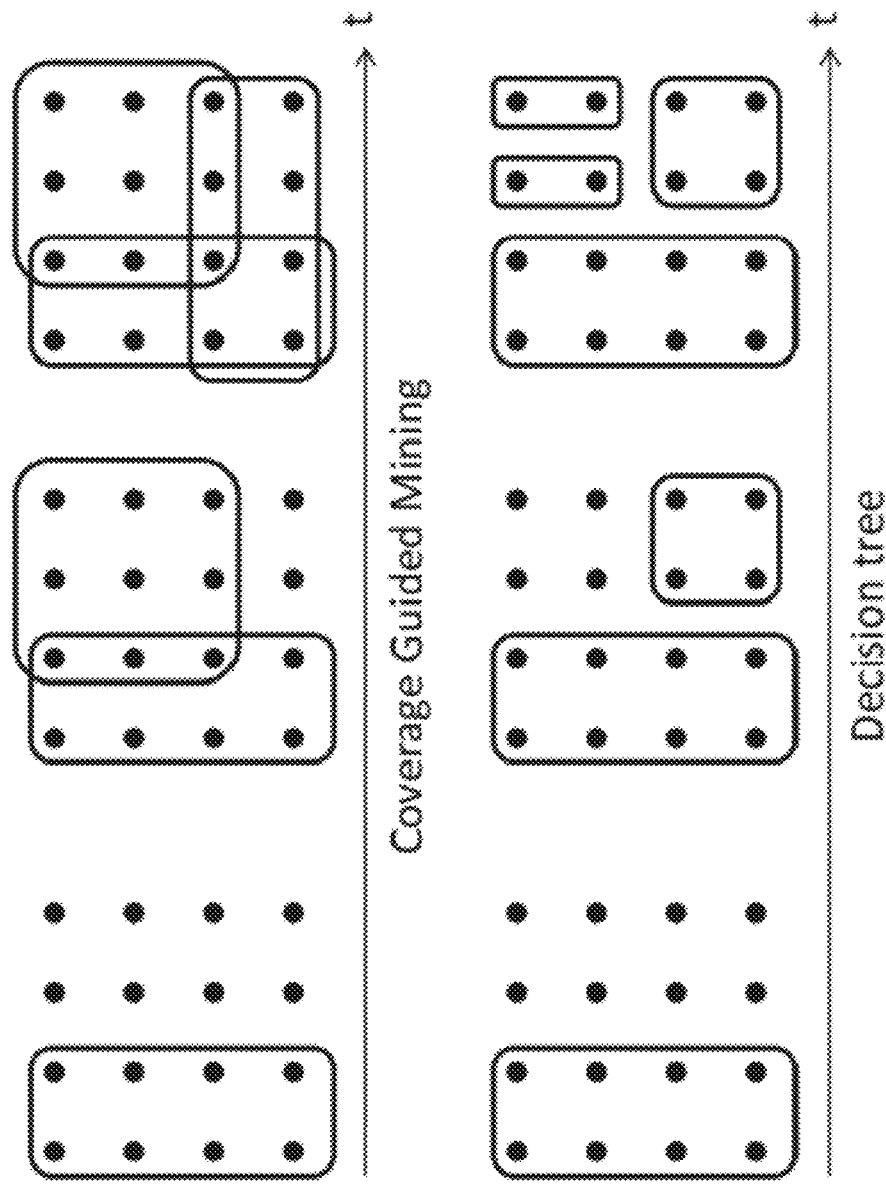
FIG. 26 is a graph of a comparison between assertions in decision tree and coverage guided mining over time for a design output, where the dots represent behavior pints in the design.

FIG. 26 is a graph of a comparison between assertions in decision tree and coverage guided mining over time for a design output, where the dots represent behavior pints in the design. Decision tree generated assertions are unaware of behavior coverage and do not optimize the design points covered. Coverage guided mining is coverage conscious when generating assertions and greedily picks the highest coverage ones.

Experimental results are shown on the OpenSparc T2, OR1200, SpaceWire, ITC benchmarks, and Rigel processor RTL modules. The coverage guided association mining performs competitively against the decision tree method in terms of overall input space coverage and far better than decision trees with respect to input space coverage per assertion, number of propositions per assertion and subjective designer rankings.

The Coverage Guided Mining Algorithm

Association rule mining is a data mining method that attempts to generate all possible correlations between items. Though this algorithm has an exponential complexity in the worst case, high efficiency is achieved by applying constraints and using pruning techniques.

The set covering problem refers to a case where there are many sets that each cover several elements and one wishes to find the minimal number of sets that cover all possible elements. The complexity of finding the optimally minimal set cover is NP-Complete. However, there are many approximation algorithms which can find a near-optimal solution efficiently. The greedy set covering algorithm works by choosing the set that covers the largest number of uncovered elements until all elements have been covered.

Gain is a data mining concept that refers to the value of adding some rule to the solution set of rules. In data mining, we only want to add a rule to our solution set if its gain is higher than any other potential rules. This concept fits well with our concept of input space coverage since we can define a notion of coverage gain. The coverage gain of a rule (assertion) refers to the change in total coverage of a set given that the rule is added to that set. For example, if a set of assertions has a total input space coverage of 75% and an assertion with a coverage gain of 12.5% is added, the new total coverage of that set will be 82.5%.

Typically, an association mining algorithm will try to exhaustively produce all possible rules relating all input variables to all output variables. To restrict the number of rules, we apply several constraints. Our first constraint, as in [1], is that only rules with 100% confidence can be considered as candidate assertions for association rule mining. We now include coverage feedback as a constraint. We impose a minimum coverage gain to drastically limit the number of candidate assertions. We then gradually relax this constraint until we have reached a desired coverage value. The greedy set covering algorithm will always choose the highest coverage assertions in each iteration.

As defined previously, input space (or truth table) coverage is a metric which has been adopted for the purpose of evaluating a set of assertions in relation to some output. Because no alternative metric exists for evaluating the quality of an assertion, we use this definition for the coverage guided mining algorithm. It should be noted that if coverage is mentioned, it is assumed that it is input space coverage.

The system 100 executes this algorithm to generate assertions for a specified output in a design, z. The assertions will be in the format where a set of propositions describing input variables and their respectively assigned values imply that the output, z, will be a certain value.

$A_s$ is defined as the solution set of assertions. The expected total input space coverage of $A_s$ is defined as $c(A_s)$. We define $g(A_s, A'_s)$ as the input space coverage gain between two sets of assertions where $A'_s=A_s+a$ and a is an assertion. We also define $g_{min}$ as the minimum coverage gain. The minimum coverage gain ensures that any assertion that is mined must raise the total coverage of $A_s$ by $g_{min}$. The total coverage of $A_s$ is defined as $c(A_s)$. We set a minimum coverage gain threshold $g_{threshold}$ and a maximize total coverage threshold $c_{threshold}$ which result in algorithm termination when reached. The goal is to maximize the expected total input space coverage $c(A_s)$ by maximizing the $g(A_s, A'_s)$ in each iteration while minimizing the total number of assertions and propositions in the antecedent of each assertion.

Figure 27:
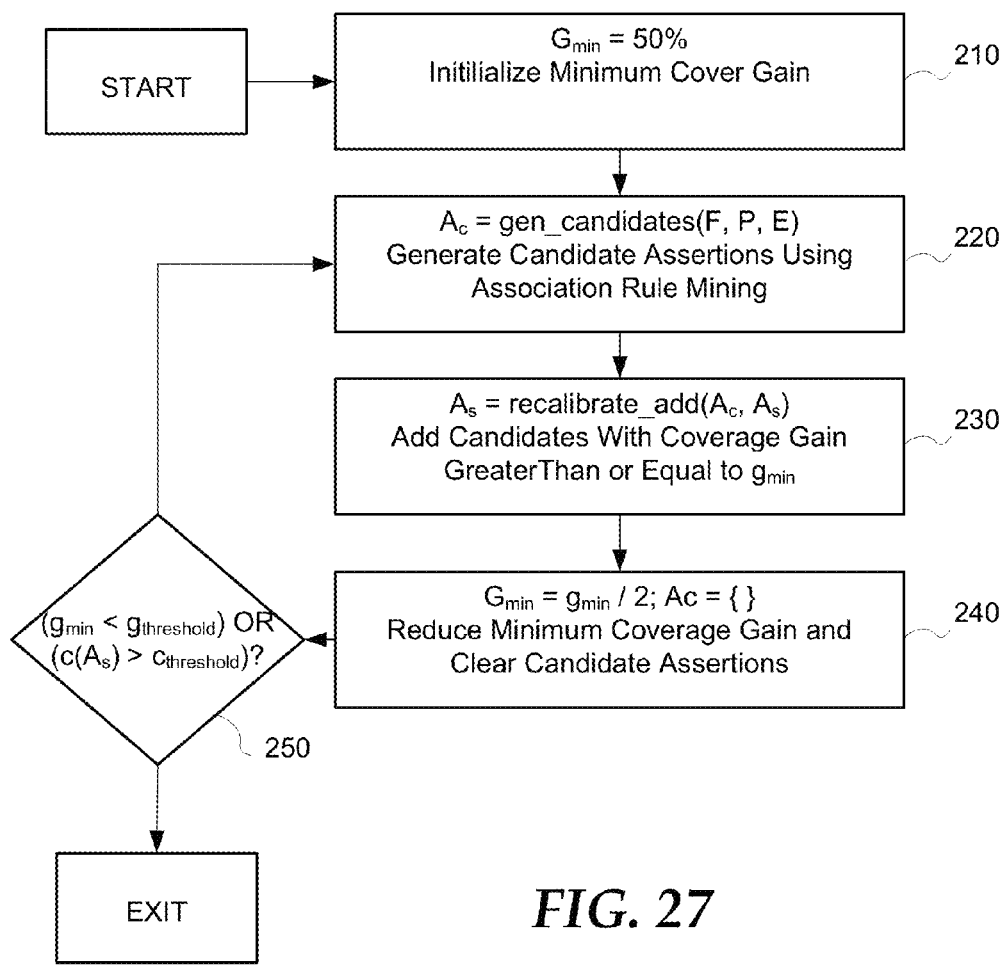
FIG. 27 is a flow chart of the coverage-guided association mining algorithm.

The flow of the algorithm is shown in FIG. 27. The algorithm is applied as it is explained to the simulation trace in FIG. 1. We set the maximum total coverage threshold to 99% and the minimum coverage gain threshold to 1%.

The algorithm starts, at block 210, by initializing the $g_{min}$=50%, $A_s$={ }, and $c(A_s)$=0%. We know that at least one proposition must be in the antecedent of the assertion, which means that the maximum coverage gain must be 50%. We do not consider assertions without any propositions in the antecedent since those assertions are trivial.

In the next step at block 220, gen_candidate, the algorithm described in Algorithm 2 of FIG. 28 is invoked. In the gen_candidates, P refers to a set of {input variable, value} pairs representing the antecedent of a potential assertion a. F refers to the set of {input variable, value} pairs not in P, since we do not want to add the same {input variable, value} pair to an antecedent twice. E refers to the simulation trace and is represented as a set of signal values at each cycle. In our example F={{a, 0}, {a, 1}, {b, 0}, {b, 1}, {c, 0}, {c, 1}}, P={ }, and E is the data in Table 12, which shows the dataset for the example function z=(a|¬c)&b).

TABLE 12

| a | b | c | z |
|---|---|---|---|
| 0 | 0 | 0 | 0 |
| 0 | 1 | 1 | 0 |
| 1 | 0 | 1 | 0 |
| 1 | 1 | 0 | 1 |

Accordingly, gen_candidates recursively adds {input variable, value} pairs to P. If all pairs in P are 100% correlated with the output pair {z, 0} or {z, 1} in all cycles of the simulation trace represented by E, a candidate assertion is generated based on that correlation and Algorithm 2 returns or starts over. Algorithm 2 also restarts when the coverage gain falls below the minimum coverage gain because adding more propositions to the antecedent can only decrease the coverage gain.

In line 1, $f_i$={a, 0}. The coverage gain of the assertion (a=0)⇒(z=X) is calculated to 50% in line 2, which is equal to $g_{min}$. X refers to a "don't care" value since the output does not affect the input space coverage. At line 3, note that for the data in every cycle, $e_j$, (a=0)⇒(z=0), which means that there is a correlation between a=0 and z=0 which indicates a candidate assertion. The candidate assertion a1: (a=0)⇒(z=0) is added to $A_C$, the set of candidate assertions, in line 4.

Now, back at line 1, $f_i$={a, 1}. Even though the coverage gain of assertion (a=1)⇒(z=X) is also 50%, neither the rule (a=1)⇒(z=0) nor (a=1)⇒(z=1) is true for each cycle of data, $e_j$. This means that the conditions in lines 3 and 5 are not satisfied. Algorithm 2 recurses at line 8 with P={{a, 1}} and F={{b, 0}, {b, 1}, {c, 0}, {c, 1}}.

Now the coverage gains of assertions (a=1∧b=0)⇒(z=X), (a=1∧b=1)⇒(z=X), (a=1∧c=0⇒(z=X)), and (a=1∧c=1)⇒(z=X) are each 25% since each has two propositions in the antecedent. The minimum coverage gain is never satisfied in lines 2, and Algorithm 2 returns or starts over.

Algorithm 2 is continued from line 1 for the remaining {input variable, value} pairs resulting in the candidates a2: (b=0)⇒(z=0) and a3: (c=1)⇒(z=0) being added to $A_c$. The assertions in $A_c$ are sorted by the number of propositions to keep the number of propositions per assertion to a minimum. In the example, the list remains unchanged since each candidate has the same number of propositions.

In the next step at block 230, recalibrate_add adds candidate assertions with coverage gain greater than or equal to $g_{min}$ to the solution set as shown in Algorithm 3 of FIG. 29. Because coverage gain, $g(A_s, A'_s)$ is relative to the solution set $A_s$, as soon as the solution set changes, the coverage gain of all assertions must be recalculated based on the new solution set. For this reason, even though all assertions in $A_c$ must have coverage gain greater than or equal to $g_{min}$ with respect to the $A_s$ before this function is called, the coverage gain of any assertion may decrease below $g_{min}$ as other assertions are added to $A_s$. Because of this, $A_c$ must be recalibrated with regards to coverage gain of each assertion before an assertion may be added to $A_s$.

In the present example, a3 is added to the solution set, $A_s$, since $A_s$ remains the same as before the function was called. After adding that candidate to the solution set, the coverage gain of next candidate, a2, is recalculated based on the new $A_s$. Since $A_s$ contains assertional with the antecedent (a=0), it should be noted that the truth table entries where a=0 and b=0 are already covered. Therefore, the assertion a2 with antecedent (b=0) can only cover the truth table entries where a=1 and b=0, resulting in decreased coverage gain of only 25%. By the same logic, the coverage gain of assertion a3 with antecedent (c=1) is also reduced to 25%. Since both candidates have coverage gain less than $g_{min}$, they are both discarded.

In the final step of the first iteration at block 240, $A_c$ is cleared and the minimum coverage gain, $g_{min}$, is reduced by half. In the example, $g_{min}$ is reduced from 50% to 25%, which is still greater than the minimum gain threshold. The total coverage of $A_s$ is 50%, which is less than the maximum total coverage threshold, $C_{threshold}$. Since neither threshold is passed, the coverage guided algorithm continues to the second iteration.

In the second iteration, gen_candidates is performed again (at block 210) with the reduced $g_{min}$. This generates the following candidate assertions which are added to $A_c$: a4: (a=1∧b=0)⇒(z=0), a5: (a=1∧b=1)⇒(z=1), a6: (a=1∧c=0)⇒(z=1), a7: (a=1∧c=1)⇒(z=0), a8: (b=0)⇒(z=0), and a9: (c=1)⇒(z=0).

These candidate assertions are added to $A_c$ and then sorted by the number of propositions per assertion with resulting order of a8, a9, a4, a5, a6, a7.

Assertion a8: (b=0)⇒(z=0) is added to $A_s$. The coverage gain of the remaining candidate assertions is recalculated, causing a4, a6, a7 and a9 to each drop to 12.5%. This leaves only the assertion a5: (a=1∧b=1)⇒(z=1) that remains at 25% which is also added to $A_s$.

It should now be noted that the expected total input space coverage of $A_s$ has reached 100%, which is above the total coverage gain threshold. This means that the algorithm can exit, producing the following assertions: a1: (a=0)⇒(z=0), a8: (b=0)⇒(z=0), and a5: (a=1∧b=1)⇒(z=1).

It should be noted that the coverage guided algorithm can be applied to temporal assertions much like in the decision tree algorithm. For temporal assertions, the circuit is unrolled a user-specified number of times. The number of times the circuit is unrolled is known as the lookback amount. A separate set of inputs is created for each clock cycle that the circuit is unrolled where each new set of inputs represents the value of that signal relative to the current time. For example, a[t] represents signal a in the current cycle and a[t−1] represents the value of a in the previous cycle. With this data transformation, the data mining algorithm can treat the newly added signals as separate from the signals in the current time and use the same algorithm as is used on combinational signals.

Integration of Formal Verification with Coverage Guided Method

In our greedy set covering approach, we only choose candidate assertions based on coverage. Because these candidate assertions are only necessarily true with respect to a simulation trace, it is possible that a spurious assertion may be added to the solution set. Additionally, adding this spurious assertion to the solution set will prevent true assertions that cover the same input space from being added to the solution set, which adversely affect overall coverage.

Consider the example presented in Section 9.2. While a5 and a8 are true, a1 is not. Even though the expected input space coverage of the solution set is 100%, the actual coverage is reduced to 75% since the a1 is untrue. We want to be able to check whether any assertions are true before ever adding them to the solution set.

The solution to this problem is to integrate the formal verifier into the algorithm to validate candidate assertion choice. We modify the recalibrate_add function to include a formal verification check as shown in Algorithm 4 of FIG. 30. After the association rule miner produces the set of candidate assertions, the formal verifier 114 is used to prune the false candidates while retaining the true assertions. This guarantees that any assertion that is added to the solution set is going to be true. If we use this modified algorithm on our example presented in the previous subsection, we produce the assertions (b=0)⇒(z=0), (a=1∧b=1)⇒(z=1), (b=1∧c=0)⇒(z=1), and (a=0∧c=1)⇒(z=0) which results in 100% input space coverage.

It should be noted that the use of formal verification may present a scalability concern. Large designs can result in a state space explosion, making verification slow or even impossible. Though formal verification may have these disadvantages, it does not mean that the coverage guided algorithm is crippled by them. To date, we have discovered only one module that was so large that it was not possible to verify (OpenSparc L2 cache). In this case, there are several options. One option is to individually verify the submodules of the limiting module. Another option is to disable formal verification of candidate assertions. The candidate assertions can then be simulated and manually checked to determine if they are valid.

Scalability

For N input variables in a given simulation trace, searching through the space of all antecedents ($3^N$) is not scalable. In the coverage guided algorithm, however, the minimum coverage gain helps guide and focus the antecedent search on important assertions. By definition of coverage gain, an assertion with k propositions in its antecedent covers at most $$\frac{1}{2^k}$$

of the whole input space. In general, the number of antecedents with k propositions is $$2k\binom{N}{k}$$

and their coverage gains are at most $$\frac{1}{2^k}.$$

Thus, if the minimum coverage gain is $$\frac{1}{2^k},$$

the maximum number of possible antecedents in the search space is $O((2N)^k)$. For a fixed k, each iteration runs in polynomial time in terms of N. In the disclosed coverage guided algorithm, the system 100 iteratively increases k by 1, decreasing the minimum coverage gain $g_{min}$, until that minimum coverage gain threshold, $g_{threshold}$, is reached. The maximum iteration of k, $k_{max}$, is defined as the iteration when $g_{threshold}$ is reached. This helps to limit the search space. The algorithm only increases the search space if necessary. This results in the overall complexity of the algorithm being $O((2N)^{k_{max}})$, which is polynomial for a fixed $g_{threshold}$. Moreover, because of the search space pruning, the actual number of antecedents searched in practice is much smaller than this theoretical bound.

Our algorithm's scalability is only restricted by formal verification. Although formal verification technology is sensitive to state space, we find that in practice, we are able to effectively verify many modules of large designs, like the OpenSparc MMU. So far, the only module that was too large to verify is the OpenSparc L2 cache. The reason for this is that the L2 cache contains many RAM elements, which are difficult for the formal verifier to model. In these infrequent cases, there are several options. One option is to individually verify the submodules of the limiting module. Another option is to disable formal verification of candidate assertions. The candidate assertions can then be simulated to determine if they are valid. The rest of the algorithm will proceed in the same manner.

Comparison Between Coverage Guided and Decision Tree

Disclosed herein is a comparison between the decision tree and coverage guided mining methods for multiple designs. The designs used for testing include fetch.stage and wb.stage from Rigel, b10, b13, and b15 from the International Test Conference Benchmark Suite, b100, b101, b102, and b103 from the OpenRisc1200 CPU, and Transmitter, Receiver, and SPW YSM from the European Space Agency SpaceWire codec. Included are the results for the OpenSparc T2, which is an open source industrial size design. The number of inputs bits, outputs and area can be seen in Table 13.

TABLE 13

| Module | Inputs | Outputs | Area (μm²) |
| --- | --- | --- | --- |
| OR1200 - b100 | 122 | 9 | 788 |
| OR1200 - b101 | 163 | 11 | 1178 |
| OR1200 - b102 | 234 | 9 | 1223 |
| OR1200 - b103 | 596 | 9 | 3324 |
| Rigel - fetch_stage | 458 | 6 | 4165 |
| Rigel - wb_stage | 963 | 3 | 269 |
| Spacewire - SPW_FSM | 46 | 7 | 342 |
| Spacewire - Receiver | 75 | 15 | 979 |
| Spacewire - Transmitter | 96 | 5 | 896 |
| ITC - b10 | 27 | 2 | 282 |
| ITC - b13 | 55 | 6 | 720 |
| ITC - b15 | 534 | 4 | 9947 |
| OpenSparc - MMU | 3393 | 16 | 66395 |

All tests were run on an Intel Core 2 Q6600 with 4 GB of RAM. Each simulation trace contains 10,000 cycles of data. The parameters are configured such that the minimum support is set to 0.1%, the minimum coverage gain threshold is 0.2%, and the coverage threshold is set to 99%.

Input Space Coverage as a Function of Iterations

Figure 31:
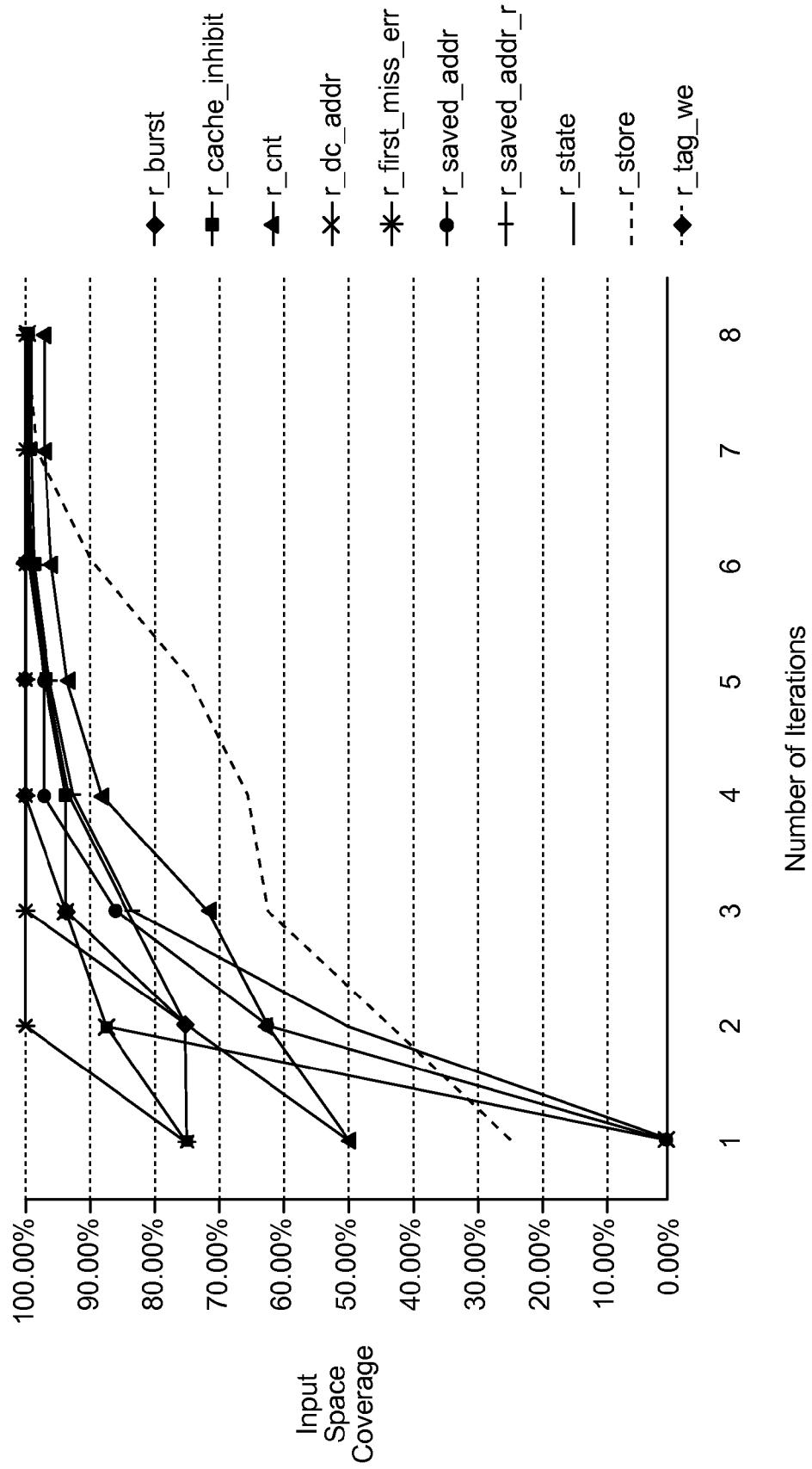
FIG. 31 is a graph displaying the number of iterations taken for each design to reach 100% input space coverage using the coverage guided mining algorithm.

In the first experiment, the number of iterations the algorithm takes to converge is disclosed. The results for this experiment are taken from the OR1200 data cache controller module. The results are shown in FIG. 31, a graph showing the number of iterations taken for each design to reach 100% input space coverage using the coverage guided mining algorithm. It is clear that there is a logarithmic increase in input space coverage at each iteration since the minimum gain is decreased in each cycle.

Runtime and Memory Requirements of Algorithm

Figure 32:
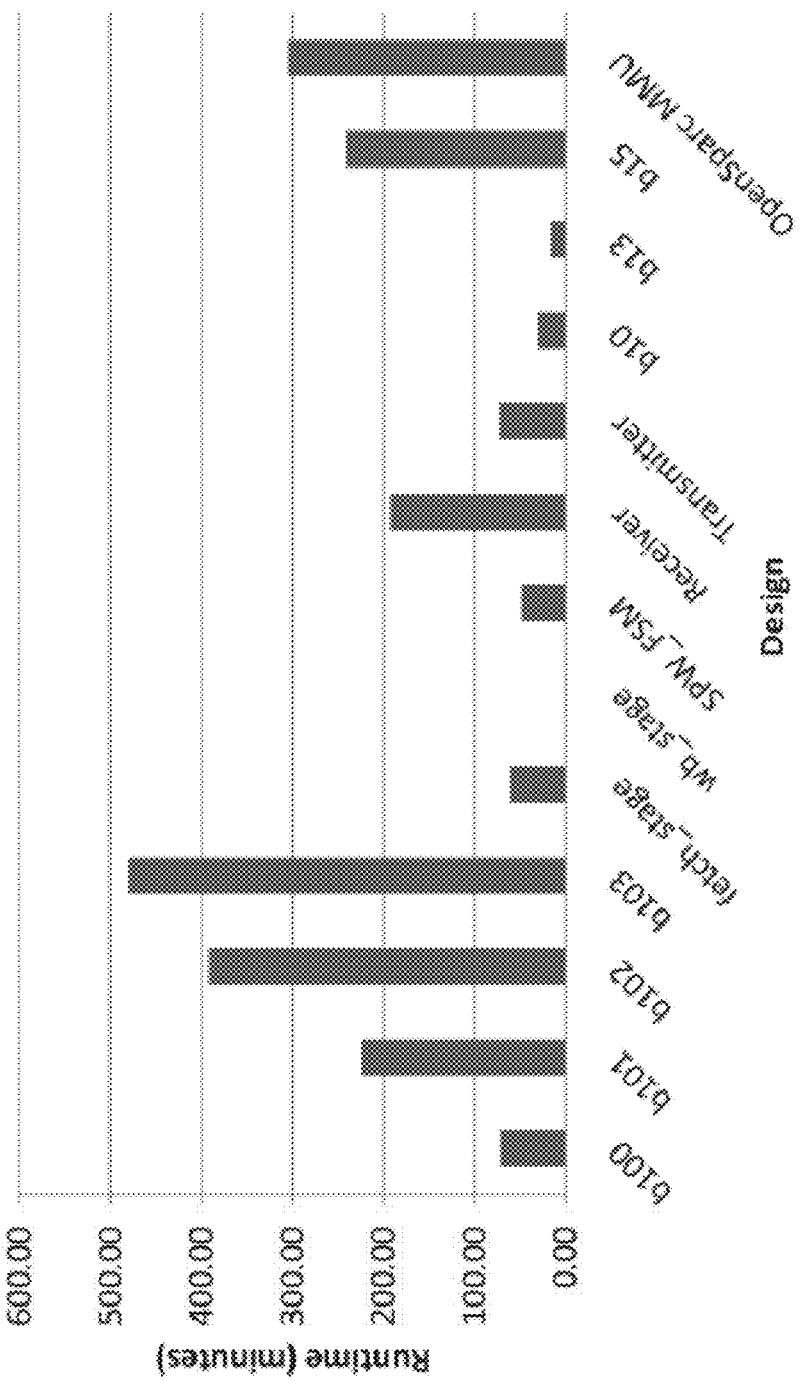
FIG. 32 is a graph displaying runtime of the coverage guided mining method, where the highly complex OpenSparc MMU module completes in a total of five hours.
Figure 33:
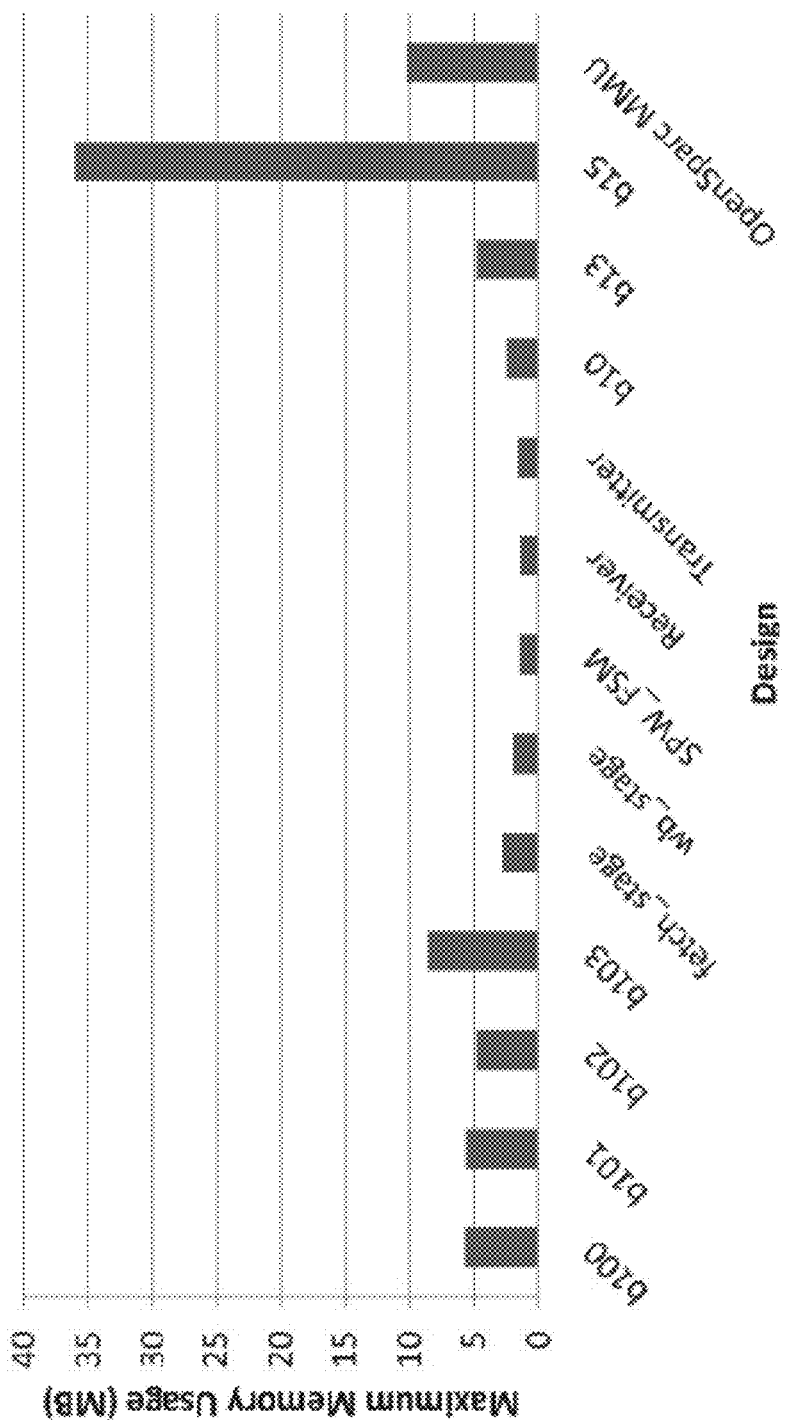
FIG. 33 is a graph displaying the maximum memory usage of the coverage guided mining method, which is negligible.

We applied the algorithm to several outputs from the OR1200 data cache controller. For runtime, the inventors recorded the time when the algorithm starts to the time that the algorithm exits as defined in FIG. 27. Formal verification is enabled in this test. To record the maximum memory usage, the inventors used the Massif tool in the Valgrind. The runtime is shown in FIG. 32 and the maximum memory usage is shown in FIG. 33.

Though the runtime of the coverage guided mining algorithm is not as fast as the decision tree (as shown in FIG. 13), the tool is still very scalable, even with formal verification enabled. If runtime is a concern, the formal verification can be disabled. This produces assertions much more quickly although there will be no feedback on the validity of the candidate assertions. Maximum memory usage is also very low. This is due to memory usage scaling with the size of the simulation trace (inputs x number of cycles). If a bigger simulation trace is used, the maximum memory usage will increase linearly with the number of cycles.

Comparison of Input Space Coverage

Figure 34:
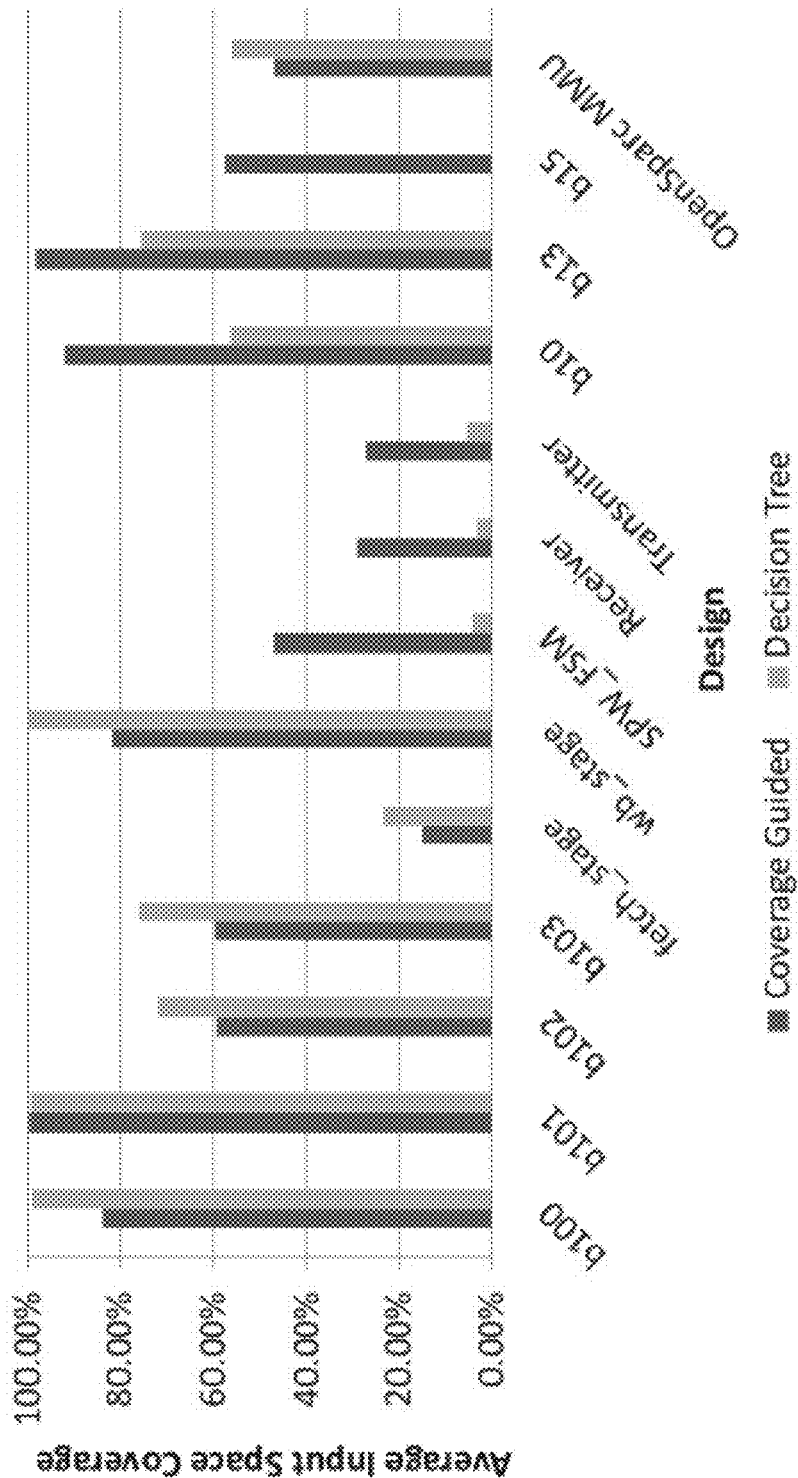
FIG. 34 is a graph displaying the input space coverage comparison between the coverage guided mining and decision tree algorithms.
Figure 35:
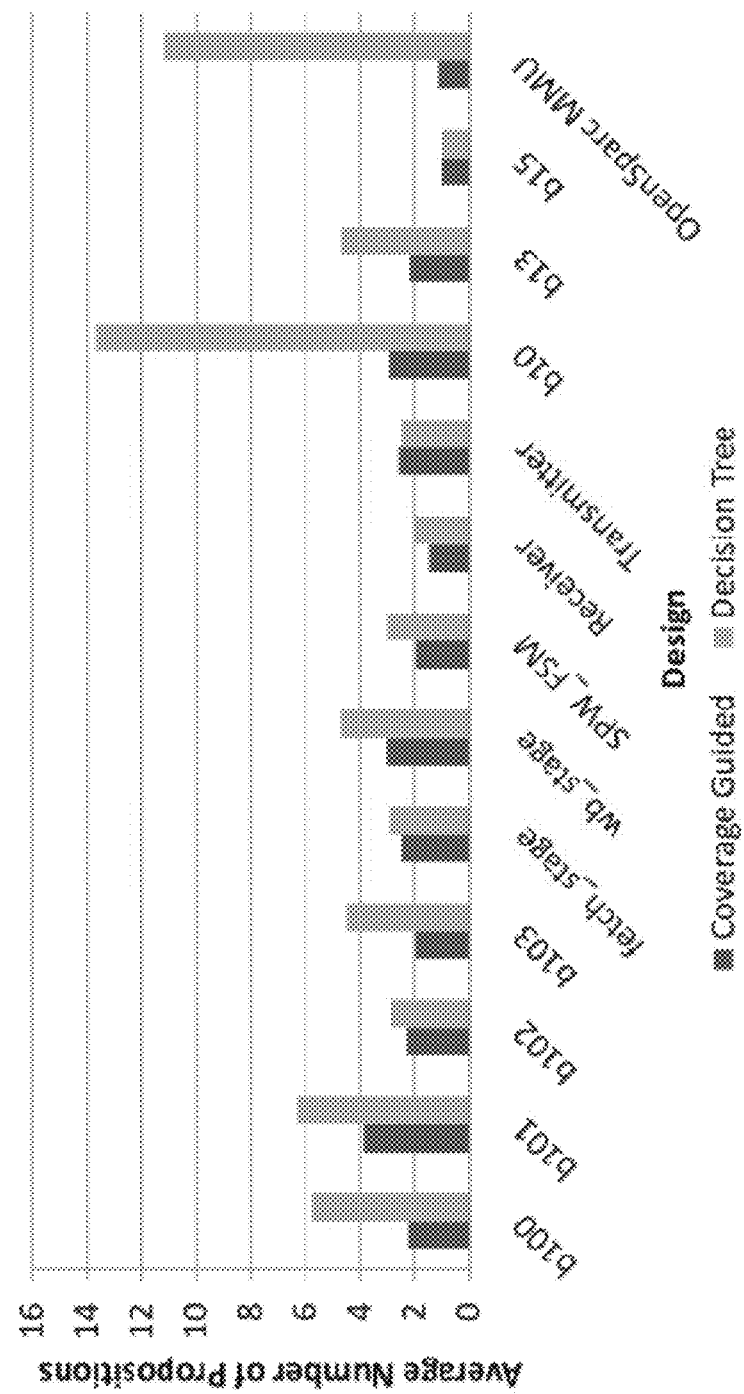
FIG. 35 is a graph displaying a comparison of the average number of propositions per assertion between each of the coverage guided and decision tree algorithms, the coverage guided mining method's assertions having fewer propositions, implying that they are concise and expressive.

The total input space coverage of the assertions generated by the coverage guided and decision tree algorithms are also compared. The input space coverage of a primary output is the sum of the input space coverage of each assertion generated with respect to that primary output. The average input space coverage is calculated as an average of the input space coverage of each primary output in the design. The results are shown in FIG. 34. In every module, the coverage guided algorithm produces an input space coverage comparable to the decision tree method. In many cases, the coverage guided algorithm outperforms the decision tree algorithm. This indicates that in those tests, the decision tree made poor splitting decisions while the coverage guided algorithm did not suffer from the same problem Comparison of Succinctness of Assertions Since a primary intent of the coverage guided mining algorithm is to improve assertion quality, the average number of propositions in the antecedent between the two algorithms is also compared. A low number of propositions in the antecedent indicates an high input space coverage and also means that the assertion is more concise and thus easier to read by a human. The results of the test are shown in FIG. 35. These results show that the coverage guided mining algorithm produces a lower average number of propositions in every module tested.

Comparison of Conciseness of Generated Assertions

Figure 36:
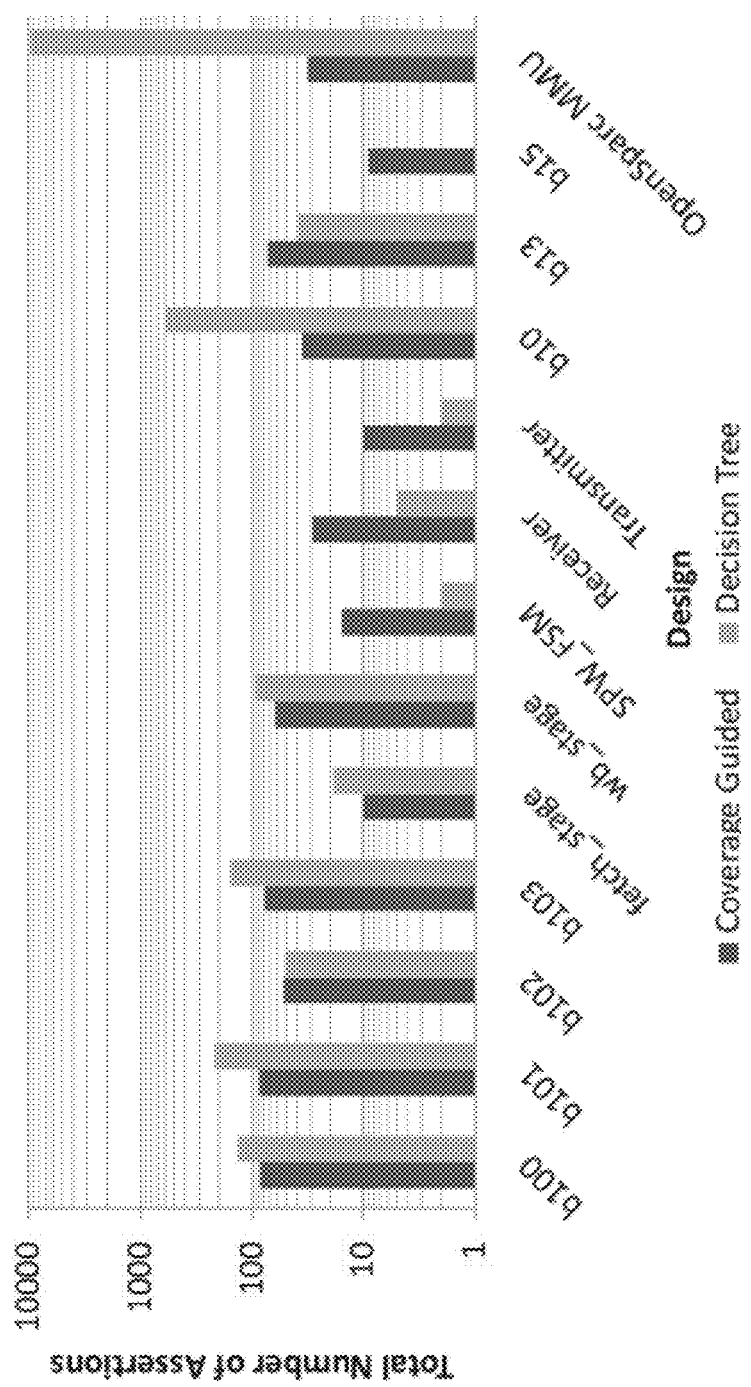
FIG. 36 is a graph of a comparison of total number of assertions generated using each of the coverage guided and decision tree algorithms, where the coverage guided mining algorithm often produces a much smaller set of assertions while retaining high input space coverage.

In this experiment, the total number of assertions generated for all primary outputs of each design is recorded for each algorithm. A lower number of assertions in the final set when the input space coverage is the same indicates that the set of assertions will occupy less time and area overhead for synthesis as well as simulation. The results are in FIG. 36. The set covering technique in the coverage guided mining algorithm outperforms the decision tree. For the b10 module in particular, the decision tree generates almost ten times more assertions than the coverage guided method even though the coverage guided method has a higher input space coverage. It should be noted that while the coverage guided method generates more assertions for the Space Wire modules (SPW_FSM, Transmitter, Receiver), it also achieves a significantly higher input space coverage.

Comparison of Info. per Unit: Average Input Space Coverage per Assertion

It is interesting to see what is the average input space coverage per assertion. This metric is based on the total input space coverage divided by the number of assertions in the set.

Figure 37:
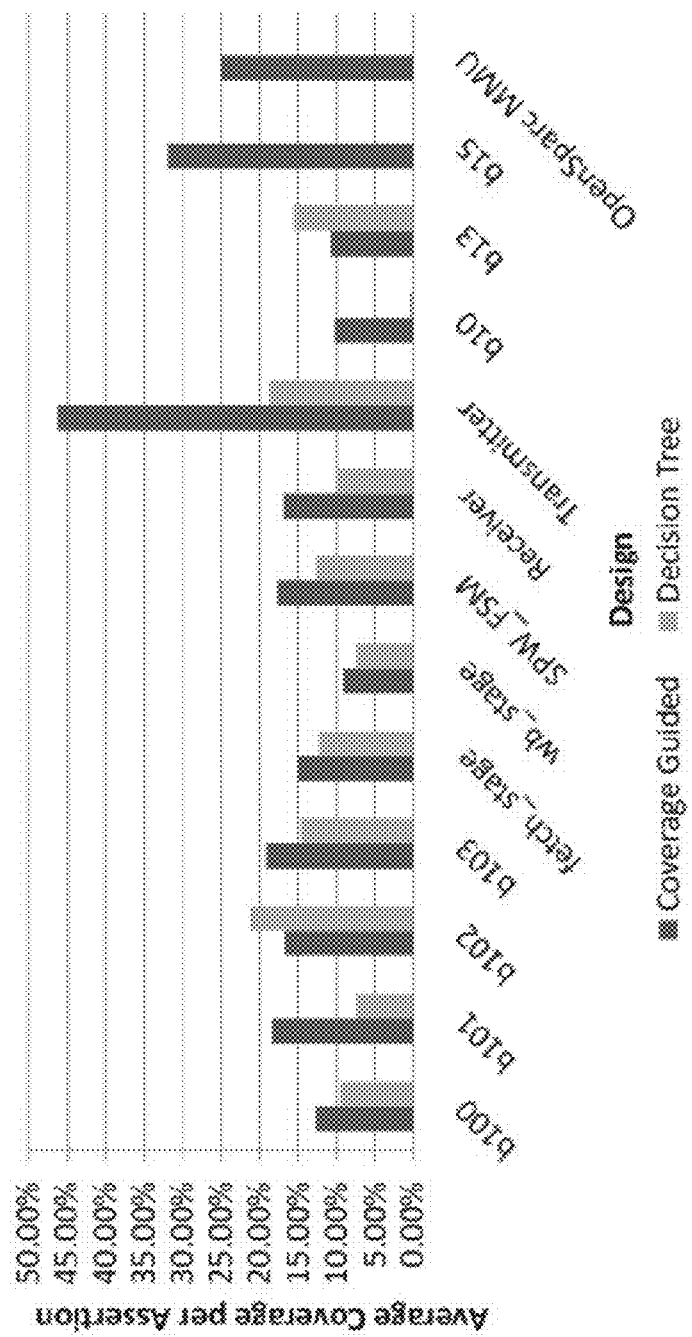
FIG. 37 is a graph of a comparison of the average input space coverage per assertion using each of the coverage guided and decision tree algorithms, where a high input space coverage shows more information per assertion, and where the coverage guided mining algorithm assertions have average coverage per assertion up to 20-30% more than the decision tree algorithm.

The results in FIG. 37 show that the coverage guided algorithm produces higher coverage assertions than the decision tree method.

Comparison of Number of Assertions Triggered in Directed Tests

In this experiment, a set of assertions for the fetch_stage and wb_stage of Rigel are produced. The system 100 then runs the directed test suite created by the designers to determine how many assertions are triggered. If an assertion is triggered, it indicates that the assertion is checking behavior that would be likely to occur in a realistic environment. The results of this test are shown in FIG. 38.

FIG. 38 is a graph of a comparison of both the coverage guided and the decision tree algorithms in terms of the percentage of assertions triggered in the Rigel directed test suite, where assertions generated by the coverage guided mining are triggered at least one, meaning that they are more likely to be triggered in a realistic environment than those generated by the decision tree algorithm.

The Final Test: Subjective Designer Rankings

For this experiment, assertions for the fetch_stage and wb_stage of Rigel are generated and then a designer to ranks a set of assertions generated by the decision tree method and a set generated by the coverage guided mining method. The designer was not informed of the difference between the two sets. The rankings were assigned from 1 (one) to 3 (three) as described below.

1. Trivial assertion that the designer would not write
2. Designer would write the assertion
3. Designer would write, captures subtle design intent FIG. 39 is a graph of a subjective ranking by a designer of the set of assertions generated by each of the coverage guided and decision tree algorithms, where all data path assertions were considered a rank 1 by this designed because the designer did not consider them valuable, and where the coverage guided mining algorithm produced a significantly higher percentage of assertions which are at rank 3, which was the original motivation for the technique.

The results in FIG. 39 show that the coverage guided algorithm produces a much higher percentage of rank 3 assertions than the decision tree algorithm. Any assertions that were good, but included more propositions in the antecedent than necessary were reduced from a rank 3 to a rank 2, which was the case for many decision tree assertions. Overall, the designer commented that he would use the set of assertions generated by the coverage guided method over the assertions generated by the decision tree method.

Figure 40:
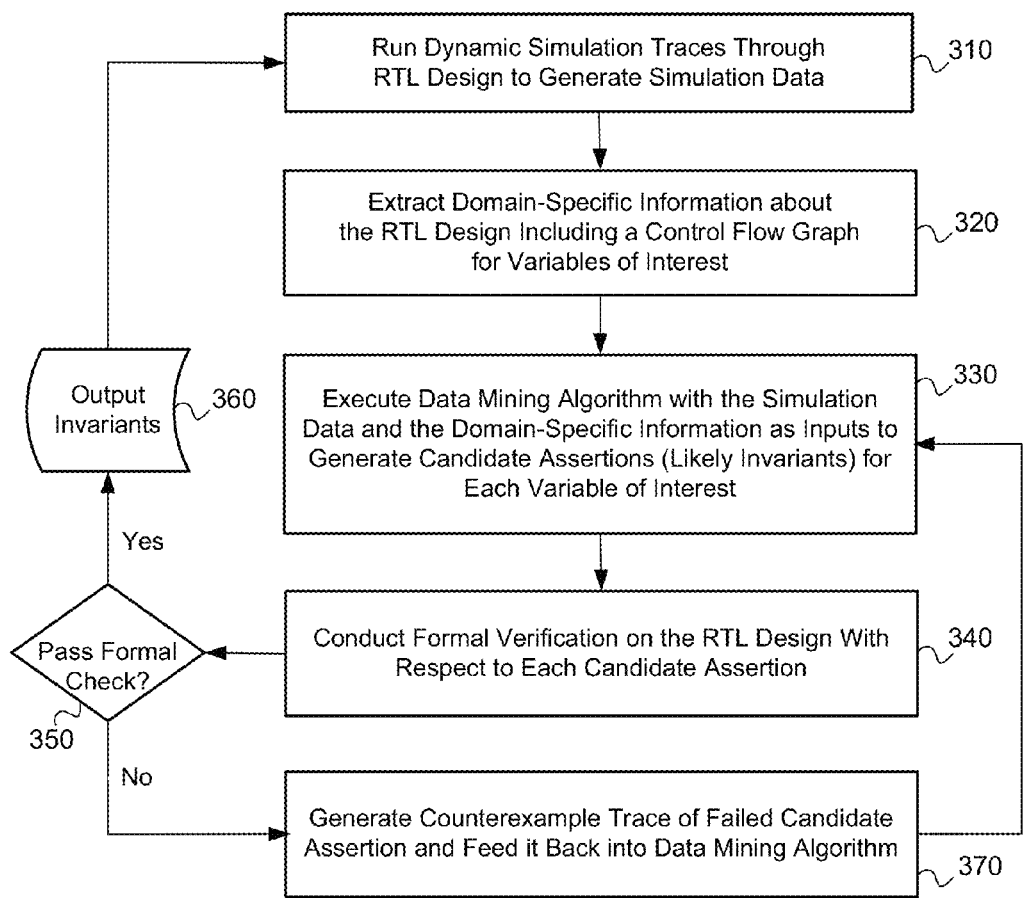
FIG. 40 is a flow chart of a method for generating assertions for verification stimulus of an integrated circuit hardware design expressed at a register transfer level (RTL).

FIG. 40 is a flow chart of a method for generating assertions for verification stimulus of an integrated circuit hardware design expressed at a register transfer level (RTL) for variables of interest. The method is executable by a computer having a processor and memory. The processor, at block 310, runs dynamic simulation traces through the RTL design to generate simulation data. At block 320, the processor executes the static analyzer 104 to extract domain-specific information about the RTL design including a control flow graph for variables of interest. At block 330, the processor executes a data mining algorithm with the simulation data and the domain-specific information as inputs, to generate a set of candidate assertions for each variable of interest through machine learning with respect to the domain-specific information, the candidate assertions being likely invariants. At block 340, the processor executes the formal verifier 114 to conduct formal verification on the RTL design with respect to each candidate assertion.

At block 350, the processor determines whether, in conducting formal verification, each assertion passes a formal check. At block 360, the formal verifier 114 outputs as invariants the candidate assertions that pass the formal check. These invariants can be used as input vectors with which the processor can run the dynamic simulation at block 310 during a next iteration of the method of FIG. 40 as the method progressively builds more complete coverage of the state space of the RTL design. At block 370, the processor generates a counterexample trace for each failed candidate assertion that violates the formal check, and feeds it back into the data mining algorithm at block 330 for consideration during the next iteration of the method of FIG. 40. Accordingly, as of the second iteration, the invariants output at block 360 contain one or more invariants based on assertions generated from counterexample traces, which improves coverage of a state space of the RTL design with at least one additional invariant.

Figure 41:
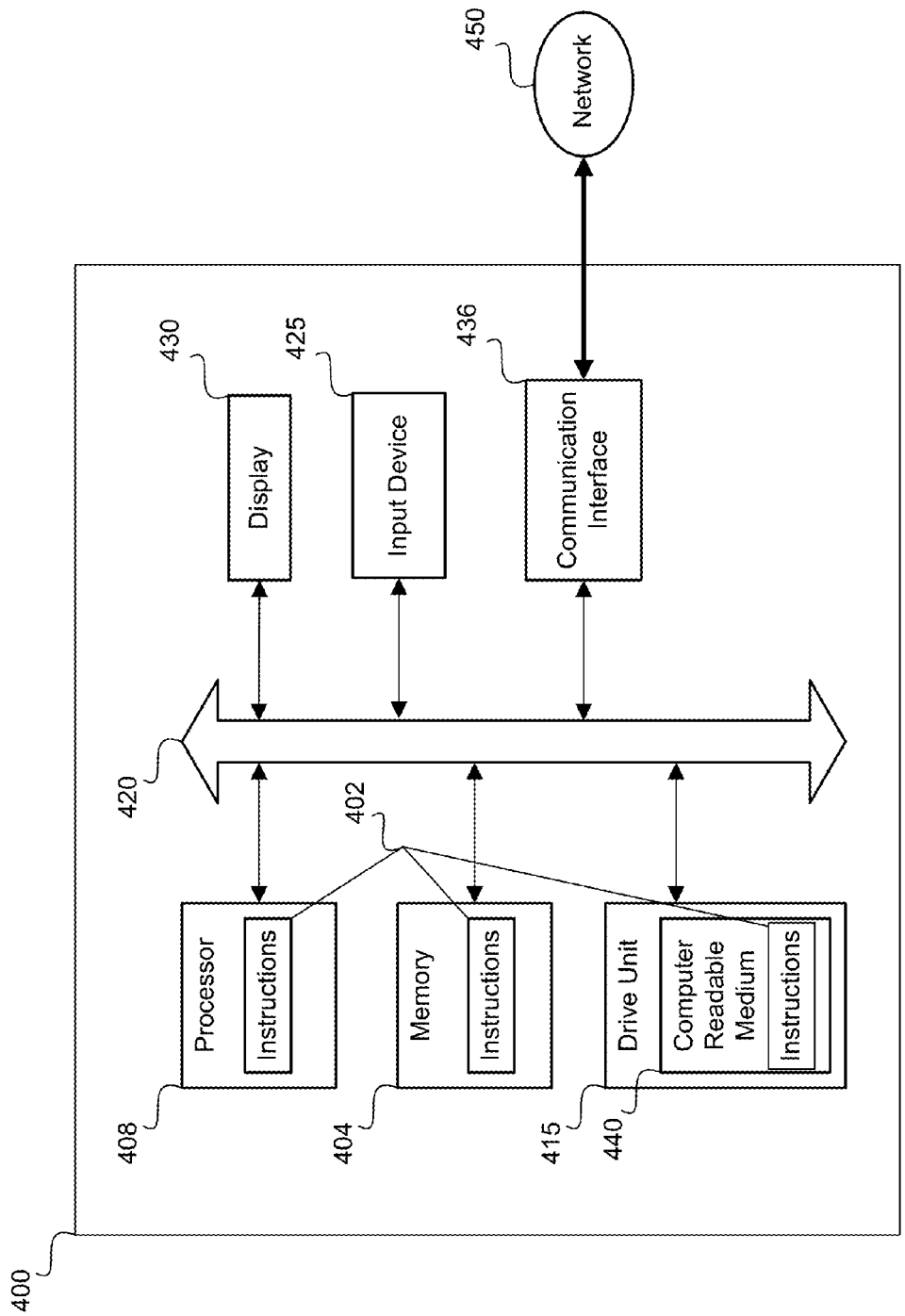
FIG. 41 illustrates a general computer system, which may represent any of the computing devices referenced herein.

FIG. 41 illustrates a general computer system 400, which may represent the system 100 disclosed with reference to FIG. 1, or any other computing devices referenced herein for execution of the disclosed methods and algorithms. The computer system 400 may include an ordered listing of a set of instructions 402 that may be executed to cause the computer system 400 to perform any one or more of the methods or computer-based functions disclosed herein. The computer system 400 may operate as a stand-alone device or may be connected to other computer systems or peripheral devices, e.g., by using a network 450.

In a networked deployment, the computer system 400 may operate in the capacity of a server or as a client-user computer in a server-client user network environment, or as a peer computer system in a peer-to-peer (or distributed) network environment. The computer system 400 may also be implemented as or incorporated into various devices, such as a personal computer or a mobile computing device capable of executing a set of instructions 402 that specify actions to be taken by that machine, including and not limited to, accessing the interne or web through any form of browser. Further, each of the systems described may include any collection of subsystems that individually or jointly execute a set, or multiple sets, of instructions to perform one or more computer functions.

The computer system 400 may include a memory 404 on a bus 420 for communicating information. Code operable to cause the computer system to perform any of the acts or operations described herein may be stored in the memory 404. The memory 404 may be a random-access memory, read-only memory, programmable memory, hard disk drive or any other type of volatile or non-volatile memory or storage device.

The computer system 400 may include a processor 408, such as a central processing unit (CPU) and/or a graphics processing unit (GPU). The processor 408 may include one or more general processors, digital signal processors, application specific integrated circuits, field programmable gate arrays, digital circuits, optical circuits, analog circuits, combinations thereof, or other now known or later-developed devices for analyzing and processing data. The processor 408 may implement the set of instructions 402 or other software program, such as manually-programmed or computer-generated code for implementing logical functions. The logical function or any system element described may, among other functions, process and/or convert an analog data source such as an analog electrical, audio, or video signal, or a combination thereof, to a digital data source for audio-visual purposes or other digital processing purposes such as for compatibility for computer processing.

The computer system 400 may also include a disk or optical drive unit 415. The disk drive unit 415 may include a computer-readable medium 440 in which one or more sets of instructions 402, e.g., software, can be embedded. Further, the instructions 402 may perform one or more of the operations as described herein. The instructions 402 may reside completely, or at least partially, within the memory 404 and/ or within the processor 408 during execution by the computer system 400. Accordingly, databases configured to store data generated from execution of the disclosed methods and algorithms may be stored in the memory 404 and/or the disk unit 415.

The memory 404 and the processor 408 also may include computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 400 may include an input device 425, such as a keyboard or mouse, configured for a user to interact with any of the components of system 400. It may further include a display 430, such as a liquid crystal display (LCD), a cathode ray tube (CRT), or any other display suitable for conveying information. The display 430 may act as an interface for the user to see the functioning of the processor 408, or specifically as an interface with the software stored in the memory 404 or the drive unit 415.

The computer system 400 may include a communication interface 436 that enables communications via the communications network 450. The network 450 may include wired networks, wireless networks, or combinations thereof. The communication interface 436 network may enable communications via any number of communication standards, such as 802.11, 802.17, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

The invention claimed is:

1. A method of generating assertions for verification of an integrated circuit hardware design expressed at a register transfer level (RTL) for variables of interest, the method executable by a computer having a processor and memory, the method comprising:

running, by the processor, dynamic simulation traces through the RTL design to generate simulation data;

extracting, by a static analyzer, domain-specific information about the RTL design comprising a control flow graph for variables of interest;

executing, using the processor, a data mining algorithm with the simulation data and the domain-specific information as inputs, to generate a set of candidate assertions for each variable of interest through machine learning with respect to the domain-specific information, the candidate assertions being likely invariants;

conducting, using the processor, formal verification on the RTL design with respect to each candidate assertion by outputting as invariants the candidate assertions that pass a formal check;

iteratively feeding back into the data mining algorithm a counterexample trace generated by each failed candidate assertion that violates the formal check, each counterexample trace including at least one additional variable in the RTL design not previously input into the data mining algorithm; and outputting, using the processor, the invariants generated from at least two iterations of executing the data mining algorithm, at least one of which is executed with one or more counterexample traces, which improves coverage of a state space of the RTL design with the at least one additional invariant.

2. The method of claim 1, further comprising:
executing the iterations of the data mining algorithm until no counterexample traces are generated by the formal check.

3. The method of claim 1, further comprising:
restricting the candidate assertions to those in which the data mining algorithm has one-hundred percent confidence.

4. The method of claim 1, where the at least one additional variable increases coverage to a part of the RTL design state space not yet explored by the dynamic simulation traces.

5. The method of claim 1, where each counterexample trace comprises values of antecedent variables of the failed candidate assertions that include the at least one additional variable, thus providing incremental creation of a decision tree used to generate the candidate assertions.

6. The method of claim 1, where the iterative execution of the data mining algorithm ends when reaching substantially one-hundred percent coverage of verification of a plurality of input vectors for simulation based verification of the RTL design.

7. The method of claim 1, further comprising:
outputting an input stimulus that executes the data mining algorithm, the input stimulus comprising a complete test suite of input vectors for simulation with respect to the at least one variable of interest, each input vector comprising a Boolean input stimulus value for simulation of the RTL design.

8. The method of claim 1, where iteratively executing the data mining algorithm comprises executing the data mining algorithm for a complete length of a data mining window in time, thus generating temporal candidate assertions.

9. The method of claim 1, where iteratively executing the data mining algorithm and conducting formal verification is executed on a hardware instantiation of the integrated circuit design on a silicon-based material.

10. A method of generating assertions for verification of an integrated circuit hardware design expressed at a register transfer level (RTL) for variables of interest, the method executable by a computer having a processor and memory, the method comprising:
running, using the processor, dynamic simulation traces through the RTL design to generate simulation data;
extracting, by a static analyzer, domain-specific information about the RTL design comprising a control flow graph for variables of interest;
iteratively executing, using the processor, a data coverage-guided mining algorithm with the simulation data and the domain-specific information as inputs to generate a set of candidate assertions for each variable of interest by iteratively adding candidate assertions that provide a coverage gain of the RTL design that is above a minimum coverage gain, the candidate assertions being likely invariants; and
exiting iterations of the data coverage-guided algorithm when the minimum coverage gain for one or more additional candidate assertions is less than a gain threshold or a total coverage of the set of candidate assertions is above a coverage threshold.

11. The method of claim 10, where iteratively executing the data coverage-guided mining algorithm comprises, at each iteration:
initializing a minimum coverage gain;
generating candidate assertions using association rule mining with inputs comprising: (i) a set of {input variable, value} pairs representing antecedents of potential assertions; (ii) a set of {input variable, value} pairs that are not antecedents of potential assertions; and (iii) the simulation data most-recently generated;
adding candidate assertions that provide coverage gain greater than the minimum coverage gain;
clearing the set of candidate assertions; and
reducing the minimum coverage gain.

12. The method of claim 11, further comprising, at each iteration of executing the data coverage-guided mining algorithm, the processor:
conducting formal verification on the candidate assertions to generate as invariants those candidate assertions that evaluate as true based on a formal check; and
removing candidate assertions from the set of candidate assertions that evaluate as false.

13. The method of claim 12, where iteratively executing the data coverage-guided mining algorithm and conducting formal verification is executed on a hardware instantiation of the integrated circuit design on a silicon-based material.

14. The method of claim 10, further comprising:
outputting an input stimulus that executes the data cover-guided mining algorithm, the input stimulus comprising a complete test suite of input vectors for simulation with respect to at least one variable of interest, each input vector comprising a Boolean input stimulus value for simulation of the RTL design.

15. The method of claim 10, where iteratively executing the data coverage-guided mining algorithm comprises executing the algorithm for a complete length of a data mining window in time, thus generating temporal candidate assertions.

16. A system for generating assertions for verification of an integrated circuit hardware design expressed at a register transfer level (RTL) for variables of interest, comprising:
a computing system having at least one processor and memory and a static analyzer;
the at least one processor configured to run dynamic simulation traces through the RTL design to generate simulation data;
the static analyzer configured to extract domain-specific information about the RTL design comprising a control flow graph for variables of interest;
the at least one processor further configured to:
execute a data mining algorithm with the simulation data and the domain-specific information as inputs, to generate a set of candidate assertions for each variable of interest through machine learning with respect to the domain-specific information, the candidate assertions being likely invariants;
conduct formal verification on the RTL design with respect to each candidate assertion by outputting as invariants the candidate assertions that pass a formal check;
iteratively feed back into the data mining algorithm a counterexample trace generated by each failed candidate assertion that violates the formal check, each counterexample trace including at least one additional variable in the RTL design not previously input into the data mining algorithm; and
output the invariants generated from at least two iterations of executing the data mining algorithm, at least one of which is executed with one or more counterexample traces, which improves coverage of a state space of the RTL design with the at least one additional invariant.

17. The system of claim 16, the at least one processor further configured to execute the iterations of the data mining algorithm until no counterexample traces are generated by the formal check.

18. The system of claim 16, the at least one processor further configured to restrict the candidate assertions to those in which the data mining algorithm has one-hundred percent confidence.

19. The system of claim 16, where the at least one additional variable increases coverage to a part of the hardware design state space not yet explored by the dynamic simulation traces.

20. The system of claim 16, where each counterexample trace comprises values of antecedent variables of the failed candidate assertions and values of implied variables that include the at least one additional variable, thus providing incremental creation of a decision tree used to generate the candidate assertions.

21. The system of claim 16, where the iterative execution of the data mining algorithm ends when reaching substantially one-hundred percent coverage of verification of a plurality of input vectors for simulation based verification of the RTL.

22. The system of claim 16, the at least one processor further configured to output an input stimulus that executes the data mining algorithm, the input stimulus comprising a complete test suite of input vectors for simulation with respect to the at least one variable of interest, each input vector comprising a Boolean input stimulus value for simulation of the RTL design.

23. The system of claim 16, where iteratively executing the data mining algorithm comprises executing the data mining algorithm for a complete length of a data mining window in time, thus generating temporal candidate assertions.

24. The system of claim 16, where iteratively executing the data mining algorithm and conducting formal verification is executed on a hardware instantiation of the integrated circuit design on a silicon-based material.

25. A system for generating assertions for verification of an integrated circuit hardware design expressed at a register transfer level (RTL) for variables of interest, comprising:
  a computing system having at least one processor and memory and a static analyzer;
  the at least one processor configured to run dynamic simulation traces through the RTL design to generate simulation data;
  the static analyzer configured to extract domain-specific information about the RTL design comprising a control flow graph for variables of interest;
  the at least one processor further configured to:
    iteratively execute a data coverage-guided mining algorithm with the simulation data and the domain-specific information as inputs to generate a set of candidate assertions for each variable of interest by iteratively adding candidate assertions that provide a coverage gain of the hardware design that is above a minimum coverage gain, the candidate assertions being likely invariants; and
    exit iterations of the data coverage-guided mining algorithm when the minimum coverage gain for one or more additional candidate assertions is less than a gain threshold or a total coverage of the set of candidate assertions is above a coverage threshold.

26. The system of claim 25, where iteratively executing the data coverage-guided mining algorithm comprises, at each iteration the at least one processor further configured to:
  initialize a minimum coverage gain;
  generate candidate assertions using association rule mining with inputs comprising: (i) a set of {input variable, value} pairs representing antecedents of potential assertions; (ii) a set of {input variable, value} pairs that are not antecedents of potential assertions; and (iii) the simulation data most-recently generated;
  add candidate assertions that provide coverage gain greater than the minimum coverage gain;
  clear the set of candidate assertions; and
  reduce the minimum coverage gain.

27. The system of claim 26, where at each iteration of executing the data coverage-guided mining algorithm, the at least one processor further configured to:
  conduct formal verification on the candidate assertions to generate as invariants those candidate assertions that evaluate as true based on a formal check; and
  remove candidate assertions from the set of candidate assertions that evaluate as false.

28. The system of claim 27, where iteratively executing the data coverage-guided mining algorithm and conducting formal verification is executed on a hardware instantiation of the integrated circuit design on a silicon-based material.

29. The system of claim 25, the at least one processor further configured to output an input stimulus that executes the data cover-guided mining algorithm, the input stimulus comprising a complete test suite of input vectors for simulation with respect to at least one variable of interest, each input vector comprising a Boolean input stimulus value for simulation of the RTL design.

* * * * *